US006903977B2

(12) United States Patent
Fujiwara et al.

(10) Patent No.: US 6,903,977 B2
(45) Date of Patent: Jun. 7, 2005

(54) NONVOLATILE SEMICONDUCTOR MEMORY DEVICE AND METHOD OF PRODUCING THE SAME

(75) Inventors: Ichiro Fujiwara, Kanagawa (JP); Hiromi Nobukata, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/432,158

(22) PCT Filed: Sep. 25, 2002

(86) PCT No.: PCT/JP02/09857

§ 371 (c)(1),
(2), (4) Date: Sep. 17, 2003

(87) PCT Pub. No.: WO03/028111

PCT Pub. Date: Apr. 3, 2003

(65) Prior Publication Data

US 2004/0042295 A1 Mar. 4, 2004

(30) Foreign Application Priority Data

Sep. 25, 2001 (JP) .................................... 2001-291759
Feb. 21, 2002 (JP) .................................... 2002-044309
Feb. 22, 2002 (JP) .................................... 2002-046998
Jun. 27, 2002 (JP) .................................... 2002-188809

(51) Int. Cl.[7] .............................................. G11C 16/00
(52) U.S. Cl. ........................... 365/185.28; 365/185.27; 365/185.29
(58) Field of Search ..................... 365/185.28, 185.27, 365/185.29, 185.18

(56) References Cited

U.S. PATENT DOCUMENTS 5,761,121 A * 6/1998 Chang ................... 365/185.14

6,178,122 B1 * 1/2001 Tomishima et al. ..... 365/189.11
6,327,187 B1 * 12/2001 Bergemont et al. ..... 365/185.28
6,621,736 B1 * 9/2003 Mirgorodski et al. ... 365/185.18

FOREIGN PATENT DOCUMENTS

| JP | 2001-102553 A1 | 4/2000 |
| JP | 2001-168219 A1 | 6/2001 |
| JP | 2001-237330 A1 | 8/2001 |

OTHER PUBLICATIONS

International Search Report Jan. 21, 2003.
EEPROM/Flash Sub 3.0V Drain–Source Bias Hot Carrier Writing, J.D. Bude, et al., Technical Digest International Electron Devices Meeting, Dec., 1995, pp. 989–991.

* cited by examiner

Primary Examiner—Tan T. Nguyen
(74) Attorney, Agent, or Firm—Rader, Fishman & Grauer PLLC; Ronald P. Kananen

(57) ABSTRACT

A nonvolatile semiconductor memory apparatus suitable to logic incorporation, by which a charge injection efficiency is high and hot electrons (HE) can be effectively injected at a low voltage is provided. A memory transistor (M) comprises first and second source/drain regions (S, SSL, D, SBL) formed on a semiconductor substrate (SUB, W), a charge storage film (GD) having a charge storage faculty and a gate electrode (WL). Memory peripheral circuits (2a to 9) generate a first voltage (Vd) and a second voltage (Vg-Vwell), apply the first voltage (Vd) to the second source/drain region (D, SBL) by using potential (0V) of the first source/drain region (S, SSL) as reference, apply the second voltage (Vg-Vwell) to the gate electrode (WL), generate hot electrons (HE) by ionization collision on the second source/drain region (D, SBL) side, and inject the hot electrons (HE) to the charge storage film (GD) from the second source/drain region (D, SBL) side at the time of writing data.

36 Claims, 41 Drawing Sheets

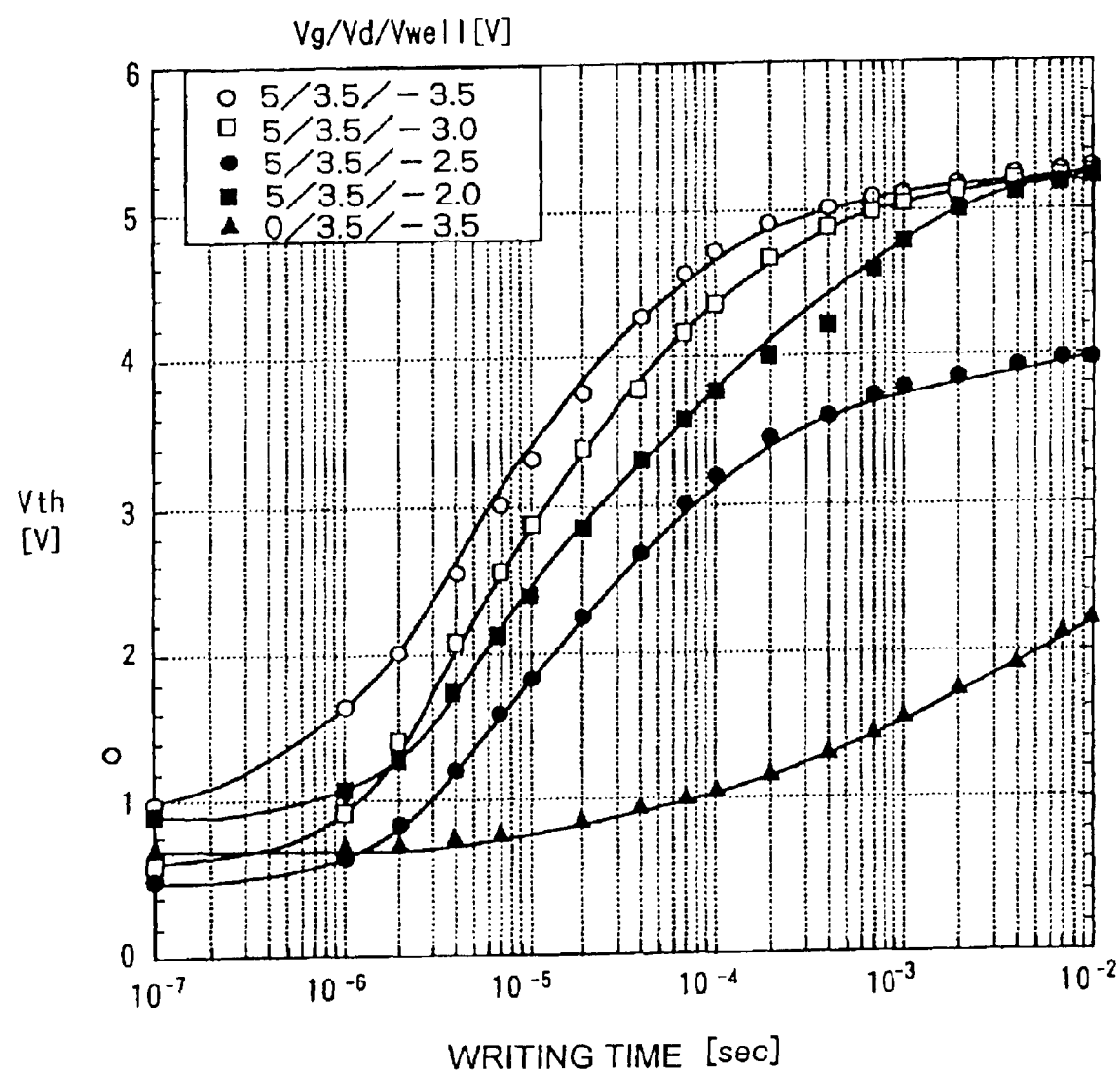

FORWARD READING

REVERSE READING

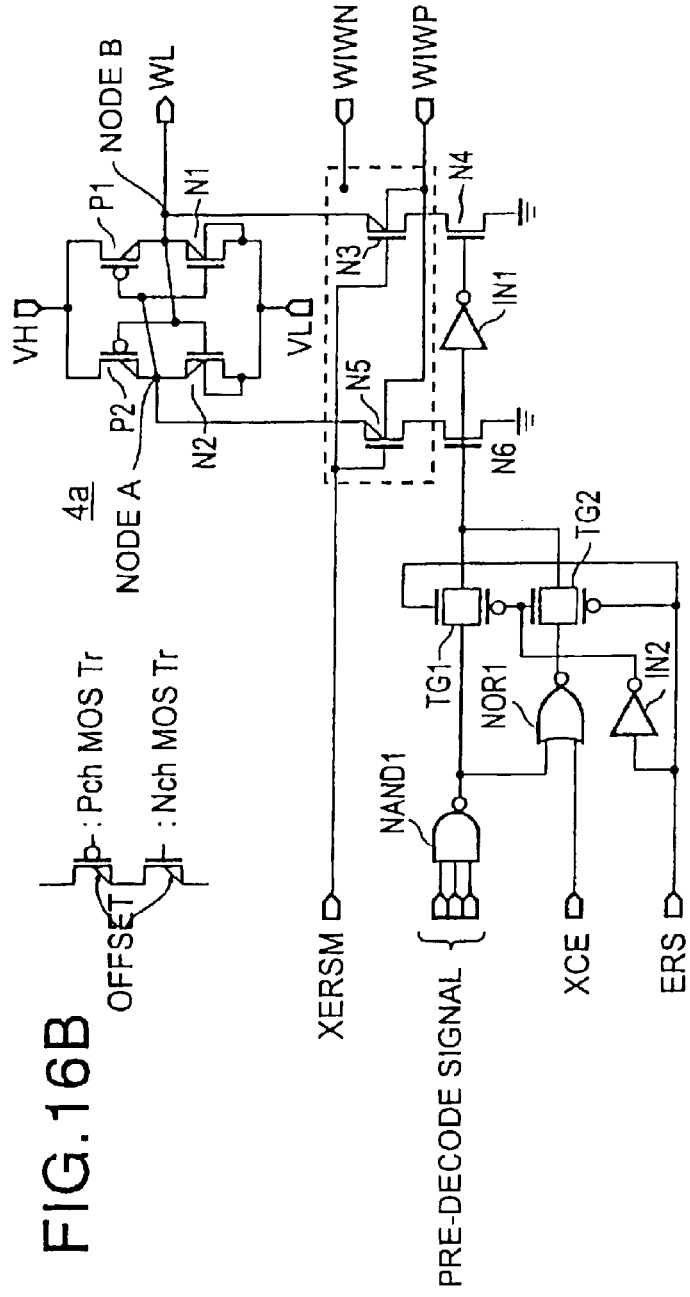

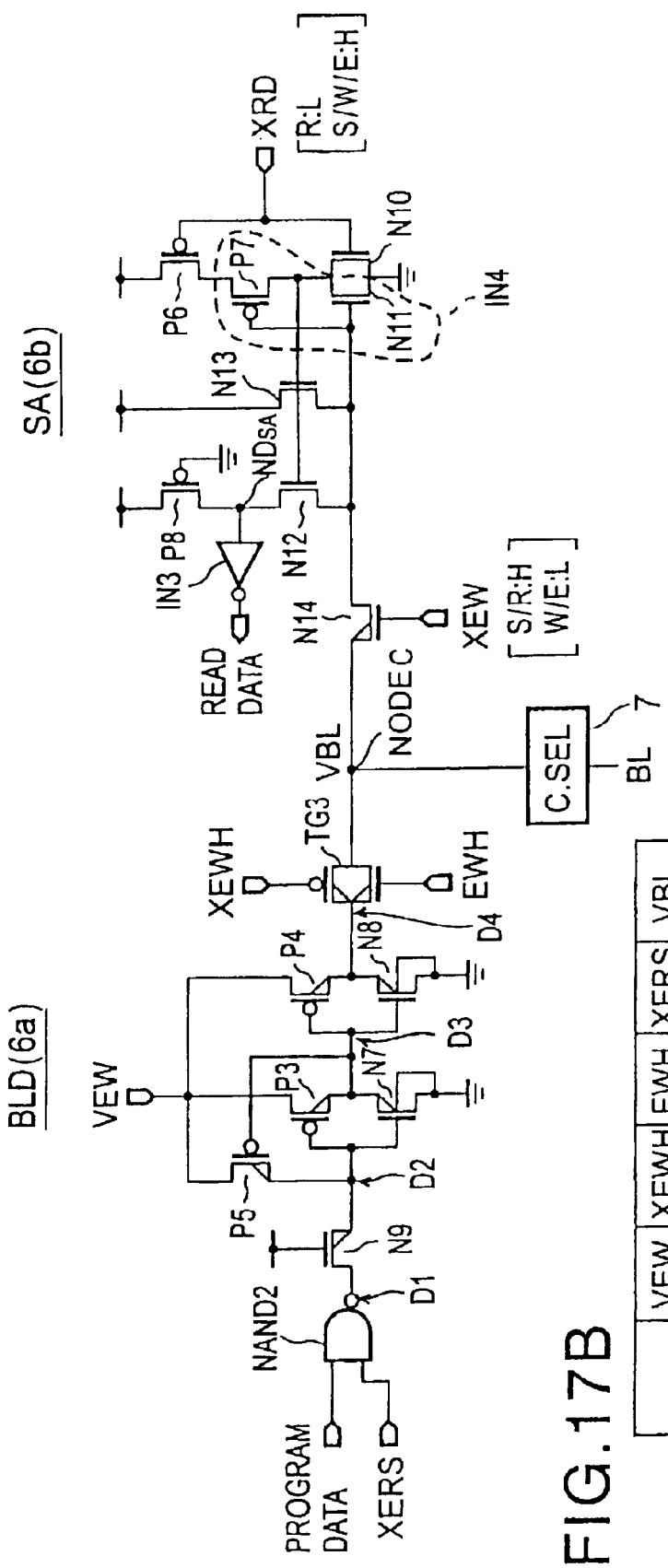

FIG.18A W.C/DC(9)

FIG.18B SLD(8)

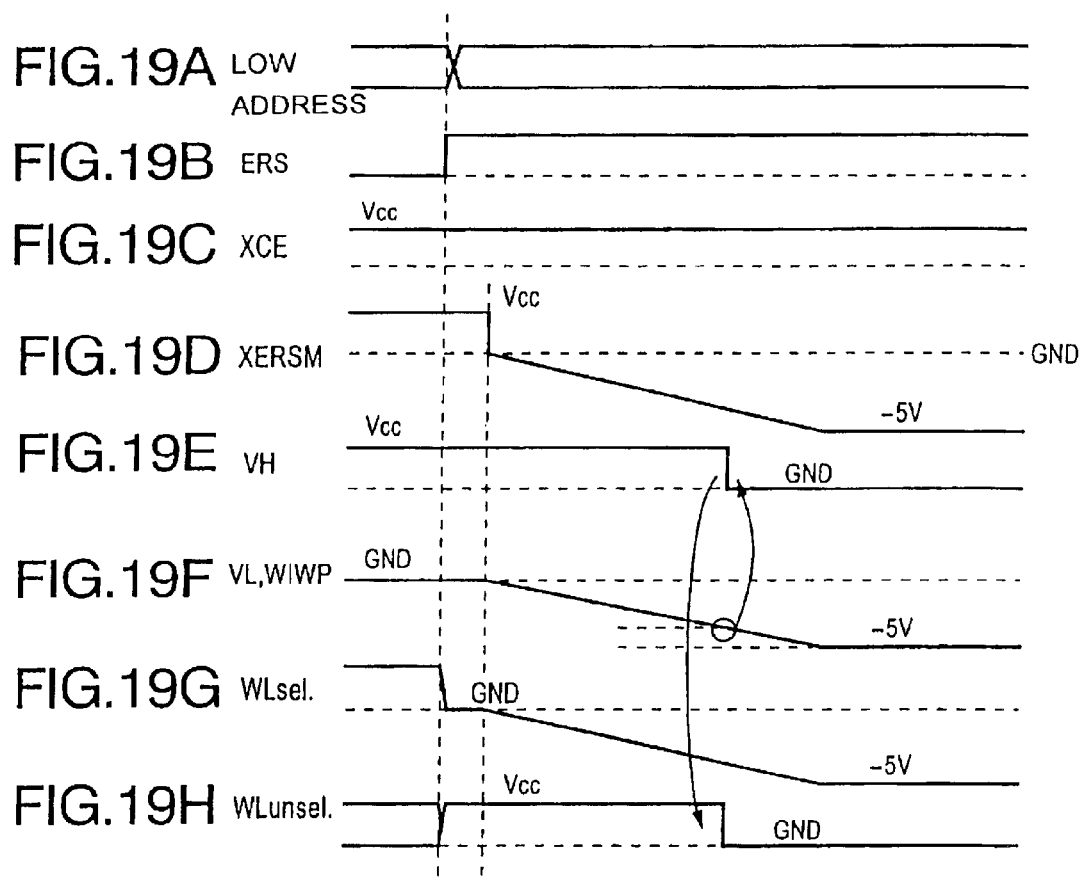

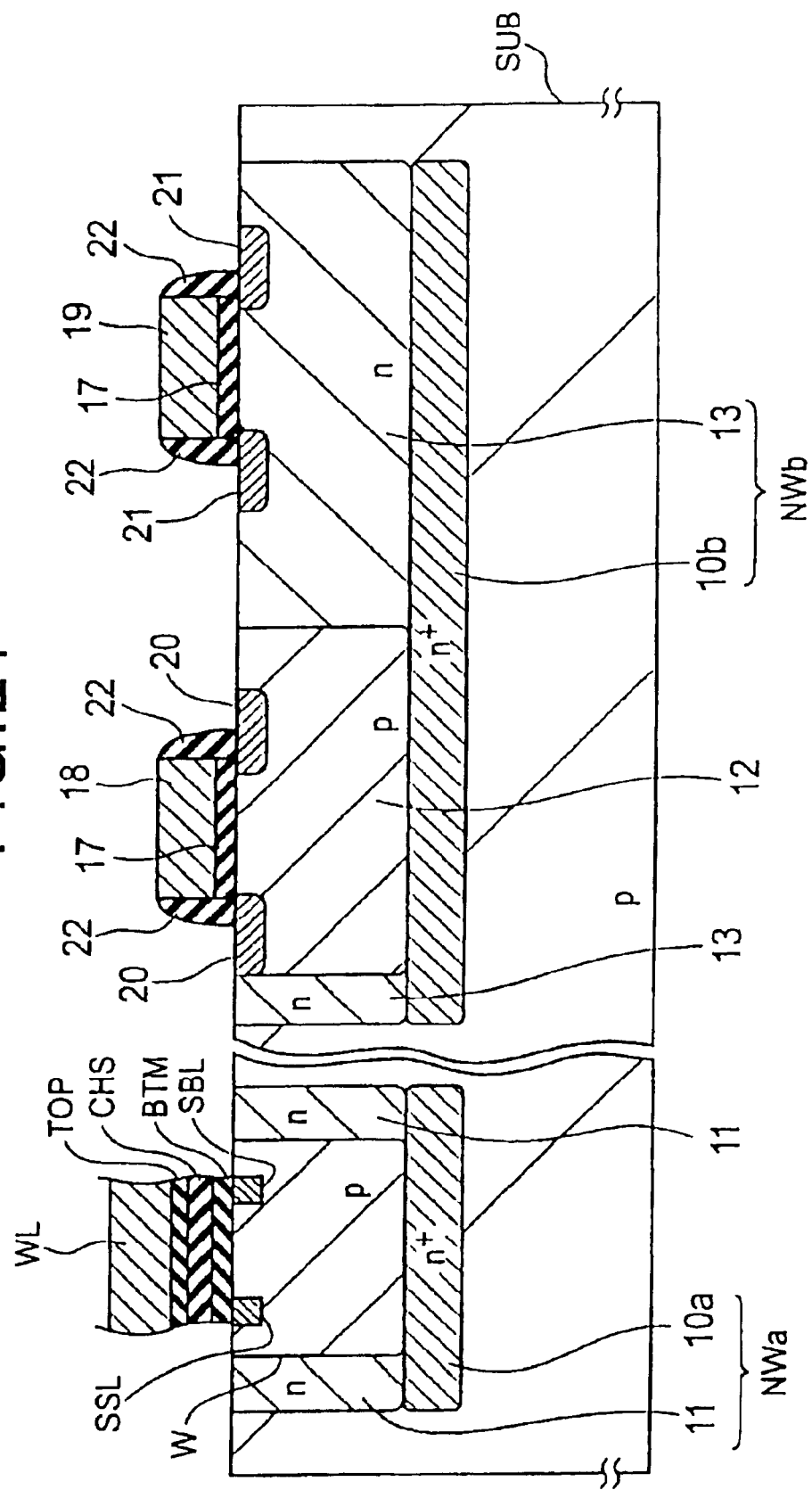

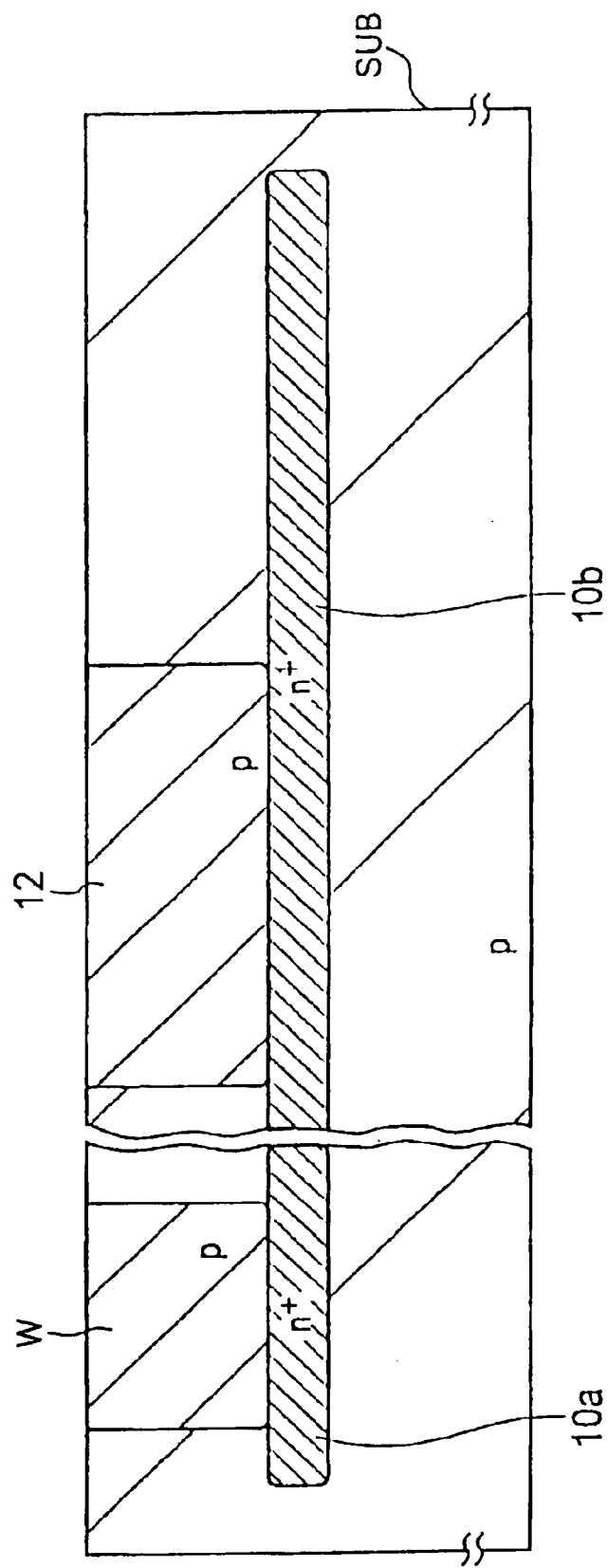

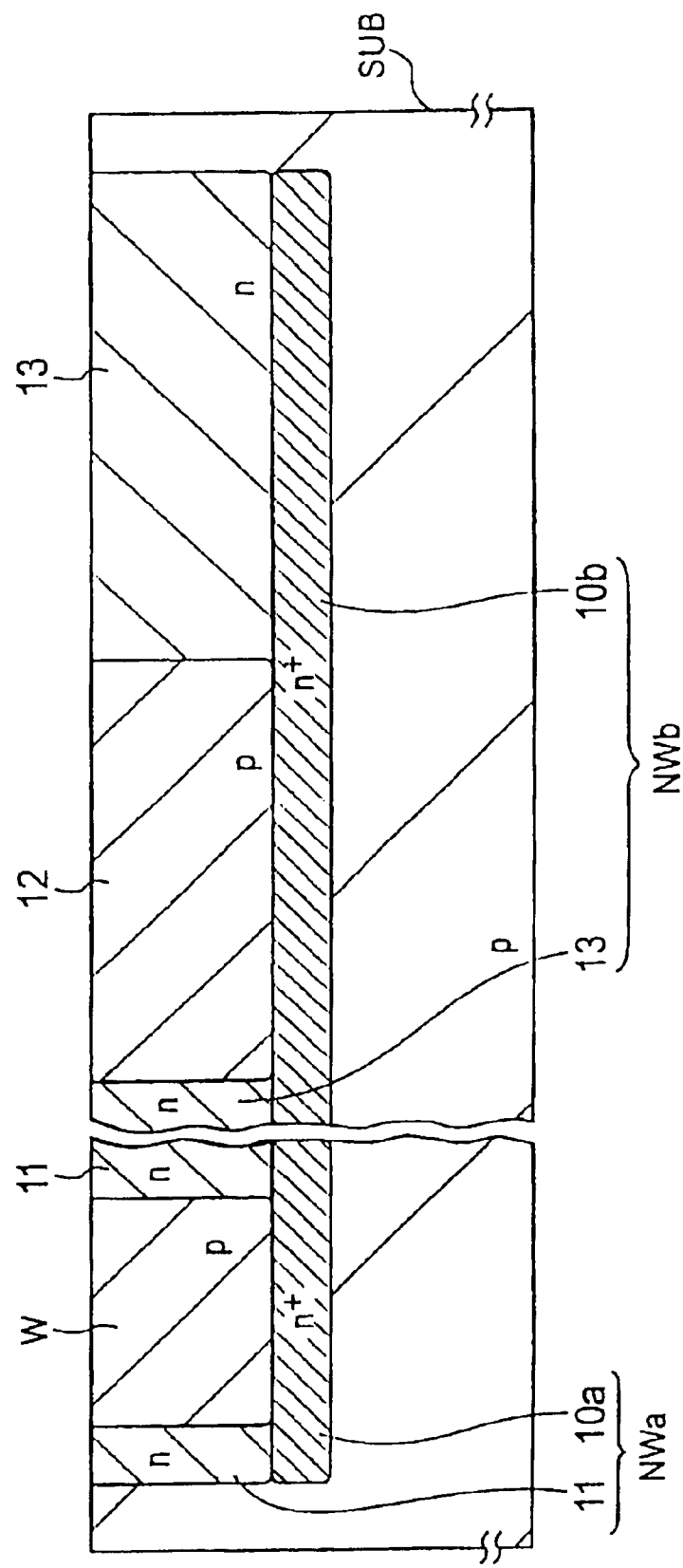

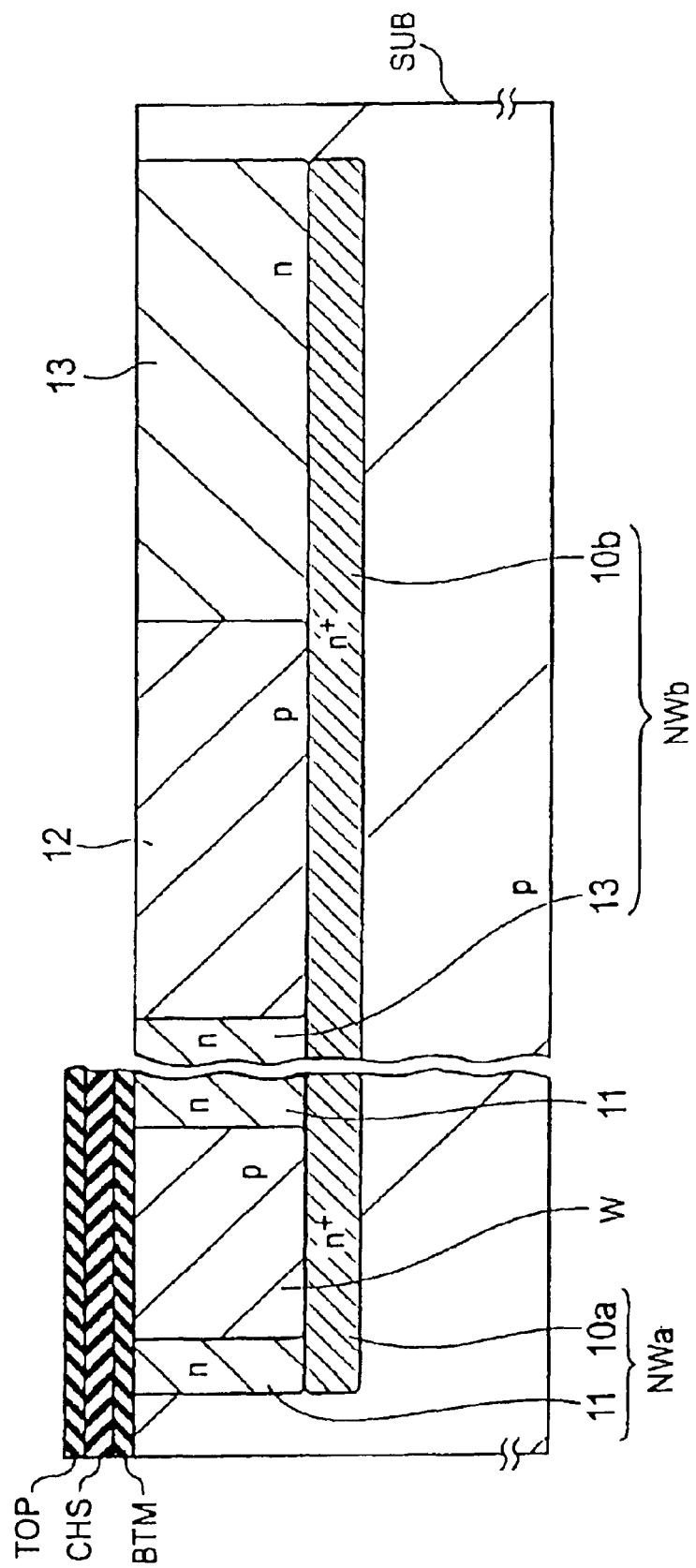

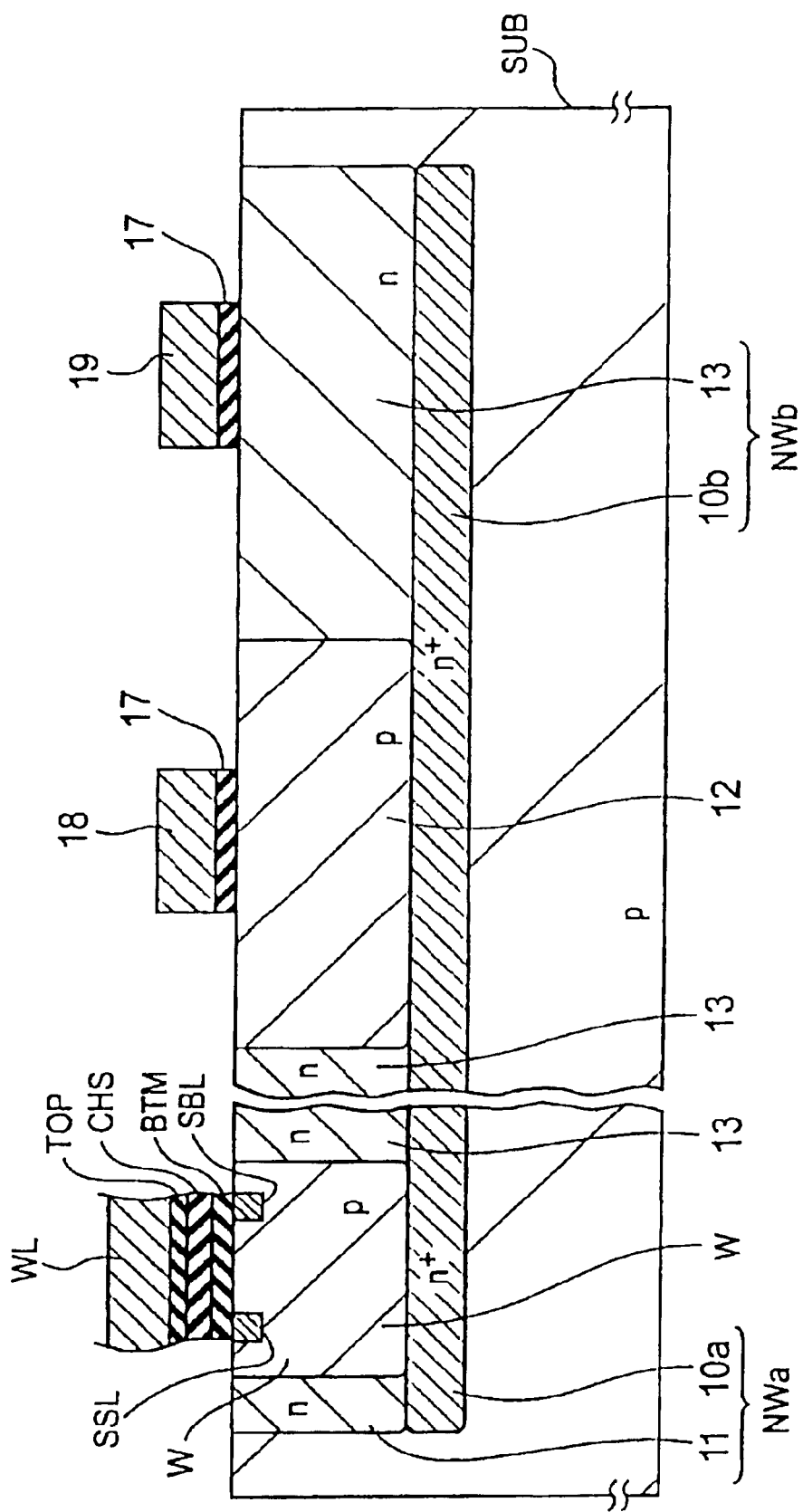

FIG. 27

MASK NO. OF
CONVENTIONAL PROCESS ↙

①~⑲ MASK NO. OF IN PRESENT EMBODIMENT

| | COMMON MASK & EXCLUSIVE MASK OF MONOS | EXCLUSIVE MASK OF Vpp SYSTEM Tr (CONVENTIONALLY: EXCLUSIVE TO Vpp SYSTEM) | CONVENTIONALLY NEEDED EXCLUSIVE MASK OF Vcc SYSTEM Tr |
|---|---|---|---|
| 1 | ① TER | | |
| 2 | ② AIM | | |
| 3 | ③ DNW | | |
| 4 | | | LV-PWL |
| 5 | | | LV-NWL |
| 6 | ④ PWL | | |
| 7 | ⑤ NWL | | |
| 8 | ⑥ MVA | | |
| 9 | ⑦ SEL-VA | | |
| 10 | | ⑧ GTET (ONO-ET) | |
| 11 | | | 2GTET (HV-OX-ET) |
| 12 | ⑨ BN | | |
| 13 | ⑩ BN2(N+II) | | |
| 14 | ⑪ IPS | | |
| 15 | | | NGT |
| 16 | | | PGT |
| 17 | ⑫ Ch-stp | | |
| 18 | | ⑬ HV-NLD | |
| 19 | | ⑭ HV-PLD | |
| 20 | | | LV-NLD |
| 21 | | | LV-PLD |
| 22 | ⑮ NSD | | |
| 23 | ⑯ PSD | | |
| 24 | ⑰ 1AC | | |
| 25 | ⑱ 1AL | | |
| 26 | ⑲ PAD | | |
| | 16 SHEET | 3 SHEET | 7 SHEET |
| | 19 IN TOTAL | | |

US 6,903,977 B2

NONVOLATILE SEMICONDUCTOR MEMORY DEVICE AND METHOD OF PRODUCING THE SAME

TECHNICAL FIELD

The present invention relates to a nonvolatile semiconductor memory apparatus comprising a charge storage film having a charge storage faculty between a channel forming region and a gate electrode of a memory transistor and a method of producing the same.

BACKGROUND ART

Nonvolatile semiconductor memory transistors are roughly divided to the FG (Floating Gate) type wherein charge storing means (floating gate) for holding charges is continuing flatly and, for example, the NOMOS (Metal-Oxide-Nitride-Oxide Semiconductor) type wherein charge storing means (a charge trap, etc.) are dispersed flatly.

In a FG type nonvolatile memory transistor, a first dielectric film, a floating gate FG made of polysilicon, etc., a second dielectric film made by for example an ONO (Oxide-Nitride-Oxide) film, and a control gate are successively stacked on a semiconductor substrate or a well.

In a MONOS type nonvolatile memory transistor, a first dielectric film, a nitride film [SixNy (0<x<1, 0<y<1)] mainly operating charge storage, a second dielectric film and a gate electrode are successively stacked on a semiconductor substrate or a well.

In the MONOS type nonvolatile memory transistor, carrier traps as charge storing means are spatially (namely, in the plane direction and the film thickness direction) dispersed and spread in the nitride film or near a boundary of the second dielectric film and the nitride film. Due to this, charge retention property depends on an energetic or spatial distribution of charges caught by the carrier traps in the nitride film besides the film thickness of the first dielectric film.

When a partial leakage current path caused by a defect, etc. arises in the first dielectric film, a large amount of stored charges leak through the leakage path to the substrate side and the charge retention property easily declines in the FG type memory transistor. On the other hand, in the MONOS type memory transistor, since the charge storing means are spatially dispersed, only a part of stored charge around the leakage path partially leaks through the leakage path and the charge retention property of the memory transistor as a whole is hard to decline. Therefore, the problem of declining charge retention property due to the first dielectric film getting thinner is not as serious in the MONOS type memory transistor as in the FG type memory transistor.

Nonvolatile memory apparatuses are roughly divided to the known standalone type and logical circuit embedded type. In the stand-alone type, a nonvolatile memory transistor is used as a memory element of a dedicated memory IC. In the logical circuit embedded type, a memory block and a logical circuit block are provided as a core of a system-on-chip, and a nonvolatile memory transistor is used as a memory element for storing data in a nonvolatile way in the memory block.

A one-memory transistor type memory cell is used in many of nonvolatile memory apparatuses of the logical circuit embedded type.

As a typical example of a one-memory transistor cell of the FG type, an ETOX cell of the Intel Corporation is known. A common source type memory cell array system wherein sources are shared is adopted at the time of an array arrangement of the ETOX cell.

A one-memory transistor cell of the MONOS type has gathered attention from the viewpoint that a cell area can be reduced and a low voltage is easily attained. As a typical example thereof, a high density memory cell called NROM of Saifun Semiconductors Ltd. is known. The NROM cell uses dispersed carrier traps as the charge storing means, so data storage of two-bit/cell is possible by performing charge injection respectively to two different regions in a cell. When laying out an array arrangement of the NROM cells, an impurity diffusion layer is shared by adjacent cells in the row direction, and when storing or reading two-bit data, a virtual ground array system wherein a function of the impurity diffusion layer is switched by a source and a drain for use is adopted.

When writing data to an ETOX cell and MROM cell, the channel hot electron (CHE) injection is used, by which a low voltage is easily attained comparing with the FN tunnel injection. In the CHE injection writing, an electric field is applied between the source and drain, electrons supplied from the source side to the channel are energetically excited at a drain side end of the channel, and hot electrons are generated. Hot electrons beyond a height of an energy barrier (3.2 eV in the case of a silicon dioxide film) of the first dielectric film are injected to the charge storing means (floating gate or carrier trap).

However, in the CHE injection writing of the FG type memory cell, a voltage of 10V or more has to be applied to the gate for exciting electrons to a degree of over the high energy barrier of 3.2 eV. Although the writing gate voltage is lower comparing with the case of FN tunnel writing requiring a voltage of 18V or more, it is rather high comparing with a power source voltage of 2.5V to 5.0V. A gate application voltage at the time of the CHE injection writing of a MONOS type memory cell is lower than the gate application voltage at the time of the CHE injection writing of the FG type memory cell, but it is higher than the power source voltage. For example, in the case of a NROM, a gate application voltage required at the time of data writing is 9V.

Therefore, regardless of being the FG type or MONOS type, it is necessary to generate a writing gate voltage by raising the power source voltage by a booster circuit in memory peripheral circuits.

In a booster circuit and a circuit for applying a writing gate voltage after boosting in the memory peripheral circuits, a high withstand voltage transistor is necessary. The high withstand voltage transistor has a low commonality with other transistors for a power source voltage in the memory peripheral circuits and a logic transistor in the logical circuit block. Therefore, a process exclusive to the high withstand voltage transistor is necessary, which hinders a reduction of production cost of a logical circuit embedded type memory IC.

DISCLOSURE OF INVENTION

A first object of the present invention is to provide a nonvolatile semiconductor memory apparatus having good charge injection efficiency, capable of efficiently injecting hot electrons at lower voltage and being suitable to an embedded logical circuit and the operation method.

A second object of the present invention is to provide a nonvolatile semiconductor memory apparatus suitable to an embedded logical circuit, wherein a low absolute value is required in a voltage to be generated at the time of writing or erasing data and a required maximum withstand voltage of a transistor in the memory peripheral circuit is low.

A third object of the present invention is to provide a nonvolatile semiconductor memory apparatus of a logical circuit embedded type having many processes of a logical circuit block in common with a memory block and a method of producing it.

A nonvolatile semiconductor memory apparatus of a first aspect of the present invention is for attaining the above first object, comprising a memory transistor (M); and memory peripheral circuits (2a to 9) for controlling an operation of said memory transistor (M); wherein said memory transistor (M) comprises: a first conductive type semiconductor substrate (SUB, W); a first conductive type channel forming region (CH) regulated in a surface region of said semiconductor substrate (SUB, W); a first source/drain region (S, SSL) formed on one side of said channel forming region (CH) in the surface region of said semiconductor substrate (SUB,W) and electrically connected to said memory peripheral circuits (2a to 9); a second source/drain region (D, SBL) formed on the other side of said channel forming region (CH) in the surface region of said semiconductor substrate (SUB, W) and electrically connected to said memory peripheral circuits (2a to 9); a charge storage film (GD) formed at least on said channel forming region (CH) and having a charge storage faculty; and a gate electrode (WL) formed on said charge storage film (GD) and electrically connected to said memory peripheral circuits (2a to 9); and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data.

In the nonvolatile semiconductor memory apparatus according to the first aspect, hot electrons (HE) are generated by utilizing ionization collision phenomenon at the time of writing. Electrons (e) supplied from the first source/drain region (S, SSL) and running in the channel are accelerated by an electric field in the horizontal direction generated by an application of the first voltage (Vd). The accelerated electrons (e) are brought to ionization collision with a semiconductor lattice on the second source/drain region (D, SBL) side. As a result, pairs of high energy holes (HH) and electrons (HE) are generated. Among them, the hot holes (HH) furthermore generate hot electrons (HE) in a depletion layer, a part thereof moves toward the gate electrode (WL) side and furthermore accelerated by an electric field in the vertical direction generated by an application of the second voltage (Vg-Vwell). The hot electrons (HE) obtained more energy by an acceleration in the vertical direction move over an energy barrier of the charge storage film (GD) and are effectively injected to the charge storage film (GD) from the second source/drain region (D, SBL) side.

A nonvolatile semiconductor memory apparatus according to a second aspect of the present invention is to attain the above first object, comprising a memory transistor (M); and memory peripheral circuits (2a to 9) for controlling an operation of said memory transistor (M); wherein said memory transistor (M) comprises: a first conductive type semiconductor substrate (SUB, W); a first conductive type channel forming region (CH) regulated in a surface region of said semiconductor substrate (SUB, W); a first source/drain region (S, SSL) formed on one side of said channel forming region (CH) in the surface region of said semiconductor substrate (SUB,W) and electrically connected to said memory peripheral circuits (2a to 9); a second source/drain region (D, SBL) formed on the other side of said channel forming region (CH) in the surface region of said semiconductor substrate (SUB, W) and electrically connected to said memory peripheral circuits (2a to 9); a charge storage film (GD) formed at least on said channel forming region (CH) and having a charge storage faculty; and a gate electrode (WL) formed on said charge storage film (GD) and electrically connected to said memory peripheral circuits (2a to 9); said channel forming region (CH) comprises a first conductive type high concentration channel region (HR) with higher concentration than that in other regions of said channel forming region (CH) at least at an end portion on said second source/drain region (D, SEL) side; and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) on said second source/drain region (D, SBL) side by intensifying an electric field in the channel direction to said high concentration channel region (HR), and inject said generated hot electrons (HE) to said charge storage film (GD) from said second source/drain region (D, SBL) side at the time of writing data.

In the nonvolatile semiconductor memory apparatus of the second aspect, since the high concentration channel region (HR) is provided, a voltage widely falls at the channel portion adjacent to the high concentration channel region (HR). As a result, intensification of the electric field in the horizontal direction generated by an application of the first voltage (Vd) is superior, channel running electrons (e) are rapidly excited in terms of energy at the intensified portion of the electric field, and high energy electrons all together collide with the semiconductor lattice. Pairs of hot electrons (HE) and hot holes (HH) are generated by the collision. Among them, the hot electrons (HE) are furthermore accelerated by an electric field in the vertical direction generated by the second voltage (Vg-Vwell) and injected to the charge storage film (GD).

A nonvolatile semiconductor memory apparatus according to a third aspect of the present invention is to attain the above second aspect, comprising a memory transistor (M); and memory peripheral circuits (2a to 9) for controlling an operation of said memory transistor (M); wherein said memory transistor (M) comprises: a first conductive type semiconductor substrate (SUB, W); a first conductive type channel forming region (CH) regulated in a surface region of said semiconductor substrate (SUB, W); a first source/drain region (S, SSL) formed on one side of said channel forming region (CH) in the surface region of said semiconductor substrate (SUB,W) and electrically connected to said memory peripheral circuits (2a to 9); a second source/drain region (D, SBL) formed on the other side of said channel forming region (CH) in the surface region of said semiconductor substrate (SUB, W) and electrically connected to said memory peripheral circuits (2a to 9); a charge storage film (GD) formed at least on said channel forming region (CH) and having a charge storage faculty; and a gate electrode (WL) formed on said charge storage film (GD) and electrically connected to said memory peripheral circuits (2a to 9); and said memory peripheral circuits (2a to 9) generate a first voltage, apply said generated first voltage (Vd) to said second source/drain region (D,SBL) by using potential of said first source/drain region (S, SSL) as a reference, generate a first polarity voltage (Vg) and a second polarity voltage (Vwell), a potential difference thereof is equal to a second voltage (Vg-Vwell), apply said generated first polar voltage (Vg) to said gate electrode (WL), apply said generated second polarity voltage (Vwell) to said semiconductor substrate (SUB, W) and inject hot electrons (HE) to said charge storage film (GD).

A nonvolatile semiconductor memory apparatus according to a fourth aspect of the present invention is to attain the above second aspect, comprising a memory transistor (M); and memory peripheral circuits (2a to 9) for controlling an operation of said memory transistor (M); wherein said memory transistor (M) comprises: a first conductive type semiconductor substrate (SUB, W); a first conductive type channel forming region (CH) regulated in a surface region of said semiconductor substrate (SUB, W); a first source/drain region (S, SSL) formed on one side of said channel forming region (CH) in the surface region of said semiconductor substrate (SUB,W) and electrically connected to said memory peripheral circuits (2a to 9); a second source/drain region (D, SBL) formed on the other side of said channel forming region (CH) in the surface region of said semiconductor substrate (SUB, W) and electrically connected to said memory peripheral circuits (2a to 9); a charge storage film (GD) formed at least on said channel forming region (CH) and having a charge storage faculty; and a gate electrode (WL) formed on said charge storage film (GD) and electrically connected to said memory peripheral circuits (2a to 9); and said memory circuit (2a to 9) generate a first polarity voltage (Vd) and a second polarity voltage (Vg), potential difference thereof is equal to third voltage (Vd-Vg), apply said generated first polarity voltage (Vd) to said second source/drain region (D, SBL), apply said generated second polarity voltage (Vg) to said gate electrode (WL), generate hot holes (HH) on said second source/drain region (D, SBL) side and inject said hot holes (HH) to said charge storage film (GD) at the time of erasing data.

In the nonvolatile semiconductor memory apparatus of the third aspect, the memory peripheral circuits (2a to 9) lower a voltage (the second voltage Vg-Vwell)) to be applied to the gate electrode (WL) to the lower first polarity voltage (Vg) to apply to the gate electrode (WL) and apply an opposite polar voltage (the second polarity voltage (Vwell)) having a voltage value obtained by subtracting the first polarity voltage (Vg) from the second voltage (Vg-Vwell) to the semiconductor substrate (SUB, W) at the time of writing data.

In the nonvolatile semiconductor memory apparatus of the fourth aspect, the memory peripheral circuits (2a to 9) lower a voltage (the third voltage (Vd-Vg)) to be applied to between the gate electrode (WL) and the second source/drain region (D, SBL) to the lower first polarity voltage (Vd) to apply to the second source/drain region (D, SBL) and apply an opposite polar voltage having a voltage value obtained by subtracting the first polarity voltage (Vd) from the third voltage (Vd-Vg) to the gate electrode (WL) at the time of erasing data.

The first polarity voltage and second polarity voltage are generated in the memory peripheral circuits (2a to 9), respectively. A part (WLD, BLD) for generating the first polarity voltage and a part (WLD, 9) for generating the second polarity voltage in the memory peripheral circuits (2a to 9) do not handle high voltages, such as the second voltage (Vg-Vwell) or the third voltage (Vd-Vg), and handle the first polarity voltage lowered to half at most or the second polarity voltage.

An nonvolatile semiconductor memory apparatus according to a fifth aspect of the present invention is to attain the above third object, comprising a memory block; and a logical circuit block; and wherein said memory block comprises memory peripheral circuits (2a to 9) for controlling an operation of a memory cell array (1) formed by arranging a plurality of memory cells including a memory transistor (M); said logical circuit block comprises a logic transistor and an input/output transistor; a transistor in said memory peripheral circuits (2a to 9), said logic transistor and said input/output transistor in said logical circuit block respectively comprise a gate insulation film (17) formed on a substrate (SUB, 12, 13); gate electrodes (18, 19) formed on a gate insulation film (17); a first conductive type channel forming region regulated on a surface region of said semiconductor substrate (SUB, 12, 13); a first source/drain region (20, 21) formed on one side of said channel forming region of the surface region of said semiconductor substrate (SUB, 12, 13); and second source/drain regions (20, 21) formed on the other side of said channel forming region of the surface region of said semiconductor substrate (SUB, W); and a film thickness of a thickest gate insulation film of a transistor in said memory peripheral circuits (2a to 9) is set to be the same as a film thickness of a gate insulation film of said input/output transistor in said logical circuit block.

In a nonvolatile semiconductor memory apparatus of the fifth aspect, a film thickness of a thickest gate insulation film of a transistor in a memory peripheral circuits is set to be the same as a film thickness of a gate insulation film of an input/output transistor in a logical circuit block. Since a transistor having a gate insulation film required to have the highest withstand voltage is the input/output transistor in the logical circuit block, the maximum film thickness of a gate insulation film is same in the memory block and the logical circuit block.

A method of operating a nonvolatile semiconductor memory apparatus according to a sixth aspect of the present invention is to attain the above first object, and is a method of operating a nonvolatile semiconductor memory apparatus comprising a first conductive type semiconductor substrate (SUB, W), a first conductive type channel forming region (CH) regulated in a surface region of said semiconductor substrate (SUB, W), a first source/drain region (S, SSL) formed on one side of said channel forming region (CH), a second source/drain region (D, SBL) formed on the other side of said channel forming region (CH) in the surface region of said semiconductor substrate (SUB, W), a charge storage film (GD) having a charge storage faculty formed at least on said channel forming region (CH), and a gate electrode (WL) formed on said charge storage film (GD), including the steps of: generating a first voltage (Vd) and second voltage (Vg-Vwell), applying said generated first voltage (Vd) to said second source/drain region (D, SBL) by using potential of said first source/drain region (S, SSL) as a reference, applying said generated second voltage (Vg-Vwell) to said gate electrode (WL), generating hot electrons (HE) by ionization collision on said second source/drain region (D, SBL), and injecting said generated hot electrons (HE) to said charge storage film (GD) from said second source/drain region (D, SBL) side at the time of writing data; and generating a third voltage (Vd-Vg), applying said generated third voltage (Vd-Vg) to between said second source/drain region (D, SBL) and said gate electrode (WL), generating hot holes (HH) on said second source/drain region (D, SBL) side, and injecting said generated hot holes (HH)

to an injection region for said hot electrons (HE) of said charge storage film (GD) at the time of erasing data.

A method of operating a nonvolatile semiconductor memory apparatus according to a seventh aspect of the present invention is to attain the above third object, and is a method of operating a nonvolatile semiconductor memory apparatus comprising a memory block and a logical circuit block, said memory block comprises memory peripheral circuits (2a to 9) for controlling an operation of a memory cell array (1) formed by arranging a plurality of memory cells including said memory transistor (M), said logical circuit block comprises a logic transistor and an input/output transistor, and a transistor in said memory peripheral circuits (2a to 9), said logic transistor and said input/output transistor in said logical circuit block respectively comprise a gate insulation film (17) formed on a semiconductor substrate (SUB, 12, 13), gate electrodes (18, 19) formed on a gate insulation film (17), a first conductive type channel forming region regulated on a surface region of said semiconductor substrate (SUB, 12, 13), a first source/drain region (20, 21) formed on one side of said channel forming region, and second source/drain regions (20, 21) formed on the other side of said channel forming region, including the step of: simultaneously forming said thickest gate insulation film of said transistor in said memory peripheral circuits (2a to 9) and a gate insulation film of said input/output transistor in said logical circuit block.

In the method of producing a nonvolatile semiconductor memory apparatus of the seventh aspect, the thickest data insulation film of a transistor in the memory peripheral circuit and the gate insulation film of the input/output transistor in the logical circuit block are simultaneously formed in a same process.

BRIEF DESCRIPTION OF DRAWINGS

FIG. 8 is a graph of writing characteristics when a well voltage is used as a parameter.

FIG. 16A is a circuit diagram showing a configuration example of a decoder unit composing a main row decoder, and FIG. 16B is a circuit diagram of an intermediate withstand voltage transistor with an offset. FIG. 16C is a table showing set values of various signals relating to an operation of a circuit shown in FIG. 16A and a voltage, etc.

FIG. 17A is a circuit diagram showing a configuration example of a bit line drive circuit and a sense amplifier. FIG. 17B is a table showing set values of various signals and a voltage, etc. relating to an operation of a circuit shown in FIG. 17A.

FIG. 18A is a circuit diagram of a configuration example of a well charge/discharge circuit. FIG. 18B is a circuit diagram showing an example of the basic configuration of a well charge/discharge circuit. FIG. 18B is a circuit diagram showing a basic configuration example of a source line drive circuit.

FIG. 19A to FIG. 19H are timing charts showing changes of various signals and supply voltages, etc. at the time of erasing.

FIG. 21 is a cross-sectional view of the configuration of a nonvolatile memory apparatus in the first embodiment, in a formation region of the memory cell array and in a forming region of the peripheral circuit or logical circuit block.

FIG. 22 is a cross-sectional view after forming a P-well in the middle of producing a nonvolatile semiconductor apparatus according to a first embodiment.

FIG. 23 is a cross-sectional view after forming an N-well continued from FIG. 22.

FIG. 24 is a cross-sectional view of an ONO film after removing a part thereof continued from FIG. 23.

FIG. 26 is a cross-sectional view after forming a word line and a gate electrode continued from FIG. 25.

FIG. 27 is a table showing a list of photomasks used in producing a nonvolatile semiconductor memory apparatus.

BEST MODE FOR CARRYING OUT THE INVENTION

Below, embodiments of the present invention will be explained by taking an example of a nonvolatile memory apparatus having a MONOS type memory transistor.

First Embodiment

A nonvolatile memory apparatus in a first embodiment comprises a memory block and a logical circuit block.

Figure 1:
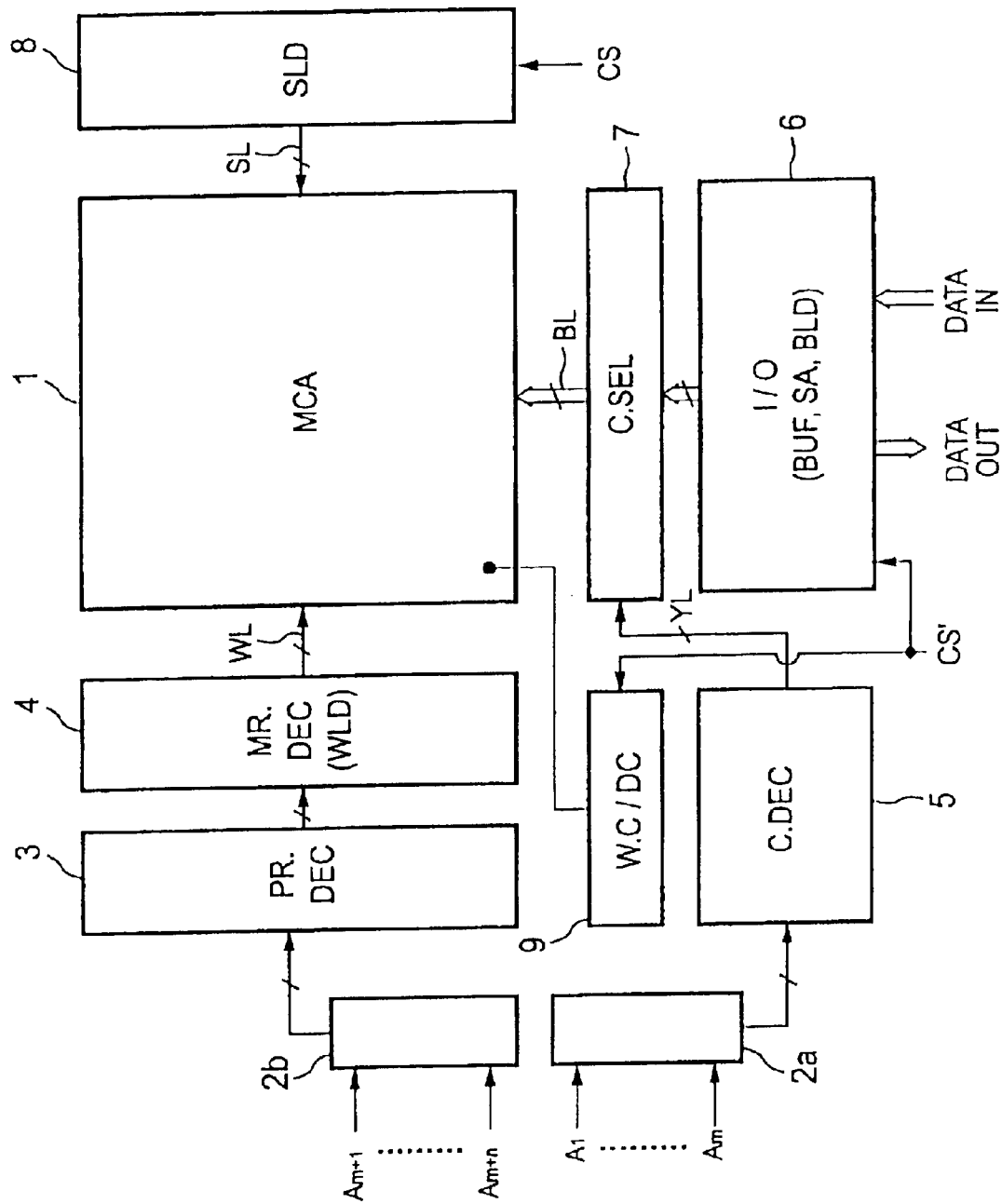
FIG. 1 is a view of a memory block of a nonvolatile semiconductor memory apparatus in a first embodiment of the present invention.

FIG. 1 is an outline of the configuration of a memory block.

The memory block illustrated in FIG. 1 comprises a memory cell array (MCA) 1 and peripheral circuits for controlling an operation of the memory cell array (hereinafter referred to as memory peripheral circuits).

The memory peripheral circuit comprises a column buffer 2a, a row buffer 2b, a pre-row decoder (PR.DEC) 3, a main row decoder (MR.DEC) 4, a column decoder (C.DEC) 5, an input/output circuit (I/O) 6, a column gate array (C.SEL) 7, a source line drive circuit (SLD) 8 and a well charge/discharge circuit (W.C/DC) 9. While not particularly illustrated, the memory peripheral circuits comprise a power source circuit for boosting a power source voltage a little in accordance with need and supplying the boosted voltage to the main row decoder 4, source line drive circuit 8 and well charge/discharge circuit 9, and a control circuit for controlling a power source supply. Note that the above boosting is necessary when a power source voltage supplied from the outside is 2.5 to 3.3V, but when the power source voltage is 5V, boosting is unnecessary.

The main row decoder 4 includes a word line drive circuit (WLD) for applying a predetermined voltage to a word line specified by the pre-row decoder 3.

The input/output circuit 6 includes a bit line drive circuit (BLD) for applying a predetermined voltage to a bit line BL at the time of writing or erasing, etc. and a sense amplifier (SA) besides a buffer (BUF) of a program and data to be read.

To plainly explain functions of the memory peripheral circuits in writing and erasing, it is for example as below.

First, while a not shown chip enable signal is in a state of "high (H)", address signals Al to Am+n input to an address terminal are input to the pre-row decoder 3 and the column decoder 5 via address buffers (column buffer 2a and row buffer 2b).

A part of the input address signals is decoded by the pre-row decoder 3, a predetermined word line WL specified by the address signal is selected, then a predetermined voltage is applied to the selected word line WLsel by the word line drive circuit (WLD) in the main row decoder 4.

At the time of writing, a predetermined positive voltage at a high level, for example 5V, is applied from the word line drive circuit to the selected word line WLsel, while not selected word line WLunsel is held for example at 0V. At the time of erasing, a predetermined opposite polar voltage from the voltage in writing, for example −5V, is applied to the selected word line WLsel, while not selected word line WLunsel is held at a predetermined positive voltage or 0V.

The rest of the address signals are decoded by the column decoder, a column select line YL of a selected column specified by the address signal is selected, and a predetermined voltage is applied thereto.

As a result that a predetermined voltage is applied to the column select line YL, a predetermined bit line select transistor in the column gate array 7 shifts to a conductive state, and in accordance thereto, the selected bit line BLsel is connected to the input/output circuit 6.

A ground potential GND is applied to a source line SL at the time of writing by the source line drive circuit 8 controlled by a control signal CS, while at the time of erasing, the source line becomes for example an electrically floating state (hereinafter, also referred to as "open").

Also, a well in a memory cell array is charged to be a reverse bias voltage (for example a negative voltage) for reverse-biasing a predetermined PN junction at the time of writing (and erasing) by the well charge/discharge circuit 9 controlled by a control signal CS'. The bias of the well is also called a back-bias.

Consequently, at the time of writing, data to be written in the input/output buffer is applied to a selected bit line BLsel and written to a memory cell at an intersection of the selected bit line BLsel and the selected and excited word line WLsel. Specifically, a positive voltage of about 3.3V to 4.0V or 0V is applied to the selected bit line BLsel in accordance with the data to be written, and hot electrons by ionization collision (for example, secondary ionization collision) are injected to the above memory cell applied with the voltage.

In a flash memory, erasing is normally performed collectively on a memory cell array or collectively on a predetermined block. When erasing a block collectively, all bit lines BL in the block are all selected in accordance with a column address signal, and a predetermined positive voltage of for example 5V is applied to the selected bit line BLsel.

Note that source lines may be always held at the reference potential of 0V at writing and erasing. Also, a method of making them open only at the time of erasing as explained above, or a method of erasing also from the source side may be also adopted.

As will be explained later on, when a well is divided to be long parallel stripes longitudinal to the bit line direction, selection of the well is preferably made based on a column address in the configuration shown in FIG. 1. In the hot electron injection writing by the secondary ionization collision, the well is preferably biased to be negative. At this time, for example −1.5V to −3V or so is applied to the selected well.

Figure 2:
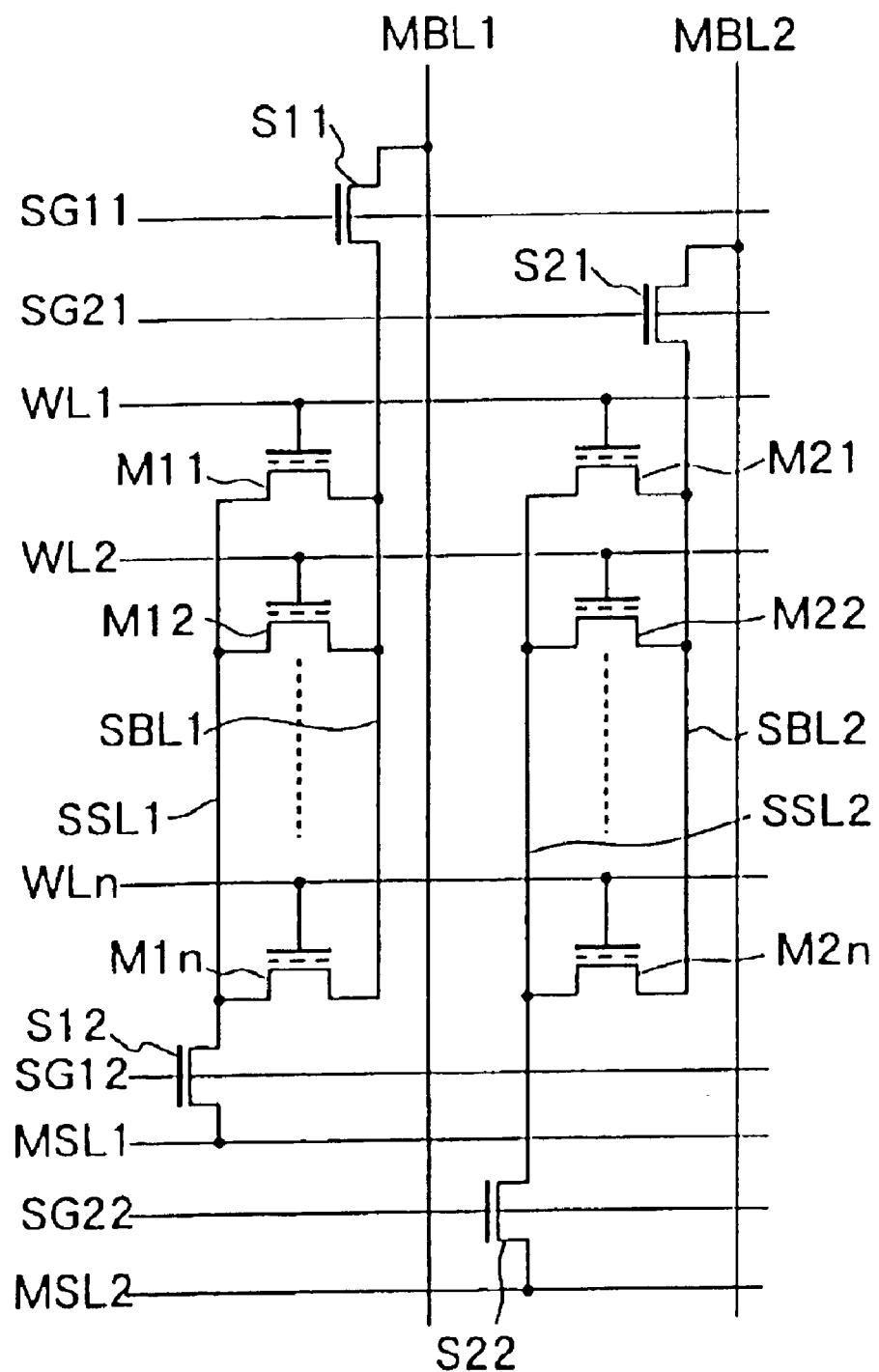
FIG. 2 is a circuit diagram showing the basic configuration of a memory cell array.

FIG. 2 shows an example of the circuit configuration of a memory cell array (MCA) 1. The array configuration comprises hierarchical bit lines and source lines, which is so-called the SSL (Separated Source Line).

Figure 3:
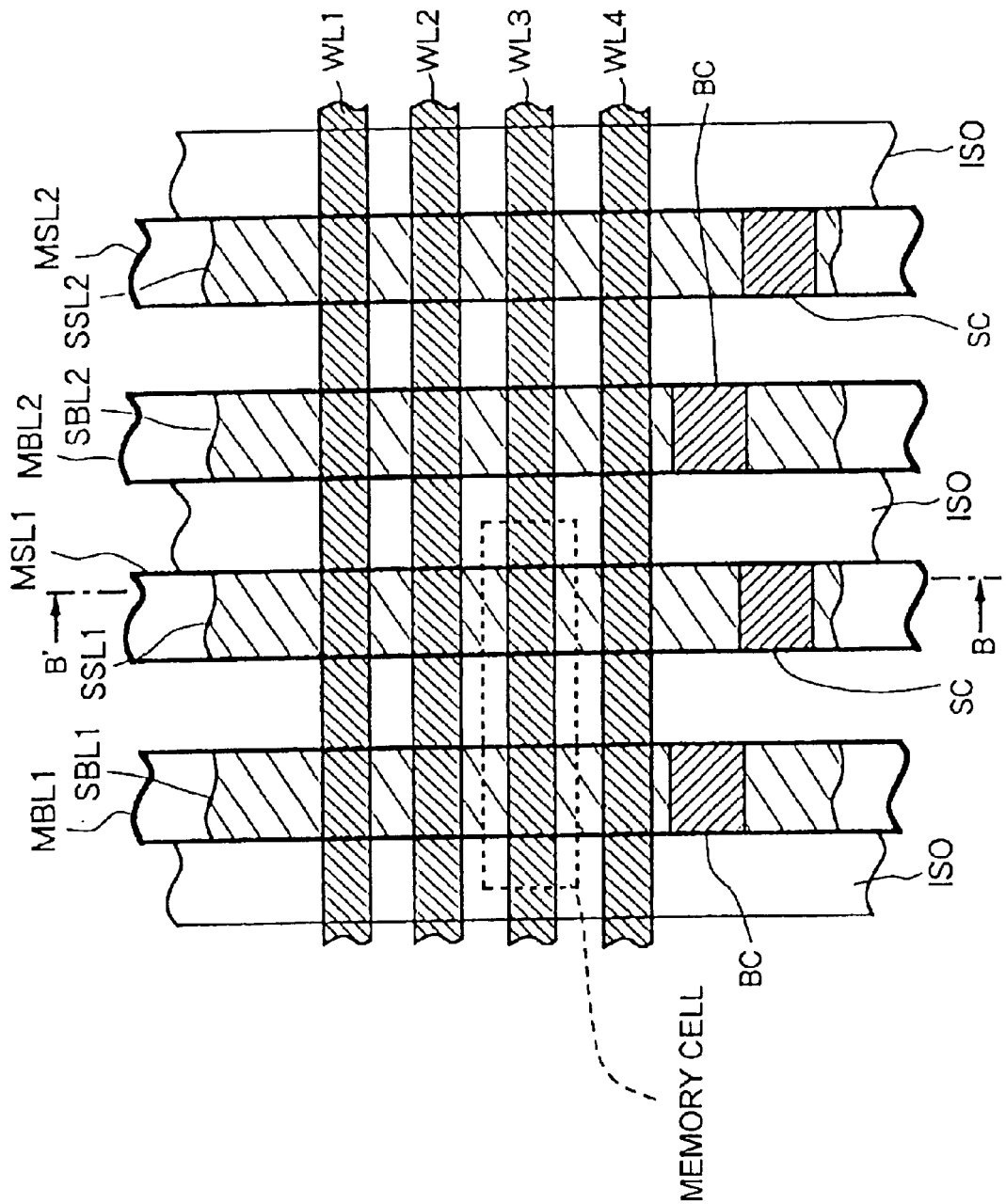
FIG. 3 is a plan view of a memory cell array.

FIG. 3 is a plan view of the memory cell array.

Figure 4:
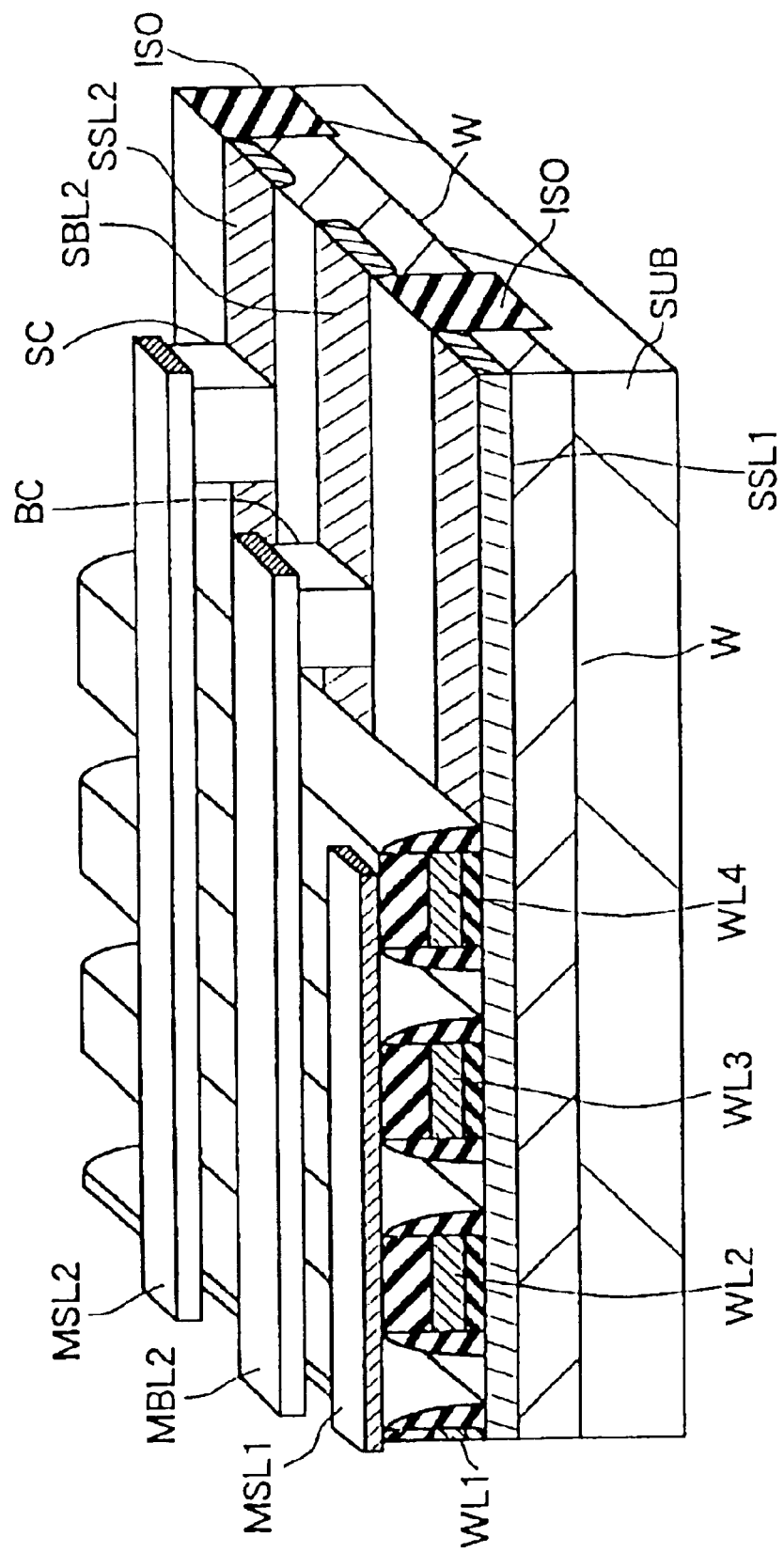
FIG. 4 is a bird's-eye view of a memory cell array seen from a side of a cross-section along the line B–B' in FIG. 3.

FIG. 4 is a bird's-eye view seen from a cross-section side along the line B–B' in FIG. 3.

In this memory cell array, bit lines are classified to main bit lines and sub bit lines, and source lines are classified to main source lines and sub source lines.

As shown in FIG. 2, a main bit line MBL1 is connected a sub bit line SBL1 via a select transistor S11, and a main bit line MBL2 is connected a sub bit line SBL2 via a select transistor S21. Also, a main source line MSL1 is connected a sub source line SSL1 via a select transistor S12, and a main source line MSL2 is connected a sub source line SSL2 via a select transistor S22.

Between the sub bit line SBL1 and the sub source line SSL1 are provided memory transistors M11 to M1n (for example n=64) connected in parallel, and between the sub bit line SBL2 and the sub source line SSL2 are provided memory transistors M21 to M2n connected in parallel. The n-number of memory transistors mutually connected in parallel and two of the select transistors (S11 and S12 or S21 and S22) compose a block, a unit composing a memory cell array.

Respective gates of memory transistors M11, M21, . . . adjoining in the word direction are connected to a word line WL1. In the same way, respective gates of memory transistors M12, M22, . . . are connected to a word line WL2, and respective gates of memory transistors M1n, M2n, . . . are connected to a word line WLn.

Select transistors S11, . . . adjoining in the word direction are controlled by a select gate line SG11, and select transistors S21, . . . are controlled by a select gate line SG21. In the same way, select transistors S12, . . . adjoining in the word line direction are controlled by a select gate line SG12, and select transistors S22, . . . are controlled by a select gate line S22.

In the memory cell array, as illustrated in FIG. 4, a P-well W is formed on a surface of a semiconductor substrate SUB. The P-well W is dielectrically isolated in the row direction by an element isolation insulating layer ISO having a parallel stripe pattern formed for example by burying an insulating substance in a trench. Note that the later explained well-in-well (WIW) structure may be also adopted.

Each P-well portion separated by the element isolation insulating layer ISO becomes an active region of the memory transistor. On both sides in the width direction in the active region, an N type impurity is introduced at high concentration to the well portion in parallel stripes apart from each other, and thereby, sub bit lines SBL1 and SBL2 (hereinafter, referred to as SBL) as a second source/drain region and sub source lines SSL1 and SSL2 (hereinafter, referred to as SSL) as a first source/drain region are formed.

A dielectric film including a charge storing means (charge storage film) having a parallel stripe pattern perpendicular to the sub bit lines SBL and sub source lines SSL is formed. On the charge storage film is formed respective word lines WL1, WL2, WL3, WL4, . . . (hereinafter, referred to as WL) also serving as gate electrodes.

A part crossing with the respective word lines WL among the P-well W portion between the sub bit lines SBL and the sub source lines SSL is a channel forming region of the memory transistor. A part of the sub bit lines which come contact with the channel forming region (second source/drain region) serves as a drain, and a part of the sub source lines which come into contact with the channel forming region (first source/drain region) serves as a source.

On an upper surface and side walls of the word lines WL are covered with an offset insulation layer and a side wall insulation layer (normal interlayer insulation layer may be used in the present example).

These insulation layers are formed at predetermined intervals, a bit contact plague BC reaching to the sub bit lines SBL and a source contact plague SC reaching to the sub source lines SSL. The contact plagues BC and SC are electricconductors, for example a plague, made for example by polysilicon or refractory metals, and provided for every 64 memory transistors in the bit direction.

On the insulation layer, the main bit lines MBL1, MBL2, . . . (hereinafter, referred to as MBL) contacting on the bit contact plague BC and the main source lines MSL1, MSL2, . . . (hereinafter, referred to as MSL) contacting on the source contact plague SC are alternately formed. The main bit lines and the main source lines have a long parallel stripe pattern longitudinal to the column direction.

The illustrated memory cell array has hierarchical bit lines and source lines, so it is not necessary to form the bit contact plague BC and source contact plague SC for every memory cell. Thus, basically there is not any unevenness of contact resistance between cells. The bit contact plague BC and source contact plague SC are provided for example for every 64 memory cells. When the bit contact plague BC and source contact plague SC are not formed in a self aligning way, the offset insulation layer and the side wall insulation layer are not necessary. In this case, after stacking a normal interlayer insulation film thick and burying a memory transistor, a contact is opened by normal photolithography and etching and a conductive material is buried in the contact.

Due to the pseudo-contactless structure composed of the sub bit lines (second source/drain region) SBL and the sub source lines (first source/drain region) SSL, there is little wasted space, so when each layer is formed to be a minimum size F as a limit of a wafer process, extremely minute cell area of nearly $8F^2$ can be realized.

The bit lines and source lines are made hierarchical, and the select transistor S11 or S21 separate a group of memory transistors connected in parallel in a unit block which is not selected from the main bit line MBL. As a result, a capacitance of the main bit line MBL is widely reduced, which is advantageous for attaining higher speed and lower power consumption. With the effect of the select transistor S12 or S22, the sub source lines SSL can be isolated form the main source lines MSL and less capacitance can be attained.

For attaining a still higher speed, it is preferable that the sub bit lines SBL and sub source lines SSL are formed by an impurity region applied with silicide and the main bit lines MBL and main source lines MSL are metal wired.

Figure 5:
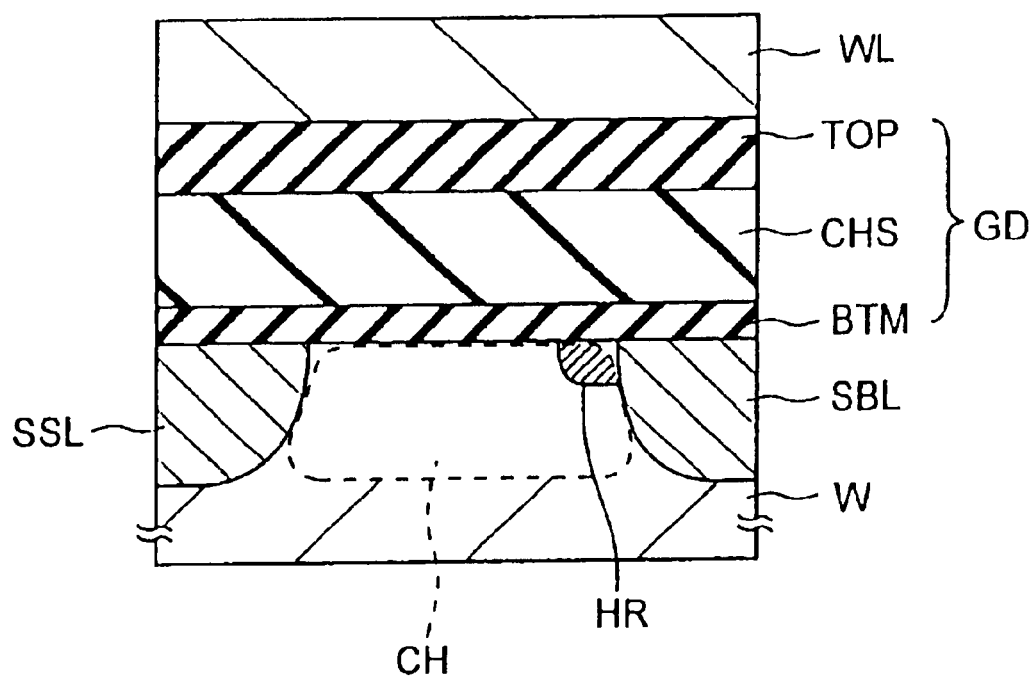
FIG. 5 is a cross-sectional view in the row direction of a memory transistor.

FIG. 5 is an enlarged cross-sectional view of a memory transistor in the row direction (hereinafter, referred to as a channel direction).

In FIG. 5, a part between the sub bit line (second source/drain region) SBL and the sub source line (first source/drain region) SSL and crossing with the word line WL is the channel forming region CH.

The channel forming region CH is formed a high concentration channel region HR contacting the sub bit line SBL. The high concentration channel region HR is P-type with higher concentration than concentration in other portions of the channel forming region CH. As will be explained later on, the high concentration channel region HR has a role of heightening intensity of an electric field in the channel direction in the adjoining channel forming region CH.

A charge storage film GD is formed on the channel forming region CH including the high concentration channel region HR, and a gate electrode (word line WL) of a memory transistor is formed on the charge storage film GD. The word line WL is comprised of doped polycrystalline silicon made to be conductive by being introduced with a P type or N type impurity at high concentration, refractory metal silicide, or a stacked film of doped polycrystalline silicon and refractory metal silicide. A length of effective portion of the word line WL, that is the length (gate length) in the channel direction corresponding to a distance between the source and drain is 0.13 µm or less, for example 100 nm or so.

The charge storage film GD in the first embodiment is comprised of, from the lower layer, a first dielectric film BTM on the bottom side, a main charge storage film CHS, a second dielectric film TOP on the top side.

For example, the first dielectric film BTM is formed by forming an oxide film and performing nitriding treatment thereon. A film thickness of the first dielectric film BTM is determined in a range of for example 2.5 nm to 6.0 nm and is set 3.5 µm to 5.5 µm here.

The main charge storage film CHS is comprised for example of a 6.0 nm of nitride silicon ($Si_xN_y$ (0<x<1, 0<y<1)) film. The main charge storage film CHS is prepared for example by the low pressure CVD (LP-CVD) and includes a large amount of carrier traps therein. The main charge storage film CHS exhibits Frenkel-Poole (FP) type electric conductivity.

The second dielectric film TOP has to be formed so as to include deep carrier traps at high concentration near a boundary with the main charge storage film CHS. Therefore, the second dielectric film TOP is formed for example by performing thermal oxidization on a formed nitride film (main charge storage film CHS). The second dielectric film TOP may be a high temperature CVD oxidization (HTO) film. When the second dielectric film TOP is formed by the CVD, the traps are formed by heat treatment. A film thickness of the second dielectric film TOP is at least 3.0 nm, preferably 3.5 nm or more so as to effectively prevent injection of holes from the gate electrode (word line WL) and prevent declining of the number of data re-writable times.

In producing a memory transistor configured as above, an element isolation insulating layer ISO and a P-well W are formed in a prepared semiconductor substrate SUB. Impurity regions (a first and second source/drain regions) to be the sub bit lines SBL and sub source lines SSL are formed by the ion implantation method A high concentration channel region HR is formed by the oblique ion implantation method, etc. In accordance with need, ion implantation is performed for adjusting a threshold voltage.

Next, a charge storage film GD is formed on the semiconductor substrate SUB in which the P-well W and element isolation insulating layer ISO are formed.

For example, a heat treatment of 1000° C. for 10 seconds is performed by the high temperature rapid thermal treatment method (the RTO method) to form a silicon oxide film (first dielectric film BTM).

A silicon nitride film (main charge storage film CHS) is deposited on the first dielectric film BTM by the LP-CVD method to a little thicker than 6 nm so that the final film thickness becomes 6 nm. The CVD is performed for example by using a mixed gas of dichlorosilane (DCS) and ammonium with the substrate temperature of 730° C.

A surface of the formed silicon nitride film is oxidized by the thermal oxidization method to form a silicon oxide film (second dielectric film TOP) of for example 3.5 nm. The thermal oxidization is performed, for example, in a $H_2O$ atmosphere with the furnace temperature of 950° C. for 40 minutes or so. As a result, deep carrier traps having a trap level (an energy difference from a conductive band of the silicon nitride film) of about 2.0 eV or less is formed at a density of about 1 to $2 \times 10^{13}$ $cm^2$. Also, 1.5 nm of thermally oxidized silicon film (second dielectric film TOP) is formed with respect to 1 nm of the silicon nitride film (main charge storage film CHS), and the film thickness of the silicon nitride film decreases at this ratio, so the final film thickness of the silicon nitride film becomes 6 nm.

A stacked layer film of a conductive film to be a gate electrode (word line WL) and an offset insulation layer (not shown) is stacked and the stacked layer film is processed by a same pattern at a time.

Then, to attain the memory cell array configuration in FIG. 4, a self aligned contact portion as well as the side wall insulation layer is formed and plagues to be a bit contact plague BC and source contact plague SC are formed on the sub bit lines SBL and sub source lines SSL to be exposed from the self aligned contact portion.

Around the plagues are buried by an interlayer insulation film and the main bit lines MBL and main source line MSL are formed on the interlayer insulation film, then, in accordance with need, an interlayer insulation layer is stacked, contact is formed, and upper layer wiring is formed. Finally, after processes of forming an overcoat film, opening pads, etc., the nonvolatile memory cell array is completed.

Figure 6:
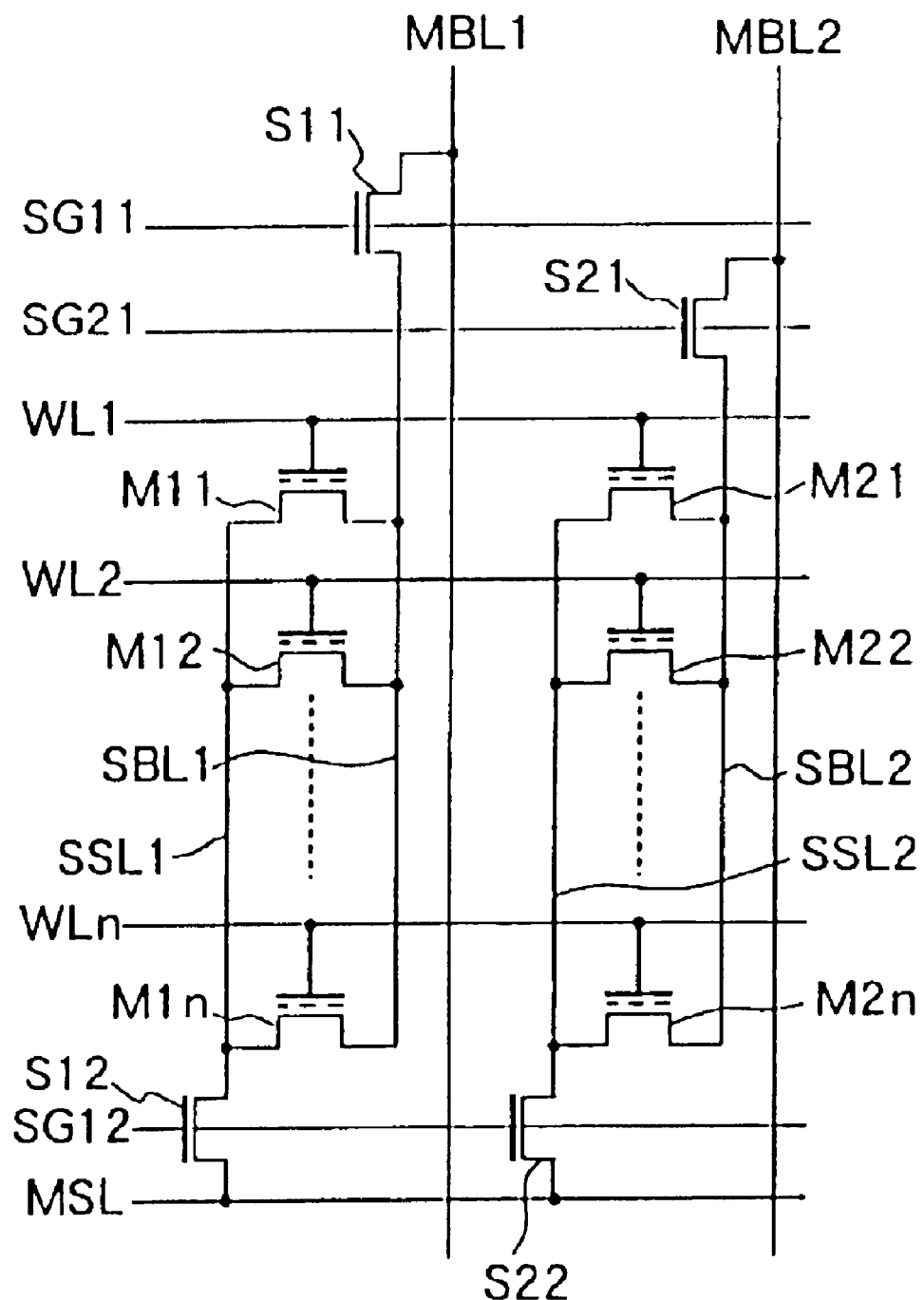
FIG. 6 is an equivalent circuit diagram showing an example of a modified connection method of a memory cell array.

FIG. 6 is an equivalent circuit diagram of a memory cell array in the case where source lines in FIG. 2 are shared.

In this memory cell array, the main source line is shared among memory blocks in the row direction. Namely, sources of the select transistors 12, S22, adjoining in the row direction are connected to the common main source line MSL and gates thereof are connected to a select gate line SG12. Configuration other than that is the same as that in FIG. 2.

The main source line MSL may be shared by two rows of memory blocks. The configuration wherein a main source line is shared is particularly suitable to the case of applying a same voltage to all source lines in a memory cell array or in a block for performing collective writing or erasing operation as in a later explained source line drive method. In this case, there is an advantage that an area is not wasted because the number of main source lines is less comparing with that in the case of FIG. 2.

Next, a bias setting example of an SSL type nonvolatile memory cell array shown in FIG. 2 and its operation will be explained. Note that basics of an operation method explained below are the same also in the memory cell array shown in FIG. 6.

Figure 7A:
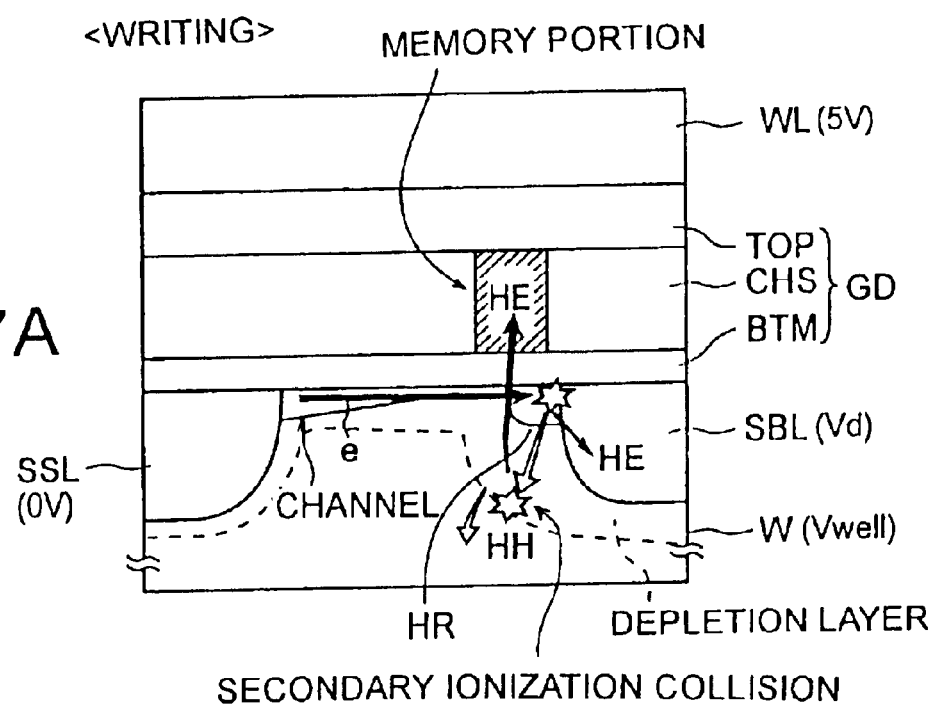
FIG. 7A is a view for explaining a writing operation of a memory transistor along with bias conditions.
Figure 7B:
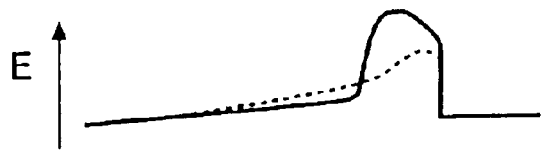
FIG. 7B is a schematic view of strength of an electric field for accelerating electrons.

FIG. 7A is a view showing an operation of writing data along with bias conditions, FIG. 7B is a view of an electric field E for accelerating electrons in the channel direction.

In the first embodiment, writing of data is performed by injection of hot electrons generated by the secondary ionization collision as a kind of ionization collision phenomenon.

As shown in FIG. 7A, using a voltage of the sources (sub source lines SSL) of 0V as a reference, a voltage of 5 to 6V is applied to the gates (word lines WL) and Vd=3.3 to 4V is applied to the drains (sub bit lines SBL). Also, as a back bias, a well voltage Vwell of for example −3V in the direction of reverse-biasing a PN junction between the P-well W and the sub source line (first source/drain region) SSL or the sub bit lines (second source/drain region) SBL is applied to the P-well W. At this time, a voltage applied to between the second source/drain region and well is selected to be a smaller voltage value than a value of the withstand voltage between the second source/drain region and well.

Under the bias conditions, electrons e supplied from the sub source line SSL and running in the channel collide with silicon lattice or is scattered in a depletion layer on the sub bit lines SBL side on the drain side and generate pairs of high energy holes HH and electrons HE. Among them, the hot holes HH are furthermore accelerated in the depletion layer of the PN junction to generate pairs of electrons and holes. The electrons among them become hot electrons HE and drift, while a part thereof moves toward the word line WL side to be further accelerated by the electric field in the vertical direction. The hot electrons HE obtained high energy go over a barrier height of the first dielectric film BTM and are caught by the carrier traps in the main charge storage film CHS. The charge catching region (memory portion) is limited to a part on the drain side.

FIG. 8 shows characteristics of writing to a MONOS transistor having a gate length of 0.13 μm.

The ordinate in FIG. 8 indicates a threshold voltage [V] and the abscissa indicates a writing time [sec.], and a back bias voltage, that is a well voltage Vwell, is used as a parameter to be changed. The gate voltage is 5V and the drain voltage Vd is 3.5V made to be constant. When the gate voltage Vg is 0V, writing is not performed much even if the writing time is set to be 10 msec. When the gate voltage Vg of 5V is applied and the well voltage Vwell of −2.0V or so is applied, a sufficient change of a threshold voltage by 3V or more is observed for a writing time of 1 msec or more. When the well voltage Vwell is set to −2.5V or more, a sufficient change of threshold voltage of 3V or more is observed even if the writing time is 100 μsec.

Figure 9:
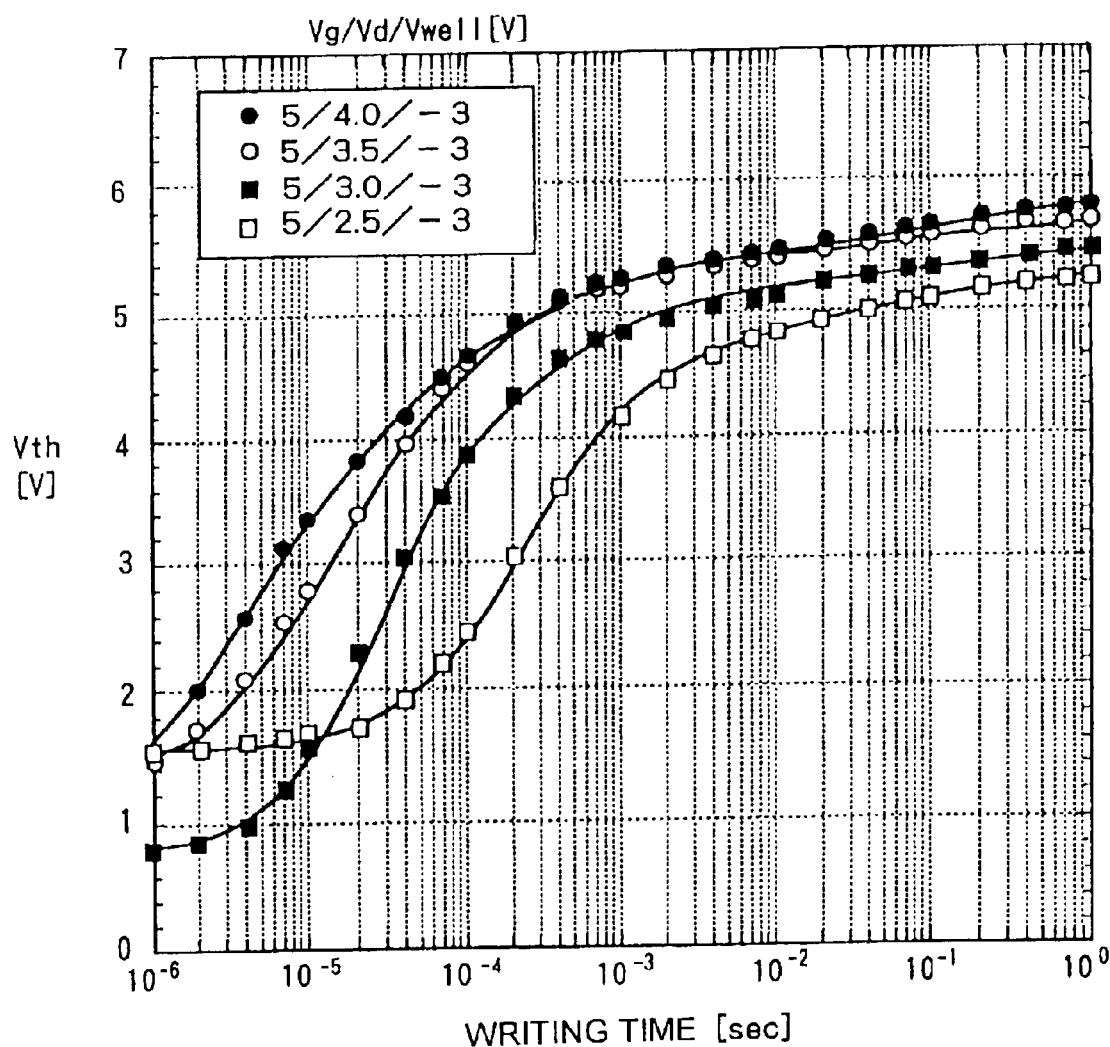
FIG. 9 is a graph of writing characteristics of a transistor when a drain voltage is used as a parameter.

FIG. 9 shows characteristics of writing when using a drain voltage as a parameter to be changed.

The gate voltage is 5V and the drain voltage Vd is −3V made to be constant. It is understood from FIG. 9 that the writing becomes high at speed as the drain voltage Vd at the time of writing becomes higher. To obtain a threshold voltage change by 3V or more for a short time writing of 100 μsec or less, it is understood that the drain voltage Vd has to be 3V or more.

Figure 10:
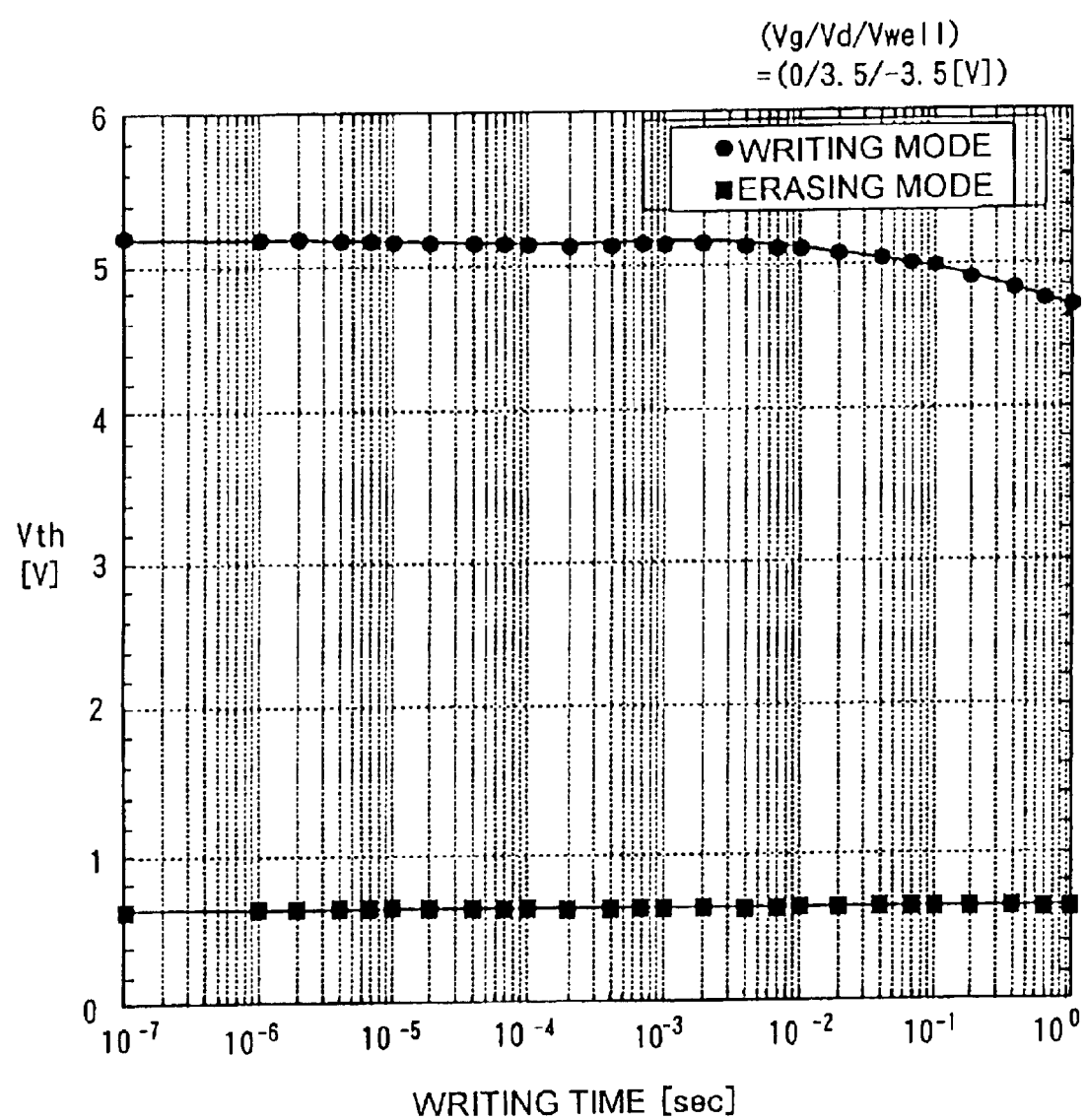
FIG. 10 is a graph of drain disturbance characteristics.

FIG. 10 shows drain disturbance characteristics.

Drain disturbance means the fact that, among not selected cells and selected cells connected to a common drain, a threshold voltage changes in not selected cells having a gate voltage of 0V due to an effect of writing to an adjoining selected cell. In FIG. 10, a change of a threshold voltage of a not selected cell is suppressed sufficiently small until the writing time up to 1 sec of a selected cell. It was proved that when assuming the writing time to the selected cell is 100 μsec, a disturbance margin became 4 digits and sufficient writing disturbance resistance was obtained.

As is clear from the above consideration, the hot electrons HE generated by the secondary ionization collision are generated under a lower electric field by the CHE injection method of simply accelerating in a channel to attain high energy.

Also, in the first embodiment, since a high concentration channel region HR is provided, as shown in FIG. 7B, intensification of the electric field in the channel direction is higher than in the case of not provided with the high concentration channel region HR indicated by a broken line, consequently, colliding energy by channel running electrons e with the silicon lattice becomes high. In other words, an application voltage Vd between the source/drain region for obtaining the same energy may be low. In the first embodiment, formation of the high concentration channel region HR is not essential but it is preferable that the high concentration channel region HR is formed from the reason above.

Furthermore, the PN junction between the P-well W and an N+impurity region composing the sub bit lines is reverse-biased by a back bias, and the depletion layer easily spread at a lower drain voltage. Also, if an application voltage of gate electrodes is set lower comparing with the case of not performing the back bias, efficiency of injecting necessary hot electrons is easily obtained.

As explained above, in the present embodiment, an operation voltage is reduced comparing with conventional cases.

For example, in the conventional channel hot electron injection method, bias conditions for injecting a same amount of charges to the main charge storage film CHS by almost same period of time require a drain voltage of 4.5V and a gate voltage of 9V.

On the other hand, in the present embodiment, the drain voltage is 3.3 to 4V, the gate voltage is 5 to 6V, so there is an advantage of being able to operate at a lower drain voltage by 0.5 to 1.2V and a lower gate voltage by 3 to 4V or so comparing with the conventional cases. As a result, scaling of a gate length was improved comparing with the conventional cases. Also, the writing speed of 20 μsec or less was attained.

Figure 11:
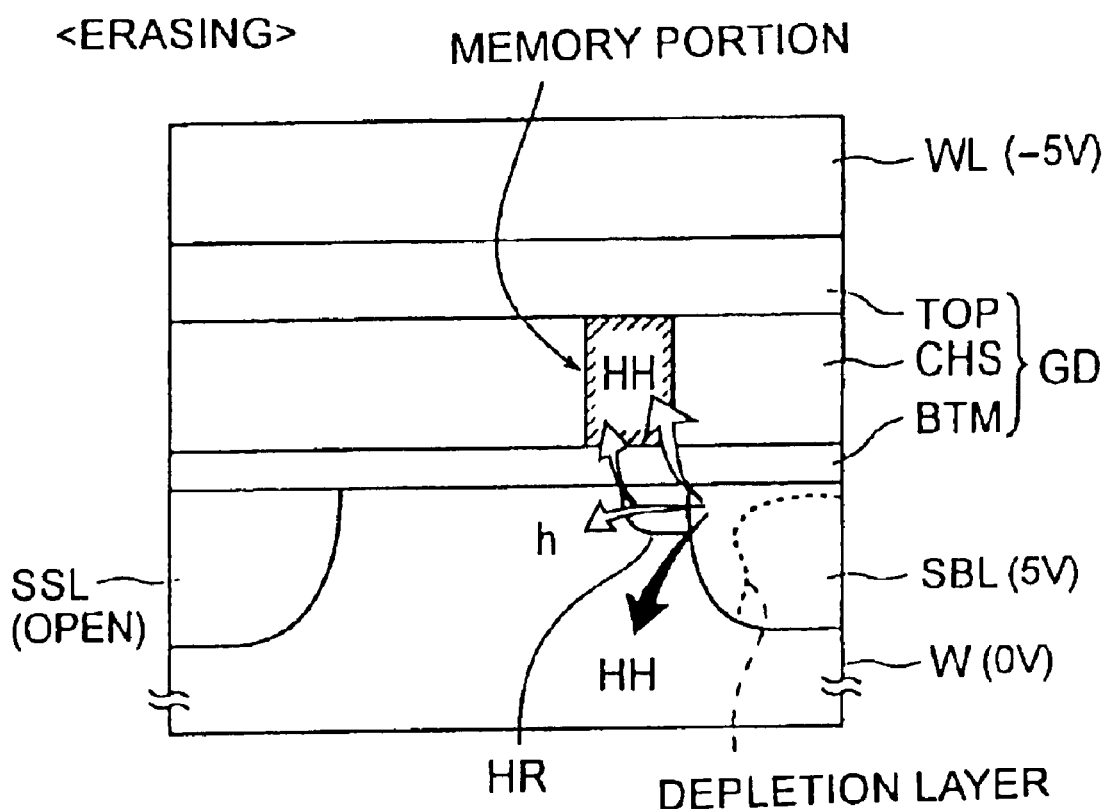
FIG. 11 is a view showing an erasing operation of a memory transistor along with bias conditions.

FIG. 11 is a view showing a data erasing operation along with bias conditions.

Erasing of data is performed by injecting hot holes caused by a band to band tunneling current. Namely, as shown in FIG. 11, by using a voltage 0V of the P-well W as a reference, −5V is applied to the gates (word lines WL) and 5V is applied to the drains (sub bit lines SBL). At this time, the sources are made to be in an open state.

Under the bias conditions, a surface of the N+ impurity region composing the sub bit lines SBL is made to be a deep depleted state due to a voltage of 10V applied between the word lines WL and the sub bit lines SBL, and a curve of an energy band becomes steep. The electrons e tunnel from a valence band to a conductive band due to the band to band tunneling effect, then flows to the N+ impurity region, consequently, holes h are generated. The generated holes h drift a little to the center portion side of the channel forming region, where electric field acceleration is brought, and a part of the holes becomes hot holes HH. High energy charges (hot holes HH) generated at an end of the N+ impurity region are effectively and rapidly injected to the carrier traps in the main charge storage film CHS while maintaining a movement amount (the direction and quantity) without loosing the motion energy.

Due to the injection of the hot holes HH, charges of the hot electrons HE injected at the time of writing are cancelled and the memory transistor shifts to an erasing state.

In the erasing method illustrated in FIG. 11, since the electric field acceleration direction and the injection direction of charges are almost the same, efficiency of injecting charges is high. Also, since the charge injection is performed without forming a channel itself, the current consumption can be suppressed low. Although a hole current itself is small, a data erasing subject is just a part of the memory, so an erasing time for obtaining a necessary threshold voltage change is reduced by two to three digits comparing with the case of erasing by the FN tunnel entire injection.

Figure 12:
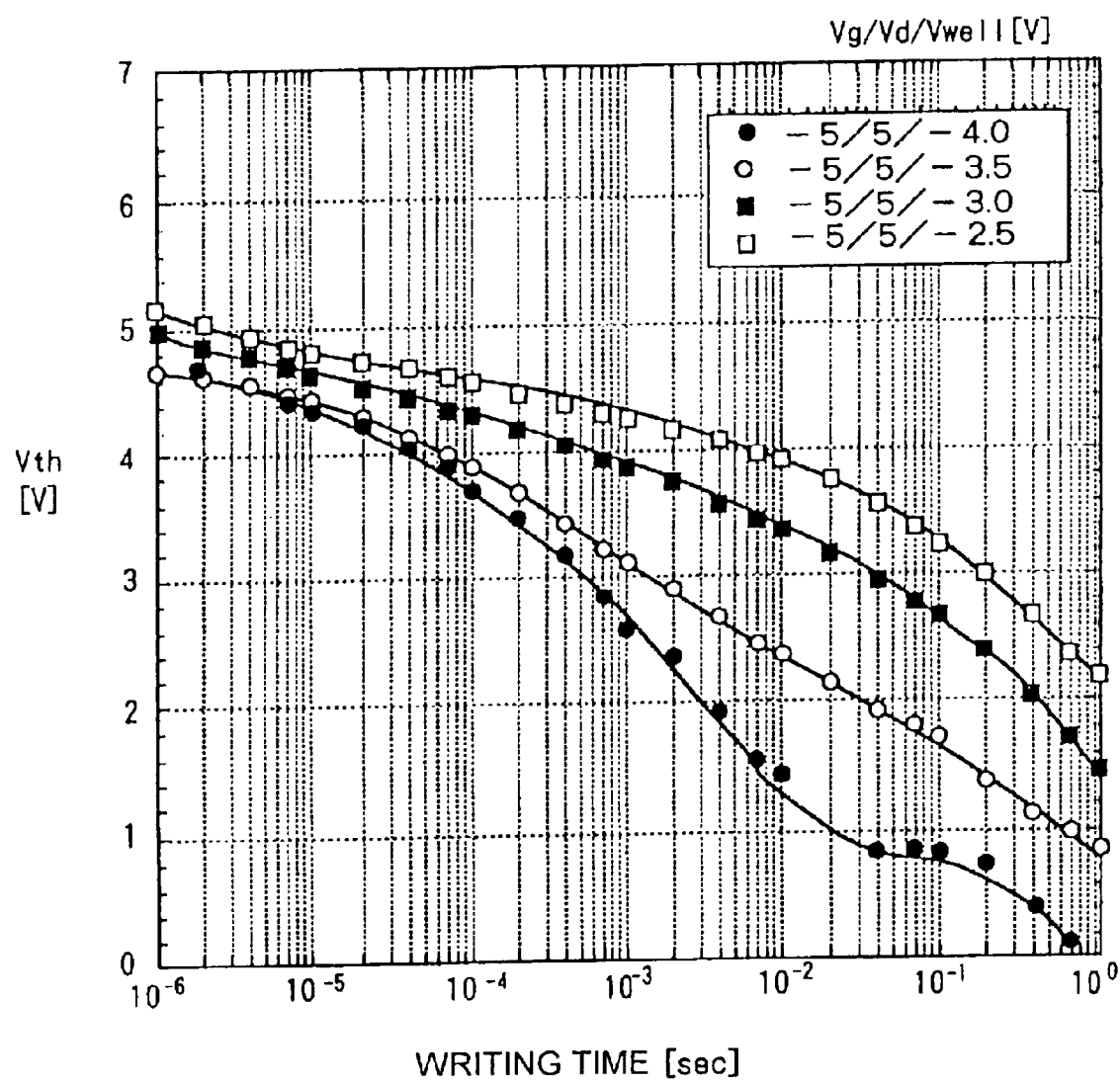
FIG. 12 is a graph showing erasing characteristics.

FIG. 12 shows erasing characteristics.

The ordinate in FIG. 12 indicates a threshold voltage [V] and the abscissa indicates an erasing time [sec], and a back bias voltage, that is a well voltage Vwell, is a parameter to be changed. The gate voltage Vg is −5V and the drain voltage Vd is 5V made to be constant. From the graph, it is understood that the negatively larger the negative voltage is applied as the well voltage Vwell, the more the erasing speed improved.

The above explanation was made on erasing from the drain side. When the gate length is short as 6.18 μm or less, it is preferable that the source side is not made to be open and hot holes are injected also from the source side.

Reading of data may be performed for every bit or every row (hereinafter, referred to as a page reading). Also, either of the forward reading method wherein the direction of applying a voltage between sources and drains is same as that in writing and the reverse reading method wherein the directions are reversed may be adopted.

Figure 13:
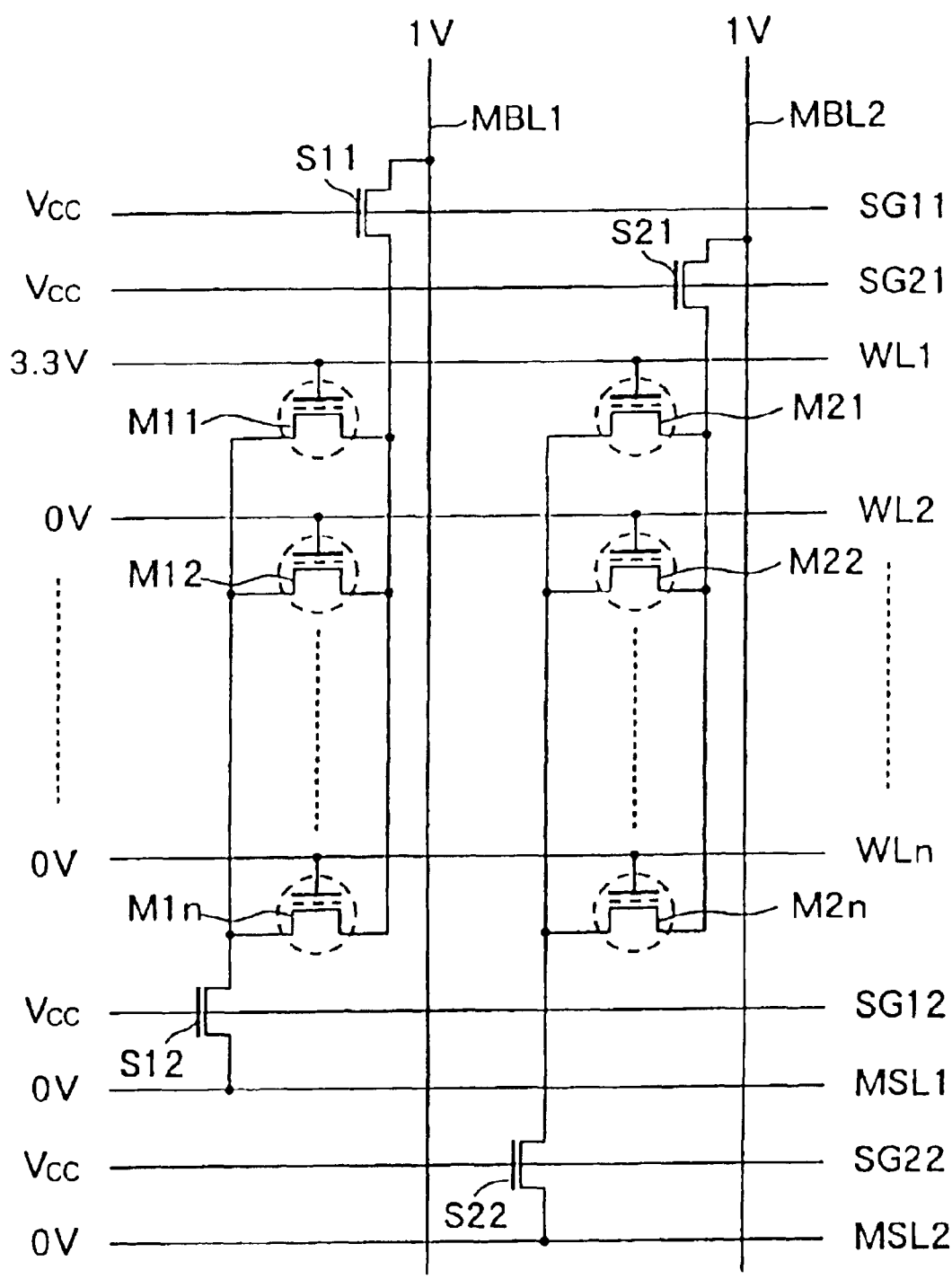
FIG. 13 is a circuit diagram of bias conditions of a memory transistor at the time of forward reading.
Figure 14:
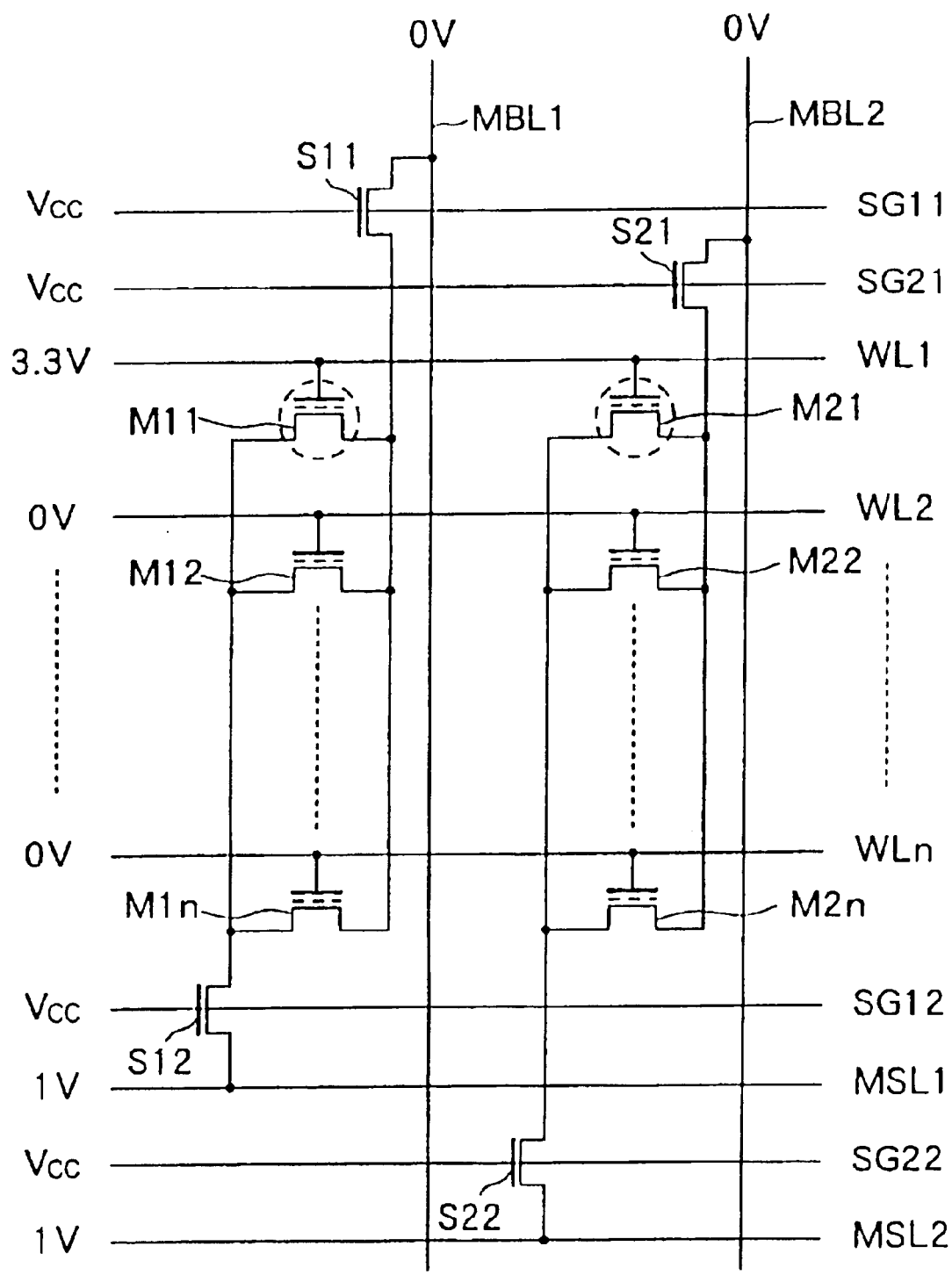
FIG. 14 is a circuit diagram of bias conditions of a memory transistor at the time of reverse reading.

FIG. 13 and FIG. 14 are circuit diagrams showing respective bias conditions in the forward reading and the reverse reading at the time of performing page reading on the first one row.

In the forward reading method and the reverse reading method, positional relationship of sources and drains are inverse with respect to the memory portion where charges are accumulated, but there is little necessity that the bias voltage value itself is changed. Accordingly, it is sufficient to explain either one of them.

Generally, the reverse reading method has higher sensitivity. Note that in verify-reading after writing, the forward reading method is preferable for requiring a little potential change of bit lines. Also, when scaling of a gate length proceeds, sufficient sensitivity is easily obtained also in the forward reading method.

In the forward reading method, as shown in FIG. 13, a predetermined drain voltage of for example 1.0V is applied to the main bit lines MBL1, MBL12, . . . Also, a predetermined reading forbidding voltage of for example 0V (or a negative voltage of −0.3V or so) is applied to not selected word lines WL2, WL3, . . . , and 0V is applied to the main source lines MSL1, MSL2 and the P-well W. Also, all selected gate lines SG1, SG21, SG12 and SG22 are held at a power source voltage $V_{cc}$. Under this condition, a predetermined gate voltage of for example 3.3V is applied to the word line WL1 to be read.

As a result, the memory transistors M11, M21, . . . connected to the word line WL1 turn on or off in accordance with a writing state, and a voltage of the main bit line changes only when turned on. The voltage change is amplified by the sense amplifier (SA), etc. in FIG. 1 and read out.

In the reverse reading method, as shown in FIG. 14, a predetermined drain voltage of for example 1.0V is applied to the main source lines MSL1, MSL2, . . . and 0V is applied to the main bit lines MBL1, MBL12, . . . Other conditions on bias application are the same as those in the above forward reading method.

As a result, the memory transistors M11, M21, . . . connected to the word line WL1 turn on or off in accordance with a writing state, and a voltage of the main source line changes only when turned on. The voltage change is amplified by the sense amplifier (SA), etc. and read out.

Note that since the overall charge storing means (floating gate FG) is comprised of a conductive film in the so-called FG type memory cells, excessive erasing becomes a problem wherein a threshold voltage of a memory cell injected with holes is lowered more than needed when holes are injected more than needed.

On the other hand, in the MONOS type transistor in the first embodiment, hot electrons HE are injected to a part of the charge storage film (the memory portion) at the upper portion of the drain end and accumulated when writing data. Also in erasing, hot holes HH are injected to the above memory portion to electrically cancel out the accumulated electrons. Therefore, the charge storage film GD has a region where neither of the electrons nor holes is injected. A threshold voltage Vthc of the region not injected with charges is maintained at a constant value.

Even when excessive erasing arises in the MONOS type, namely a more than needed large amount of hot holes HH are injected to the memory portion where electrons are accumulated and a threshold voltage Vthd of the memory portion is decreased to be lower than a threshold voltage Vthc of the region where charges are not injected, the threshold voltage Vth of the overall memory cell hardly decreases. It is because the threshold voltage Vth of the overall memory cell is mainly determined by the region where charges are not injected, particularly by a threshold voltage of the end of the source. As a result, the excessive erasing does not become a problem in a stack type one transistor cell of MONOS type, etc. Accordingly, the MONOS type memory cell in the first embodiment is superior to the FG type memory cells in a point that the excessive erasing affects little on a memory cell operation.

Voltages required for respective operations of a memory cell array are supplied from a variety of drivers, etc. in the memory peripheral circuits.

The memory peripheral circuits respectively generate a first polarity voltage (5 to 6V) and a second polarity voltage (−3V) so that a potential difference of the two becomes a second voltage (8 to 9V) to be applied between gates and a substrate at the time of writing data. The first polarity voltage (5 to 6V) is applied to gate electrodes, for example the word lines WL, and the second polarity voltage (−3V) is applied to a semiconductor substrate, for example the P-well W.

At the time of erasing data, a first polarity voltage (5V) and a second polarity voltage (−5V) are respectively generated so that a potential difference of the two becomes a third voltage (10V) to be applied between gates and a substrate. The first polarity voltage (5V) is applied to a second source/drain region, for example the sub bit lines SBL, and the second polarity voltage (−5V) is applied to a semiconductor substrate, for example the P-well W.

Below, an example of the configuration of the memory peripheral circuits for generating the first polarity voltage and the second polarity voltage will be explained with reference to the drawings.

Figure 15:
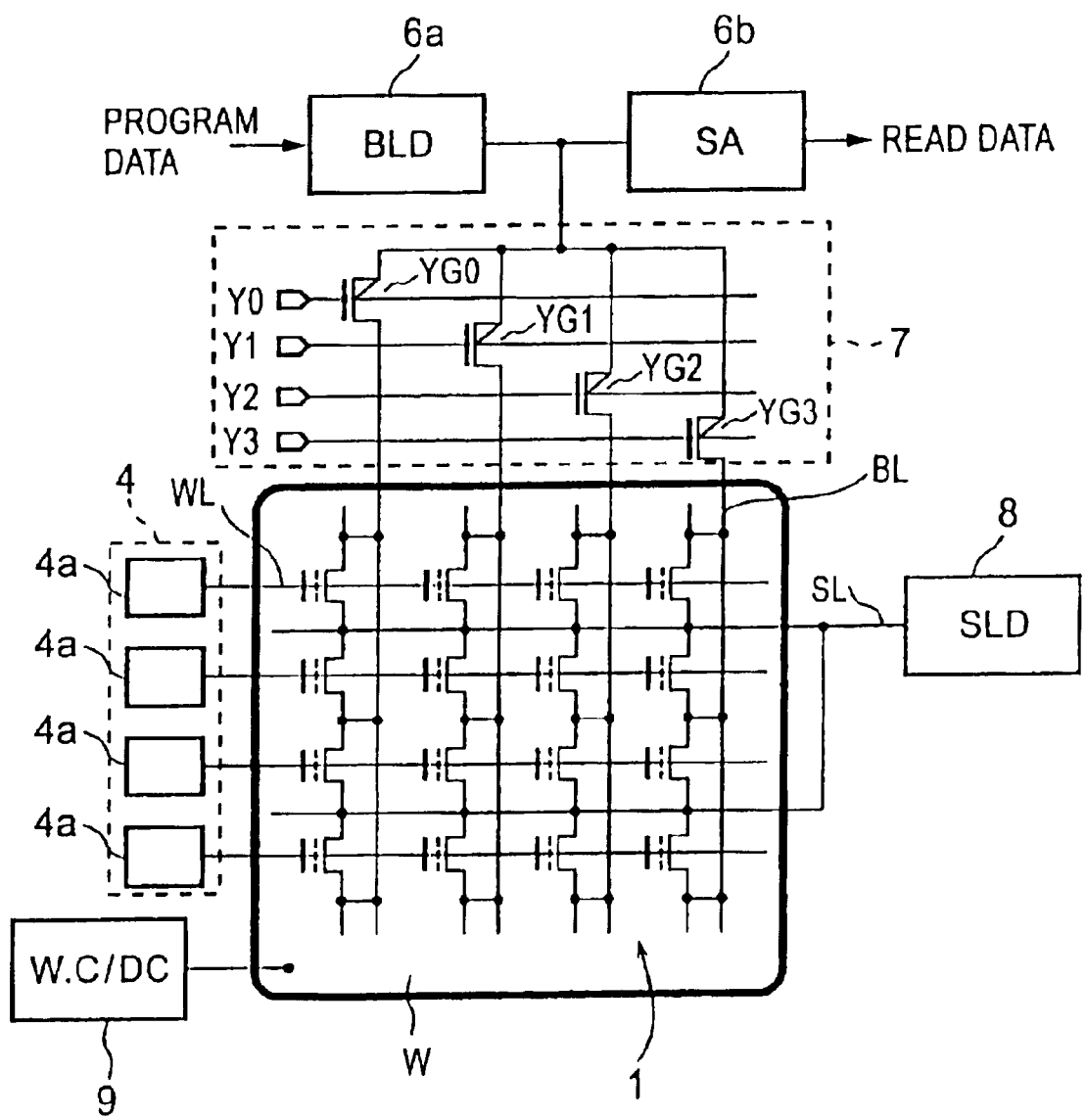
FIG. 15 is a block diagram of a connection relationship of a memory peripheral circuit portion and a memory cell array relating to an operation method of a nonvolatile memory.

FIG. 15 is a block diagram showing a connection relationship of the peripheral circuits part and a memory cell array relating to an operation method of a nonvolatile memory. Connection between cells of the memory cell array 1 shown in FIG. 15 is different from connection between cells of the memory cell array shown in FIG. 2 and FIG. 6, but the two are the same in a point that connection relationship of the memory cell is the NOR type.

A column gate array 7 shown in FIG. 15 is controlled by column selection signals Y0 to Y3, and each source is respectively comprised of column selection transistors YG0 to YG3 connected to either one of four bit lines BL. Respective drains of the column selection transistors YG0 to YG3 are connected in common, and the midpoint of the connection is connected to an output of a bit line drive circuit (BLD) 6a and an input of a sense amplifier (SA) 6b.

Either one of four memory cell columns (or bit lines) is selected as an object of an operation by the column gate array 7 at the time of writing and reading. Note that the configuration of providing the sense amplifier and drive circuit for every bit line or every plurality of bit lines excepting four is also possible.

A main row decoder 4 comprises a plurality of decoder units 4a connected to the respective word lines.

Source lines of the memory cell array 1 are all connected or connected in every block, and a common source line SL is connected to an output of a source line drive circuit (SLD) 8. The P-well W of the memory cell array is connected to a well charge/discharge circuit (W.C/DC) 9. Note that the P-well W may be separated for every column as explained above, alternately, as shown in FIG. 15, it may be configured that the P-well W is provided in common for a plurality of columns in a unit of an operation block.

FIG. 16A shows a circuit example of a decoder unit composing the main row decoder.

The decoder unit 4a comprises two P-type channel MOS transistors P1 and P2, six N-type channel MOS transistors N1 to N6, two inverters IN1 and IN2, two transfer gates TG1 and TG2, a NAND gate NAND1 and NOR gate NOR 1.

The transistors P1 and N1 are serially connected, the transistors P2 and N2 are serially connected, and they are connected between a supply terminal of the word line drive voltage VH at a high level and a supply terminal of the word line drive voltage VL at a low level. The P-well being formed of the transistors N1 and N2 is electrically connected to a supply terminal of the voltage VL.

Both gates of the transistors P1 and N1 are connected and the midpoint of the connection is connected to the midpoint of connection of the transistors P1 and N1. In the same way, both gates of the transistors P2 and N2 are connected and the midpoint of the connection is connected to the midpoint of connection of the transistors P1 and N1, respectively. The midpoint of the connection of the transistors P1 and N1 is connected to the word line WL, and two transistors N3 and N4 are serially connected between the midpoint of the connection and a supply line of the ground potential GND (hereinafter, referred to as aground line). On the other hand, two transistors N5 and N6 are serially connected between the midpoint of connection of the transistors P2 and N2 and the ground line. It is configured that gates of the transistors N3 and N5 are input with a control signal XERSM and a P-well drive signal WIWP can be applied to a P-well being formed of the transistors N3 and N5. The P-well has the well-in-well structure formed in a one size larger N-well and is configured so that an N-well drive signal WIWN can be applied to the outer N-well. Note that the well-in-well structure will be explained later on.

On the other hand, an input of the NAND gate NAND1 receives as an input a pre-decode signal output from the pre-row decoder 3 in FIG. 1. The output of the NAND gate NAND1 is connected to a gate of the transistor N6 via the transfer gate TG1. An output of the transfer gate TG1 is connected to a gate of the transistor N4 via the inverter IN1.

An output of the NAND gate NAND1 is connected to one input of the NOR gate NOR1, and a control signal XCE, for making the all word lines not selected during standing by, is input to the other input. The transfer gate TG2 is connected between an output of the NOR gate NOR1 and an output of the transfer gate TG1. NMOS gates and PMOS gates of the two transfer gates are mutually connected. The midpoint of connection of an NMOS gate of the transfer gate TG1 and a PMOS gate of the transfer gate TG2 receives as an input a control signal ERS, and an inverse signal of the control signal ERS is input to the midpoint of connection of gates of other transfer gates via the inverter IN2. Due to the control signals, discharge of nodes A and B of the word line drive circuit, that is, the ground of the word lines, is controlled.

FIG. 17A shows a circuit example of a bit line drive circuit and a sense amplifier.

The bit line drive circuit 6a comprises three PMOS transistors P3 to P5, three NMOS transistors N7 to N9, a transfer gate TG3 and a NAND gate NAND2.

The transistors P3 and N7 are serially connected, the transistors P4 and N8 are serially connected, and they are connected between a supply terminal of a bit line drive voltage VEW at a high level and a ground line. The P-well being formed because the transistors N7 and N8 are grounded.

Both gates, of the transistors P3 and N7 are connected, and the transistor P5 is connected between the midpoint of connection thereof and the supply terminal of the bit line drive voltage VEW. Furthermore, the transistor N9 and the NAND gate NAND2 are serially connected to the midpoint of the connection. A gate of the transistor N9 is connected to a supply line of the power source voltage $V_{cc}$ (hereinafter referred to as a power source line).

Program data is input to one input of the NAND gate NAND2, and a signal XERS for controlling an input of the program data to switch a set voltage of bit lines is input to the other input.

On the other hand, both gates of the transistors P4 and N8 are connected, and the midpoint of the connection is connected to the midpoint of connection of the transistors P3 and N7 and a gate of the transistor P5, respectively. The midpoint of connection of the transistors P4 and N8 is connected to an input of the transistor gate TG3. An output of the transfer gate TG3 is connected to an input of the sense amplifier 6b and the column gate array 7.

A signal XEWH is input to a PMOS gate of the transfer gate TG3 and a signal EWH is input to a NMOS gate thereof. At the time of writing and erasing, the signal EWH becomes high level, inversely, the signal XEWH becomes low level. Accordingly, the transfer gates are turned on when writing and erasing and turned off in other modes (reading and standing by).

The sense amplifier 6b comprises three PMOS transistors P6 to P8, five NMOS transistors N10 to N14 and an inverter IN3 as an amplifier.

Sources of the transistors N10 and N11 are mutually connected and grounded, and drains thereof are mutually connected. The transistors P6 and N7 are serially connected between a power source line and the common drain of the transistors N10 and N11. Gates of the transistors P6 and N10 are connected. A control signal XRD for sensing is input to the common gate. Gates of the transistors N11 and P7 are connected in common and the midpoint of the connection is connected to an output of the bit line drive circuit 6a and the column gate array via the transistor N14. A gate of the transistor N14 receives as an input a signal XEW for controlling turning on and off thereof. The control signal XEW becomes a high level when standing by and reading and becomes a low level when writing and erasing so as to control connection and disconnection with the bit line side of the sense amplifier 6b.

FIG. 18B is a circuit diagram of an example of the basic configuration of a source line drive circuit.

The source line drive circuit 8 comprises one NMOS transistor N16 for discharging. A drain of the transistor N16 is connected to a common source line SL (potential: VSL), and a source of the transistor N16 is grounded. P-well is formed because the transistor N16 is grounded. A gate of the transistor N16 receives as an input a control signal XERS.

FIG. 18A is a circuit diagram of a configuration example of a well charge/discharge circuit.

The well charge/discharge circuit 9 comprises three PMOS transistors P12 to P14, four NMOS transistors N18 to N21, two inverters IN5 and IN6 and a high voltage circuit 9a. The high voltage circuit 9a outputs a second polarity voltage of for example −3V at the time of writing, while in other operation modes (standing by, erasing and reading), it stops operation and the output becomes a high impedance state (Hi-Z).

The transistors P12 and N18, the transistors P13 and N19, and the transistors P14 and N20 are serially connected, respectively, and they are connected between an output terminal of the high voltage circuit 9a, that is a supply terminal of the well voltage Vwell, and a power source line. The transistor N21 is connected between the supply terminal of the well voltage Vwell and the grounded line. The P-well being formed by the transistors N18, N19, N20 and N21 is configured to be supplied with a well voltage Vwell.

A gate of the transistor P12 receives as an input a program enable signal PGM via the two inverters IN5 and IN6. The midpoint of connection of the inverters IN5 and IN6 is connected to a gate of the transistor P13. The midpoint of connection of the transistors P13 and N19 is connected to a gate of the transistor N18, and a gate of the transistor N19 is connected to the midpoint of connection of the transistors P12 and N18. Both gates of the transistors P14 and N20 are connected and the midpoint of the connection is connected to the midpoint of connection of the transistors P13 and N19. The midpoint of connection of the transistors P14 and N20 is connected to a gate of the transistor N21.

Next, an operation of the memory peripheral circuits will be explained.

Figure 18C:
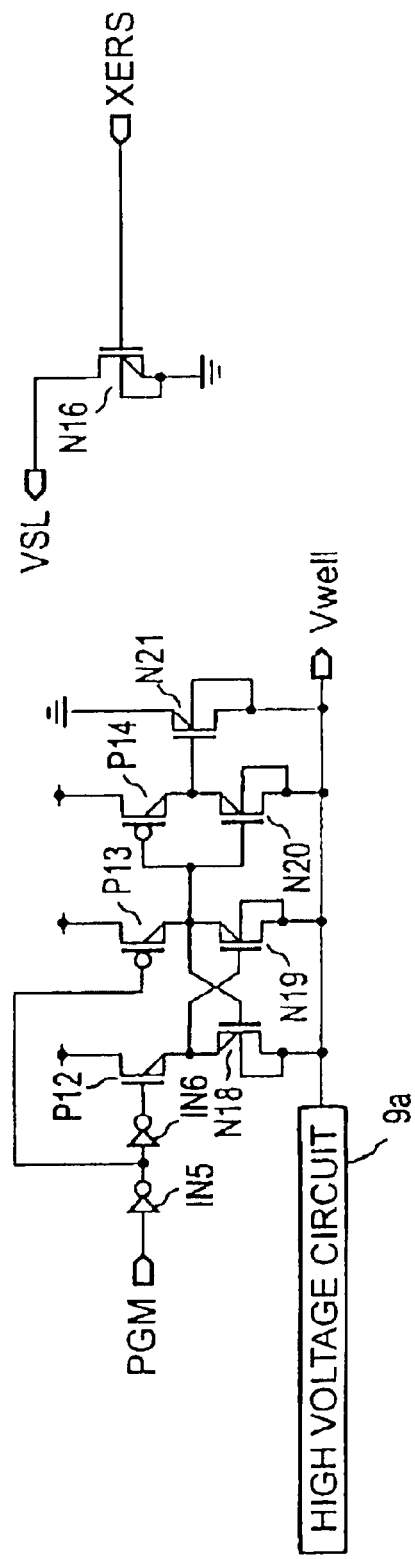
FIG. 18C is a table showing set values of various signals and voltage, etc. relating to an operation of the circuit shown in FIGS. 18A and 18B.

FIG. 16C, FIG. 17B and FIG. 18C are tables showing set values of various signals and voltages relating to the circuit operation. The power source voltage $V_{cc}$ is set to be 2.5V in the explanation below.

A circuit state at standing by will be explained.

In the decoder unit (FIG. 16A), since the inverse signal XCE of a chip enable signal CE is at a high level "H" of a power source voltage $V_{cc}$ (hereinafter, the high level "H" is a power source voltage $V_{cc}$ unless otherwise indicated) at standing by, an output of the NOR gate BOR1 becomes ground potential GND (low level "L"). Since the control signal ERS is at "L", the transfer gate TG2 is turned on and the transfer gate TG1 is turned off. As a result, gate potential of the transistor N6 becomes "L" and gate potential of the transistor N4 becomes "H" regardless of a pre-decode signal. While not particularly shown in Tables, the control signal XERSM becomes "H" and the transistors N3 and N5 come to a state of being able to turn on. As a result, a node B forcibly becomes "L", and potential of all word lines at standing by becomes "L", that is, becomes to be not selected. The other node A of a latch circuit comprising the transistors P1, P2, N1 and N2 forcibly becomes "H", but since the transistor N6 is turned off, the voltage is not discharged.

In the bit line drive circuit 6a shown in FIG. 17A, since a control signal EWL is at "L" and an inverse signal XEWH is at "H" in the transfer gate TG3, the transfer gate TG3 is turned off and the bit line drive circuit 6a is separated from the memory cell array side.

Although the control signal XEW on the sense amplifier 6b side is at "H" and the transistor N14 is in a state of being able to be turned on, the other control signal XRD is at "H", the transistor N10 turns on and thus the transistors N12 and N13 are turned off. At this time, even if the column gate array 7 is open, the sense amplifier 6b cannot be driven and potential VBL of a node C becomes a floating state. The column gate array 7 is normally turned off at the time of standing by.

In the well charge/discharge circuit 9 shown in FIG. 18A, since the program enable signal PGM becomes "L", gate potential of the transistor P12 becomes "L" and gate potential of the transistor P13 becomes "H". Consequently, the transistors P12 and N19 turn on and the transistors P13 and N18 turn off. At this time, since a threshold value of an inverter is set so that an output of the inverter comprising the transistors P14 and N20 becomes a high level, the transistor N21 turns on, the P-well W is discharged, and well potential Vwell becomes ground potential GND.

In the source line drive circuit 8 shown in FIG. 18B, since the control signal XERS is at "H", the transistor N16 turns on. As a result, a common source line potential VSL is held at "L".

An operation of the circuit at erasing data will be explained.

FIG. 19 shows timing charts of changes of various signals and supply voltages at erasing. A range of an object of the erasing operation in the memory cell array may be any, such as one row of the memory cell, a memory block, the whole memory cell array, etc.

In the decoder unit 4a shown in FIG. 16A, an output of the NAND gate NAND1 becomes "L" in the decoder unit in the range of the object of the erasing operation in accordance with the pre-decode signal of the row address at erasing. As a result, a single or a plurality of rows in the memory cell corresponding to the decoder unit is selected. When there are not selected rows, an output of the NAND gate NAND1 becomes "H" in the decoder unit of the not selected rows.

At the time of erasing, as shown in FIG. 19B, the control signal ERS shifts to "H", the transistor gate TG2 turns off and the transfer gate TG1 turns on. As a result, a signal at "L" level output from the NAND gate NAND1 is applied to a gate of the transistor N6, and an inverse signal is applied to a gate of the transistor N4. The control signal XERSM is held at "H ($V_{cc}$)" yet at this time, and the transistors N3 and N5 become to be able to turn on. As a result, a node B forcibly becomes "L", so that ground potential GND is set to the selected word line WLsel.

In the decoder unit in a not selected row, an output of the NAND gate NAND1 is at "H", so a node A forcibly becomes "L" being inverse to that of the selected row and the other node B of the latch circuit is charged at a voltage VH ($V_{cc}$). As a result, a power source voltage $V_{cc}$ is set to the not selected word lines WLunsel.

After a predetermined period of time, as shown in FIG. 19D, potential of a control signal XERSM is lowered from the power source voltage $V_{cc}$ to the ground potential GND and the transistors N3 and N5 turn off.

As shown in FIG. 19D and FIG. 19F, potential of the control signal XERSM, a word line drive voltage VL at a low level and the P-well drive signal WIWP are gradually lowered toward −5V. A voltage VL is transferred as it is to the selected word lines WLsel via the turned on transistor N1. Potential of the selected word lines WLsel gradually rises being linked with the word line drive voltage VL at a low level.

The lowering of the potential is performed by a not shown negative booster circuit, and an output of the negative booster circuit is monitored by a not shown voltage detection circuit. When the monitored value becomes lower than ($V_{cc}$ of −5V), potential of the word line drive voltage VH is forcibly lowered from the power source voltage $V_{cc}$ to the ground potential GND by control by a not shown logical circuit. As a result, as shown in FIG. 19H, potential of the not selected word lines WLunsel lowers to the ground potential GND. Then, potential of the selected word lines WLsel is lowered to −5V being linked with the word line drive voltage VL at a low level. Thus, the word line voltage (−5V) for erasing is set.

Note that the reason of lowering the control signal XERSM together is to always turn off the transistors N3 and N5 even when the P-well potential WIWP lowers and to prevent the node of the latch circuit from being discharged by the address signal. The reason why the potential of the not selected word lines is lowered in the middle is to prevent that the not selected memory transistors turn on and an excessive current flows out from the bit lines. The N-well potential WIWN is held at the power source voltage $V_{cc}$ during an erasing operation.

At the time of erasing data, some or all of the column selection transistors YG0 to YG3 are turned on and bit lines of columns to be erased are selected.

In the bit line drive circuit 6a shown in FIG. 17A, the control signal EWH of the transfer gate TG3 is at "H (5V)" and the inverse signal XEWH is at "L". The transfer gate TG3 turns on and the bit line drive circuit BLD is connected to the selected bit lines BLsel.

The control signal XERS is set to be "L". At this time, while not particularly illustrated, an input terminal of program data is held at a "H" level voltage. Thus, an output (node D1) of the NAND gate NAND1 becomes "H ($V_{cc}$)", and a node D2 on the output side of the transistor is set at a voltage of ($V_{cc}$-Vth), lower than the $V_{cc}$ by Vth. Since a gate of the transistor is held at the power source voltage $V_{cc}$, a high voltage VEW is not applied to the node D1.

A threshold of an inverter comprising the transistor P3 and N7 is designed to recognize ($V_{cc}$-Vth) as "H", potential of an output (note D3) of the inverter lowers, and thereby, the transistor P1 shifts to the direction of turning on and potential of the node D2 further rises (>$V_{cc}$-Vth). Thus, potential of the node D3 further lowers, the transistor P1 shifts further to the turning on direction, and potential of the node D2 furthermore rises. Due to the feedback, potential of the node D2 finally becomes a bit line drive voltage VEW at a high level and the transistor N1 is cut off. The node D3 becomes the ground potential GND and the node D4 becomes 5V which is the same as the bit line drive voltage VEW at a high level.

Actually, even when the control signal XERS becomes "L" to be an erasing mode, it takes time that an output of the not shown booster circuit changes, so the row decoder once settles at the $V_{cc}$ level, but along with the change of the output of the booster circuit, the output, that is the bit line drive voltage VEW at a high level shifts from the power source voltage $V_{cc}$ to 5V.

At the time of erasing data, the control signal XEW on the sense amplifier 6b shown in FIG. 17A is at "L" and the transistor N14 is in a state able to turn on, but since the other control signal XRD is at "H", the transistor N10 turns on thus the transistors N12 and N13 are turned off. At this time, even if the column gate array 7 is open, the sense amplifier 6b cannot be driven, so the potential VBL of the node C is held in the floating state.

In the well charge/discharge circuit 9 shown in FIG. 18A, since the program enable signal PGM is at "L", the P-well W is held in the state of being connected to the ground line, and the well potential Vwell is at the ground potential GND in the same way as being at standing by.

In the source line drive circuit 8 shown in FIG. 18B, the control signal XERS is at a "L" level, and the transistor N16 is turned off. Thus, common source line potential VSL becomes high impedance of "Hi-Z (open)".

By setting voltages as above, as explained above, hot hole injection caused by the band to band tunneling is performed on cells in the selected range.

A circuit operation at the time of writing data will be explained.

In the decoder unit 4a shown in FIG. 16A, an output of the NAND gate NAND1 becomes "L" in only one decoder unit among all in accordance with a pre-decode signal of the row address and a row of the memory cell corresponding to the decoder unit is selected when writing. Rows of the memory cell corresponding to other decoder units become not selected.

At the time of writing data, an inverse signal XCE of the chip enable signal CE and the control signal ERS shift to the ground potential GND (low level "L"), so an output of the NOR gate NOR1 becomes "H" in selected rows. Because the control signal ERS is at "L", the transfer gate TG2 turns on and the transfer gate TG1 turns off. Therefore, gate potential of the transistor T6 becomes "H" and the gate potential of the transistor N4 becomes "L". At this time, the control signal XERSM becomes "H" and the transistors N3 and N5 become to be able to turn on. As a result, the node A forcibly becomes "L" and the other node B of the latch circuit forcibly becomes "H". At this time, the note B is charged to a high level drive voltage VH (5 to 6V) of the latch circuit, consequently, 5 to 6V of writing word line voltage is set to the selected word lines WLsel.

In decoder units corresponding to the not selected rows, an output of the NAND gate NAND1 becomes "H" and an output of the NOR gate NOR1 becomes "L". The transfer gate TG1 turns off and the transfer gate TG2 turns on. Thus, in the same way as in the above explained case of standing by, potential of the node B of the latch circuit is discharged and all of not selected word lines WLunsel become ground potential GND.

At the time of writing data, in accordance with the column selection signals Y0 to Y3 shown in FIG. 15, any one of the column selection transistors YG0 to YG3b turns on and a bit line is selected.

In the bit line drive circuit 6a shown in FIG. 17A, because the control signal EWH of the transfer gate TG3 is at "H (4V)" and the inverse signal XEWH is at "L", the transfer gate TG3 turns on and the bit line drive circuit 6a is connected to selected bit lines BLsel.

A control signal XERS applied to one input of the NAND gate NAND2 becomes "H ($V_{cc}$)". At this time, when the program data to be applied to the other input is "1", the nodes D1 and D2 become "L (GND)" level, the node D3 becomes the bit line drive voltage VEW at a high level, and the node D4 outputs a voltage at a "L" level. When the program data is "0", due to a level shift operation along with the above explained feedback at erasing, the node D4 outputs a voltage of the same level (4V) as the bit line drive voltage VEW at a high level.

Since the control signal XEW on the sense amplifier 6b side shown in FIG. 17A is at "L" and the other control signal XRD is at "H", the sense amplifier 6b is not driven and potential VBL of the node C becomes the floating state.

As a result, the selected bit lines BLsel are applied a writing drain voltage of 4V or 0V in accordance with the program data.

At the time of writing data, in the well charge/discharge circuit 9 shown in FIG. 18A, the program enable signal PGM becomes "H". Thus, contrary to the cases of standing by and erasing, the transistors P13 and N18 turn on, an input of an inverter comprising the transistors P14 and N20 becomes "H" and the transistors for discharging turn off. As a result, an output voltage of −3V of the high voltage circuit 9a turned to be an operating state is supplied as it is as a well potential Vwell to the P-well W.

Actually, when turning into an writing operation, the program enable signal PGM becomes "H" but a voltage to be supplied from an output of the high voltage circuit 9a does not immediately become −3V. An output voltage of the high voltage circuit 9a gradually lowers and after a certain period of time, the output voltage, that is the well potential Vwell, reaches −3V as the final voltage.

In the source line drive circuit 8 shown in FIG. 18B, in the same way as in the case of standing by, the transistor N16 turns on and the common source line potential VSL at the time of writing is fixed to the ground potential GND.

By setting the voltages as above, only in the case that the program data is "1" and the writing drain voltage is 4V, injection of hot electrons generated by ionization collision as explained above is performed on the selected cells.

A circuit operation at the time of reading data will be explained.

In the decoder unit 4a shown in FIG. 16A, at the time of reading data, an output of the NAND gate NAND1 becomes "L" in only one decoder unit among all in accordance with a pre-decode signal of the row address, and a row of the memory cell corresponding to the decoder unit is selected. Rows of the memory cells corresponding to other decoder units become not selected.

Because the inverse signal XCE of the chip enable signal CE and the control signal ERS are at the ground potential GND (low level "L"), an output of the NOR date NOR1 becomes "H" in the selected rows. Since the control signal ERS is at "L", the transfer gate TG2 turns on and the transfer gate TG1 turns off. Thus, gate potential of the transistor T6 becomes "H" and gate potential of the transistor N4 becomes "L". At this time, the control signal XERSM becomes "H" and the transistors N3 and N5 become to be able to turn on. As a result, the node A forcibly becomes "L" and the other node B of the latch circuit forcibly becomes "H". The node B is charged to a drive voltage VH (power source voltage $V_{cc}$) at a high level of the latch circuit, consequently, the reading word line voltage of the voltage $V_{cc}$ is set to the selected word lines WLsel.

In the decoder units corresponding to the not selected rows, an output of the NAND gate NAND1 becomes "H", an output of the NOR gate NOR1 becomes "L", the transfer gate TG1 turns off and the transfer gate TG2 turns on. Therefore, in the same way as in the case of standing by and writing explained above, potential of the node B of the latch circuit is discharged and all of the not selected word lines WLunsel become the ground potential GND.

In the configuration illustrated in FIG. 15, in accordance with the column selection signals Y0 to Y3, any one of the column selection transistors YG0 to YG3 turns on and one out of four bit lines is selected. As explained above, when performing page reading, a circuit has to be changed so as to provide a sense amplifier for every bit line, etc.

In the bit line drive circuit 6a shown in FIG. 17A, since the control signal EWH of the transfer gate TG3 is at "L" and the inverse signal XEWH is at "H", the transfer gate TG3 turns off and the bit line drive circuit BLD is separated from the memory cell array side as in the same way in the case of standing by.

In the well charge/discharge circuit 9 shown in FIG. 18A, since the program enable signal PGM becomes "L", the well potential Vwell becomes the ground potential GND in the same way as in the cases of standing by and erasing as above.

In the source line drive circuit 8 shown in FIG. 18B, since the transistor N16 turns on, the common source line potential VSL at the time of reading is fixed to the ground potential GND.

The control signal XEW on the sense amplifier 6b side in FIG. 17A is at "H", and the transistor N14 is in the state of being able to turn on. Since the other control signal XRD is shifted to "L", the transistor P6 is turned on and the transistor N10 is turned on.

Figure 20A:
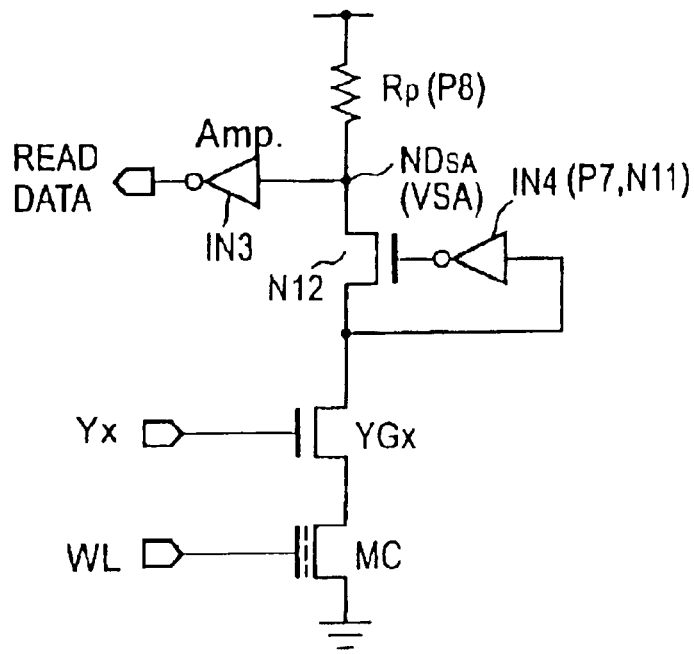
FIG. 20A is an equivalent circuit diagram of a sense amplifier when a control signal at a high level is input.

FIG. 20A is an equivalent circuit diagram of a sense amplifier at this time.

Figure 20B:
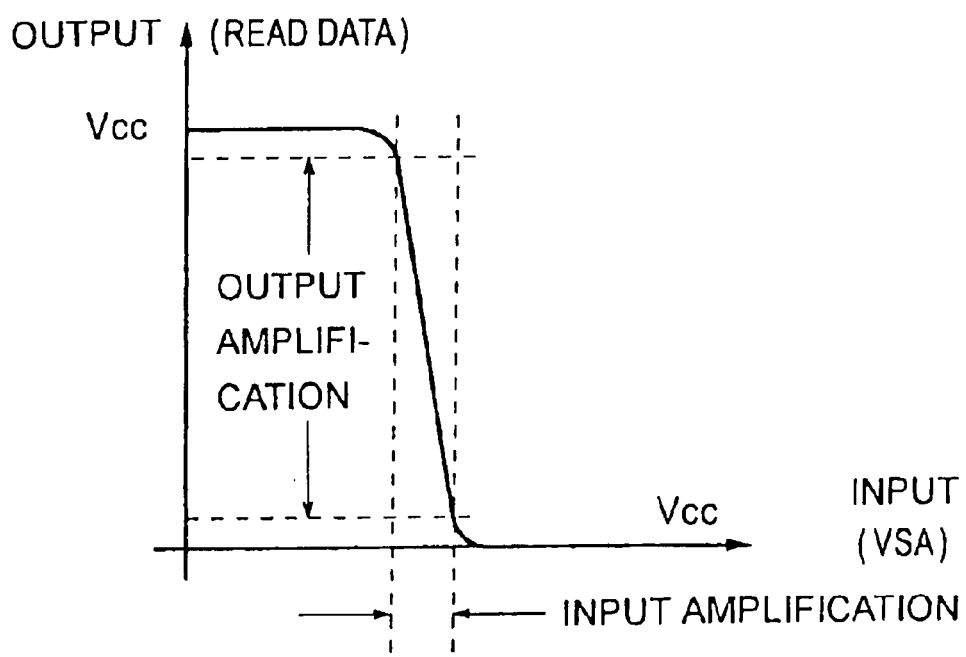
FIG. 20B is a view of characteristics of input/output of an inverter for amplifying bit line signal change.

FIG. 20B is a view showing characteristics of input and output of an inverter for amplifying bit line signal changes.

In FIG. 20A, the inverter IN4 comprising the transistors P7 and N11 monitors bit line potential at the time of reading data and when the bit line potential rises more than needed, shifts to the direction of turning on the transistor N11 to discharge the bit lines. Also, the inverter IN4 shifts the transistor N13 (FIG. 21A) for charging to the direction of turning off so as to suppress or stop the charging.

An input node of the inverter IN3 for amplification is indicated "NDSA" and the potential is indicated "VSA". The potential VSA can be expressed by the formula below by using a resistance value Rp between the source and drain in the saturated region of the transistor P8 and a current Icell of the memory cell.

$$VSA = V_{cc} - Icell \times Rp \tag{1}$$

When the cell current Icell flows as a result that electrons are not injected or not sufficiently injected to the memory cell, an output of the inverter IN4 rises to shift the transistor N12 in the turning on direction and the potential VSA of the node NDSA lowers. As a result, as shown in FIG. 20B, an output of the inverter IN3 for amplification rises to the power source voltage $V_{cc}$.

When electrons are sufficiently injected in the memory cell, a threshold of the memory cell is high and the cell current Icell does not flow, so that the potential VSA of the node NDSA is at a high level and does not change. Thus, an output of the inverter for amplification becomes the level of the power source voltage $V_{cc}$.

A signal of an amplitude of the power source voltage $V_{cc}$ in accordance with the writing state of the selected cells is output to the I/O bus outside from the inverter IN3 for amplification.

In the memory peripheral circuits, as shown in FIG. 16B, an offset is provided on the drain side and a transistor having a little higher pressure resistance (hereinafter, referred to as an intermediate withstand voltage transistor for convenience) than the normal power source voltage $V_{cc}$ transistor or the logical circuit transistor becomes necessary. It is because a voltage of 4 to 6V or so, which is higher than a voltage of 2.5 to 3.3V of the power source voltage $V_{cc}$ is generated by the booster circuit for use.

In the nonvolatile memory of the present embodiment, the hot electron injection caused by secondary ionization collision by which charge injection efficiency at the time of writing data is higher than in the case of the source CHE injection is used. Also, the first polarity voltage and the second polarity voltage, a potential difference of the two is equal to a voltage of 10V between gates and drains required at erasing, are generated by the word line drive circuit and the bit line drive circuit. As a result, it became possible to suppress the withstand voltage of the transistor in the memory peripheral circuits to 4 to 6V or so.

In the conventional nonvolatile memory, a transistor having high withstand voltage of between 10 and 20V for a so-called $V_{pp}$ type to 20V or more depending on cases, has been required. Formation of such a transistor has a low commonality in processes with those in the $V_{cc}$ type transistor or a logical circuit transistor, a scale of the booster circuit for generating it becomes large and the power consumption is large. In these points, the nonvolatile memory of the present invention is superior.

The withstand voltage of 4 to 6V or so is required even in general $V_{cc}$ type circuits. Namely, an I/O transistor used in an input/output (I/O) stage of the $V_{cc}$ type circuit and affected by a signal from the outside is, even if the normal use voltage is the power source voltage $V_{cc}$, normally designed to have high withstand voltage than other transistors by devising a pattern such as providing a little offset, etc. Alternately, process parameters, such as a gate insulation film thickness, etc. are changed with other high speed logic transistor in some cases. A burn-in voltage of the I/O transistor is 6V or so and its reliability specification often describes that it is not broken by an application for several seconds. Also, the withstand voltage of the I/O transistor is higher than the burn-in voltage.

In the present embodiment, while ignoring difference on a pattern, such as an existence of an offset, an amount of offset, etc., at least a process of the I/O transistor is made to be the same as that of the medium withstand voltage transistor having an offset of the memory peripheral circuits. Some of the I/O transistors have the same process as that of other logic transistors, and others have a little different process. However, in either cases, a process of forming memory peripheral circuits and a process of forming a logic unit are at least partially, preferably all in common.

This is enabled along with an adaptation of the above writing method. Namely, the above writing method enables a high speed writing of 10 μsec. Also, considering the number of practically required re-writing to a flash memory of $10^5$, an application time of the multiplication is 1 sec. (actually, about half of it or so in terms of probability due to a logic of program data), which is a more gentle use environment than conditions of burning in of the I/O transistor.

On the other hand, when a sufficient margin is desired at erasing, it can be dealt with by increasing an offset amount on the pattern. In that case, the process itself may be made in common with that of an I/O transistor and a normal logical circuit transistor. When a larger margin is desired, it is dealt by making at least the gate insulation film specification in common and making profiles of an impurity distribution on the drain side different.

Below, an example of producing a nonvolatile memory apparatus will be explained by using the drawings.

FIG. 21 is a cross-sectional view of a nonvolatile memory apparatus wherein a formation region of a memory cell array and a formation region of the memory peripheral circuit or the logical circuit block are shown.

In the illustrated configuration, formation regions of the memory cell array and memory peripheral circuits or the logical circuit block are all separated by the well-in-well (WIW) structure. Around the P-well W on which memory transistors are formed, an N-well NWa comprising a deep $N^+$ impurity region 10$a$ in the deep portion of the substrate and an N type impurity region 11 reaching to the substrate surface is formed. In the same way, on formation regions of the memory peripheral circuits or the logical circuit block, around the P-well 12 is formed an N-well NWb comprising a deep $N^+$ impurity region 10$b$ in the deep portion of the substrate and an N type impurity region 13 reaching to the substrate surface.

On the P-well 12 is formed for example a gate electrode 18 made of doped polycrystalline silicon via a gate insulation film 17 made of thermally oxidized silicon of several nm to tens of nm or so. On the N-well 13 is formed a gate electrode 19 made of doped polycrystalline silicon added with an impurity for example having a reverse conductive type via the same gate insulation film 17.

On the surface of the P-well 12 on both sides of the gate electrode 18 is formed an N-type source/drain impurity region 20. On the surface of the N-well 13 on both sides of the gate electrode 19, P-type source/drain impurity regions 21 are formed.

On both side surfaces of a stacked layer pattern of the both gate electrodes 18 and 19 and the gate insulation film 17, a side wall insulation layer 22 made of an oxidized silicon base insulation film is formed.

The gate electrodes 18 and 19 of the transistor is covered with an offset insulation layer provided in accordance with need and an interlayer insulation film formed on the whole surface. Also, a contact connecting to the source/drain impurity regions 20 and 21 is formed. A wiring layer is on the contact and formed by the same aluminum wiring layer as bit lines, etc. of memory transistors.

FIG. 22 to FIG. 26 are sectional views in the middle of production of a nonvolatile memory apparatus.

FIG. 27 is a list of photomasks used in production of the nonvolatile memory apparatus.

A semiconductor substrate SUB of a P-type silicon wafer, etc. is prepared and an element isolation insulating layer ISO is formed on the semiconductor substrate SUB in accordance with need for example by the trench isolation method. In formation of the element isolation insulating layer ISO, an etching mask layer is formed on the substrate, the substrate is etched by a predetermined depth by the anisotropic etching, and the trench is buried with an insulation substance. After the insulation substance between the trenches on the surface of the substrate is partially removed by etching using for example a resist as a mask, the CMP (Chemical Mechanical Polishing) is performed. An amount of polishing depends on an area of protruding portions on the insulation film at the time of the CMP, or dishing and other uneven polishing is liable to be caused at protruding portions having a large area, so the partial removal of the insulation substance is performed so as to remove a most part of the insulation film protruding between the trenches in advance leaving only edge portions of the protrusions before the CMP for correcting inconvenience due to area difference.

In the list shown in FIG. 27, the first mask "TER" is a photomask for forming a trench etching mask layer and a second mask "AIM" is for the partial removal of the buried insulation film.

As shown in FIG. 22, a resist pattern is formed by using a third mask "DNW" on the semiconductor substrate SUB. Ion implantation is performed by using the resist pattern as a mask, and the deep $N^+$ impurity regions 10$a$ and 10$b$ are formed in the deep portion of the substrate below the openings.

After removing the resist pattern, resist formation of different pattern and conditions and ion implantation are performed and a P-well is formed. A fourth mask "PWL" is used for patterning of the resist here. Thereby, a P-well 12 for a memory transistor and a P-well 12 for peripheral circuits and logical circuit are formed on different regions on the wafer at a time.

After removing the resist, as shown in FIG. 23, resist formation of different pattern and conditions and ion implantation are performed and a N-well is formed. A fifth mask "NWL" is used for patterning of the resist here. Thereby, an N-well NWa for a memory transistor is formed around the P-well W and an N-well NWb for peripheral circuits and logical circuit are formed on different regions on the wafer at a time.

After removing the resist, resist formation of different pattern and conditions and ion implantation are performed twice. Thereby, threshold voltages of the memory transistor and the select transistor are adjusted, respectively. A sixth mask "MVA" is used for adjusting the threshold voltage of the memory transistor and a seventh mask "SEL-VA" is used for adjusting the threshold voltage of the select transistors.

In the process shown in FIG. 24, a first dielectric film made of oxidized silicon is formed by the thermal oxidization method, and a nitride film (main charge storage film CHS) is deposited thereon by the LP-CVD method, etc. By a method of performing thermal oxidization on the main charge storage film CHS, etc. a second dielectric film TOP is formed on the main charge storage film CHS.

On the formed second dielectric film TOP is formed a resist having a pattern of covering the memory transistor region by using an eighth mask "GTET (ONO-ET)". By using the resist as a mask, the ONO film on the peripheral circuits and logical circuit side is removed by etching.

Figure 25:
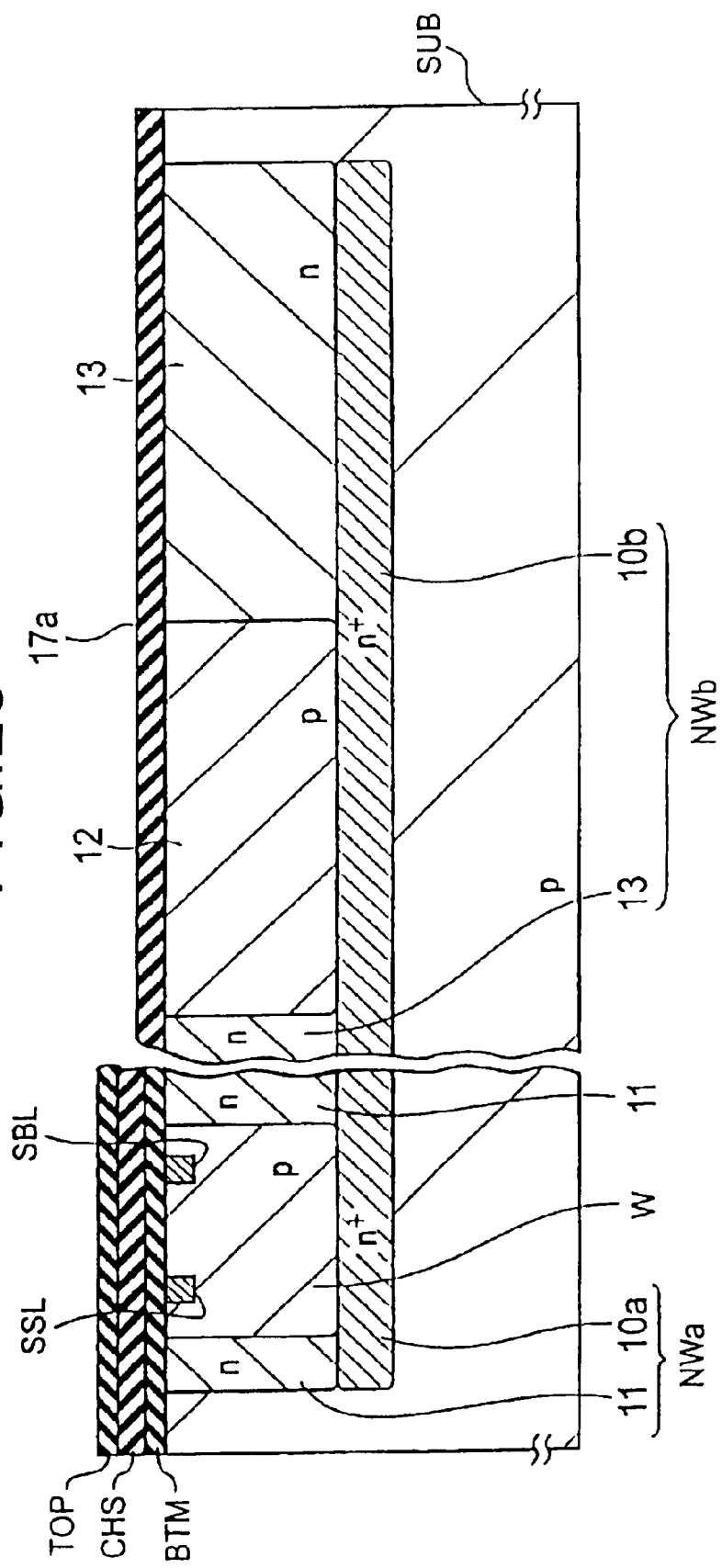
FIG. 25 is a cross-sectional view after forming a sub source line and sub bit line continued from FIG. 24.

After removing the resist, as shown in FIG. 25, the surface of the exposed substrate and the well W are subjected to thermal oxidization by several nm to tens of nm or so to form a gate insulation film 17a in common with the peripheral circuits and logical circuit.

On the active region of the P-well sandwiched by the element isolation insulating layer SIO of the memory transistor, a resist patterned by using a ninth mask "BN" is formed and ion implantation is performed. As a result, sub bit lines SBL and sub source lines SSL comprising an N+ impurity region, for example, in long stripes in parallel longitudinal to the bit direction are formed.

By forming a resist patterned by using a tenth mask "BN2 (N+II)" and ion implantation, an additional injection of impurity is further performed on a part of the sub bit lines SBL and sub source lines SSL, for example, a half the length on the side the bit contact is formed. Due to this, even in the case where the number of memory transistors connected in parallel between the select transistors is large as 128, a change of transistor characteristics due to wiring resistance of an impurity region is suppressed.

After removing the resist, in a process corresponding to FIG. 26, a gate conductive film made of doped polycrystalline silicon is formed on the whole surface. On the gate conductive film is formed a resist patterned by using an eleventh mask "IPS", anisotropic etching is performed and the word lines WL and gate electrodes 18 and 19 are formed.

After removing the resist, a resist opening only on the memory transistor region is formed by using a twelfth mask "Ch-stp". By using the resist as a mask, ion implantation of P-type impurity is performed shallowly. At this time, the word line WL and element isolation insulating layer ISO become a self aligning mask, and a P type impurity region for channel stop is formed on the P-well surface between the word lines WL.

After removing the resist, a resist opening around the gate electrodes on the NMOS side of the peripheral circuits and logical circuit is formed by using a thirteenth mask "HV-NLD" and ion implantation is performed. Due to this, as shown in FIG. 21, N+ type source/drain impurity regions 20 for NMOS transistors of the memory peripheral circuit and logical circuit are formed.

In the same way, P+ type source/drain impurity regions 21 on the PMOS side are formed by using a fourteenth mask "HV-PLD".

Furthermore, highly concentrated source/drain impurity regions are formed on the NMOS side and PMOS side of the peripheral circuits and logical circuit by using a fifteenth mask "NSD" and a sixteenth mask "PSD", respectively. Among them, at the time of introducing highly concentrated N type impurity, an impurity is additionally injected for reducing contact resistance to a part, and a contact of the memory transistor is formed.

After that, formation of a bit contact and source contact at a time by using a seventeenth mask "1AC", formation of main bit lines MBL, main source lines MSL and other wiring by using an eighteenth mask "1AI", film formation of an overcoat film, formation of opening of an electrode pad by using a nineteenth mask "PAD" are performed to complete the nonvolatile memory apparatus.

Figure 28:
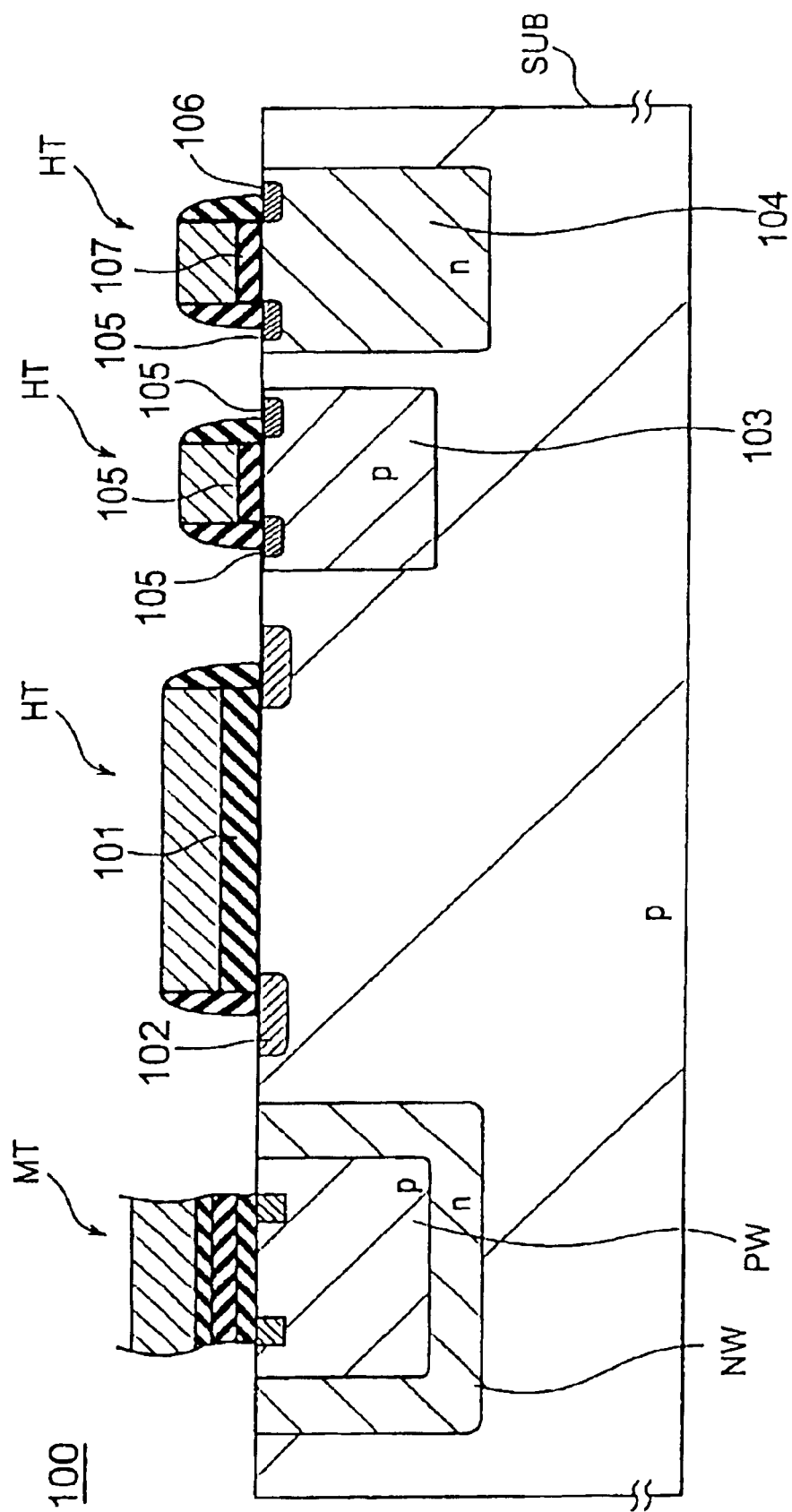
FIG. 28 is a cross-sectional view of the configuration of a nonvolatile semiconductor memory apparatus produced by a conventional production method as a comparative example in the first embodiment.

FIG. 28 is a sectional view of the configuration of a logical circuit embedded type nonvolatile memory apparatus produced by a conventional method as a comparative example.

In a nonvolatile memory apparatus 100, a memory transistor MT has the well-in-well structure and is basically the same as that in the present embodiment, but requires a high withstand voltage transistor HT for applying a writing voltage $V_{pp}$ or erasing voltage $V_{pp}'$ to the word lines in a full range.

The high withstand voltage transistor HT shown in FIG. 28 requires a film thickness of a gate insulation film 101 being 20 nm or more, and those having a gate length over 1 μm are used. Since withstand voltage of a junction has to be made high, the source/drain impurity region 102 has to be formed by a concentration gradient having a gentle inclination and to deep in the substrate. Accordingly, a heating condition to form a deep impurity region largely differs from that in forming other impurity regions and it is extremely difficult to simultaneously form with source/drain impurity region of other transistors.

Low withstand voltage and high speed transistors for a logical circuit are formed on a well 103 or 104 having respectively optimized concentration together with the NMOS transistor NLT and PMOS transistor PLT. Source/drain impurity regions 105 and 106 are made to have a high concentration and thin layer to the limit. A thickness of the gate insulation film is scaled to 3 to 8 nm and a gate length to 0.25 μm or so.

In the nonvolatile memory apparatus according to the present embodiment, a writing method having high charge injection efficiency is adopted and a voltage application to the word lines and drains at erasing is performed by using the respectively generated first polarity voltage and second polarity voltage having an opposite polarity from each other. Therefore, a $V_{pp}$ system high withstand voltage transistor becomes unnecessary so a thickness of the gate insulation film and the gate length can be scaled by that amount.

According to the nonvolatile memory apparatus of the present embodiment, a production process can be widely simplified comparing with the conventional cases.

On the right end column of the mask list shown in FIG. 27, exclusive masks required by the conventional production method are additionally noted.

As the fourth and fifth masks, "LV-PWL" for forming the P-well 103 and "LV-NWL" for forming the N-well 104 are necessary. At this time, formation of a resist pattern and ion implantation are also required twice.

After forming a gate insulation film 101 of the high withstand voltage transistor HT, the eleventh mask "2GTET (HV-OX-ET)" is necessary for removing it on the logical circuit block side. At this time, formation of the resist pattern and anisotropic etching have to be added once more.

To heighten the efficiency of the transistors for a logical circuit, the gate electrodes have to be divided to N type on the NMOS side and P type on the PMOS side. Therefore, as the fifteenth and sixteenth masks, "NGT" and "PGT" for protecting one side thereof in turn are necessary. At this time, formation for the resist pattern and ion implantation are added.

It is necessary that the exclusive source/drain impurity regions 105 and 106 have to be formed separately. Therefore, as the twentieth and twenty-first masks, "LV-NLD" and "LV-PLD" are necessary. At this time formation of the resist pattern and ion implantation are added.

From the above, in a method of producing the nonvolatile memory apparatus according to the present embodiment, by simultaneously forming memory transistors for memory peripheral circuits and logical circuits, there are advantages that the production process can be simplified and yields can be improved because of more common production processes. In the above example, seven masks, seven processes of forming resist patterns, six processes of ion implantation and one process of anisotropic etching become unnecessary.

As a result of calculating the actual costs, it was confirmed that a reduction by 25% or so in the chip cost can be attained comparing with NMOS type semiconductor memory apparatus produced by the conventional production method.

FIG. 27 is a list of processes when adopting a $V_{pp}/2$ type transistor wherein the withstand voltage is 10V or so and the margin is wide enough. As explained above, an I/O transistor of a logical circuit having the withstand voltage of 6V or so may be adopted. In this case, in the list shown in FIG. 27, the thirteenth mask and fourteenth mask relating to optimization of impurity concentration become unnecessary, and processes of forming the resist pattern and ion implantation are reduced, as a result, a further cost reduction can be attained.

In a memory cell array formed by the above production method, current-voltage characteristics of the memory transistor in a writing state and erasing state were examined.

As the result, an off leakage current value from a not selected cell at a drain voltage of 1.0V was small as about 1 nA when biasing the not selected word line to 0.3V or so at reading. Since the reading current in this case is 1 $\mu$A or more, erroneous reading of the not selected cell does not occur. Accordingly, it was found that a margin of punch-through resistant voltage at reading in the MONOS type memory transistor having a gate length of 100 nm was sufficiently secured.

Also, read disturbance characteristics at a gate voltage of 2.5V were also evaluated and it was found that reading was possible even after $3 \times 10^8$ sec or more.

The memory transistor was examined on data re-writing and data retention characteristics.

As the result, it was found that a sufficient threshold voltage difference was maintained up to one million times of rewriting. Also, the data retention characteristics satisfied 85° C. for 10 years after re-writing of $1 \times 10^5$ cycle times.

From various considerations, to suppress the punch-through at drain voltage of 2.5 to 3.3V when writing, it was also found that the channel impurity concentration has to be made $5 \times 10^{17}$ cm$^{-3}$ or more.

From the above, it was found that sufficient characteristics as the MONOS type nonvolatile memory transistor were obtained even if the gate length was shorter than 130 nm.

In the above embodiment, when a pinch-off point exists in the middle of a part of the channel forming region at the lower portion of the injected charges holding region, forward reading is more effectively performed, so it is preferable.

To obtain it, preferably, for example a voltage value to be applied and an application time at writing are adjusted, and hot electrons are injected to the charge storage film GD to at least 20 nm or more on the channel center side from the boundary of the N type impurity region (sub bit lines SBL) on the drain side and the high concentration channel region HR. It is preferable that a neutral threshold voltage in this case, that is a threshold voltage of a lower portion of a region wherein injected charges depending only on channel dope do not exist, is set to 1.5V or less at an average value in advance.

By doing so, pinching-off does not occur in the whole channel forming region at the lower portion of the injected charges holding region and the neutral threshold voltage is sufficiently low, so that a threshold voltage change caused by charge injection can be easily detected by the forward reading.

To reduce an off leakage current from the not selected cells, as shown in FIG. 13 and FIG. 14, the not selected word lines are preferably a little biased by a negative voltage at reading. Alternately, source lines may be biased a little in the positive direction. For example, 0V may be applied to the not selected word line, while a voltage of preferably more than 0V and 0.5V or less, for example, 0.3V may be applied to all source lines.

Writing may be performed by hot hole injection caused by band to band tunneling current and erasing may be performed by the CHE injection or hot electron injection by secondary ionization collision.

A system LSI on an object of realizing one system or a sub system itself by one LSI is installed a nonvolatile memory in many cases. The nonvolatile memory to be used in a system LSI is required to have common process with the CMOS process and a variety of high qualities based on a high speed.

The nonvolatile memory apparatus of the present embodiment realizes a high speed operation while omitting peculiar gate structures required for the FG type floating gate and the MONOS type of a source side injection method. Accordingly, there are advantages that there are less number of processes and photomasks, moreover, there are much in common with the CMOS process and a high total quality as a nonvolatile memory for a incorporated use for example in a system LSI is obtained.

Second Embodiment

Figure 29:
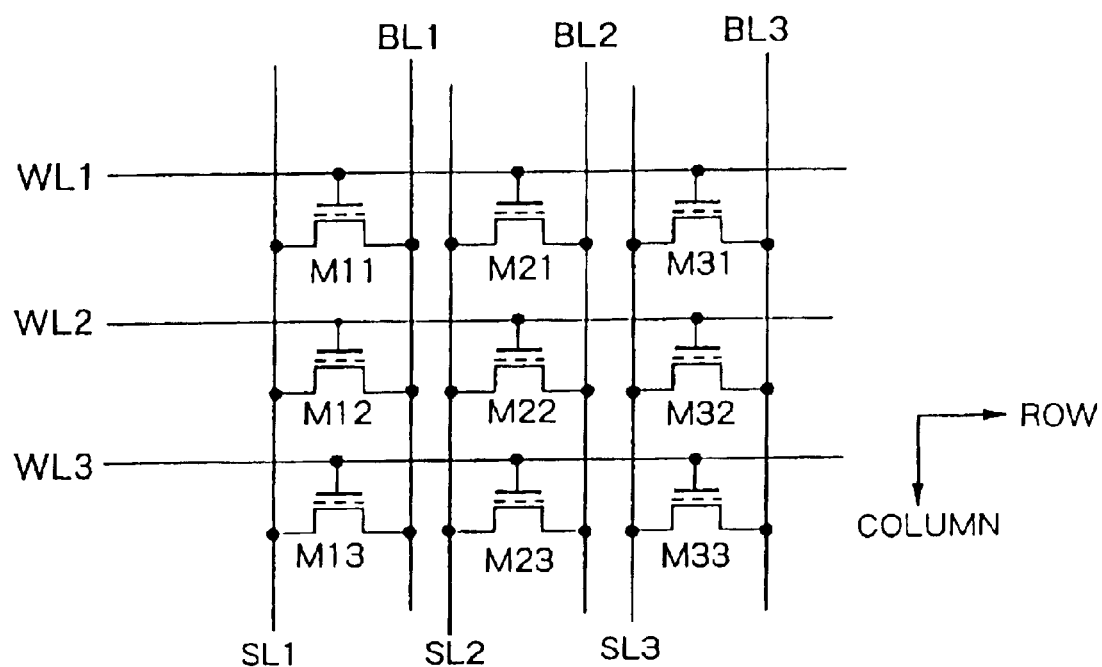
FIG. 29 is an equivalent circuit diagram of a memory cell array in a second embodiment of the present invention.

FIG. 29 is an equivalent circuit diagram of a nonvolatile semiconductor memory of a divided source NOR type according to a second embodiment.

Transistors M11 to M33 composing a memory cell are arranged in rows and between them are wired by word lines, bit lines and separation type source lines.

Drains of the memory transistors M11, M12 and M13 adjoining in the column direction are connected to a bit line BL1, and sources are connected to a source line SL1. Drains of the memory transistors M21, M22 and M23 adjoining in the column direction are connected to a bit line BL2, and sources are connected to a source line SL2. Drains of the memory transistors M31, M32 and M33 adjoining in the column direction are connected to a bit line BL3, and sources are connected to a source line SL3.

Gates of the memory transistors M11, M21 and M31 adjoining in the row direction are connected to a word line WL1. Gates of the memory transistors M12, M22 and M32 adjoining in the row direction are connected to a word line WL2. Gates of the memory transistors M13, M23 and M33 adjoining in the row direction are connected to a word line WL3.

In the whole memory cell array, the cell arrangement and connection between the cells illustrated in FIG. 29 are repeated.

Figure 30:
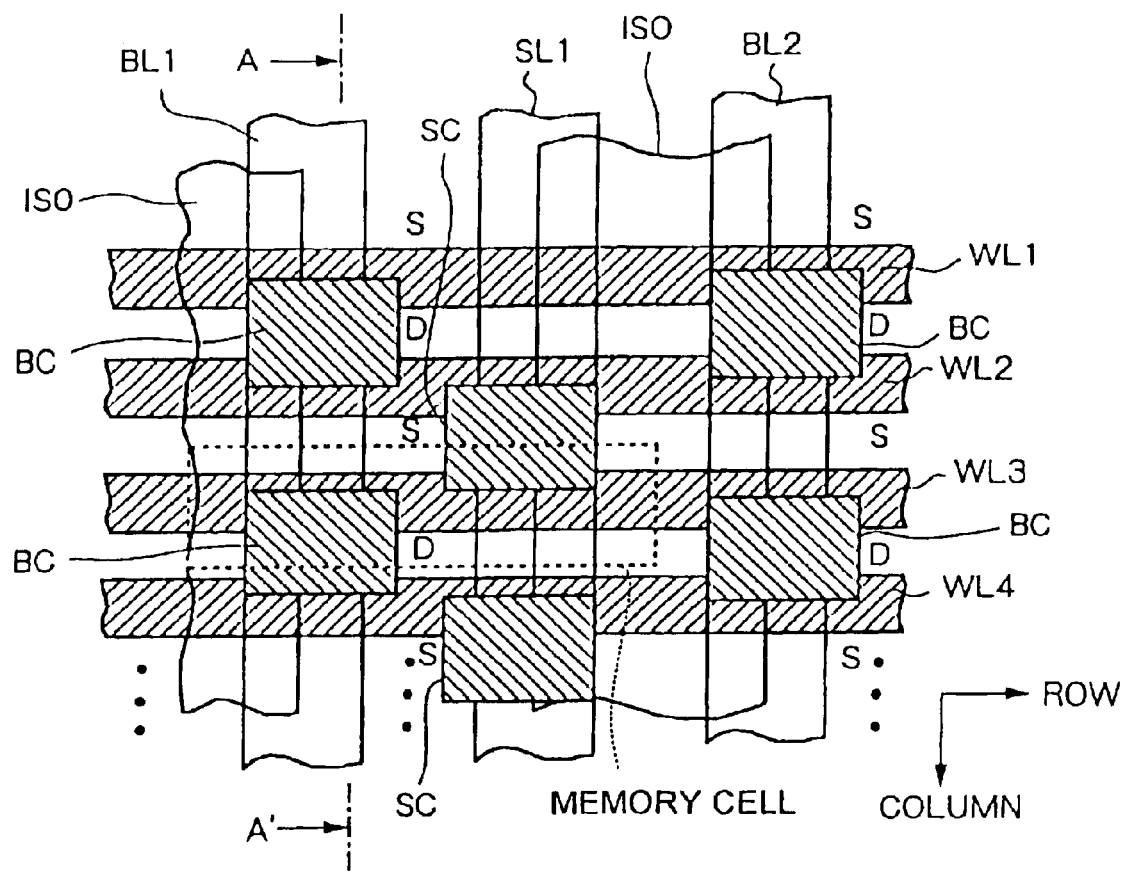
FIG. 30 is a plan view of a memory cell array.
Figure 31:
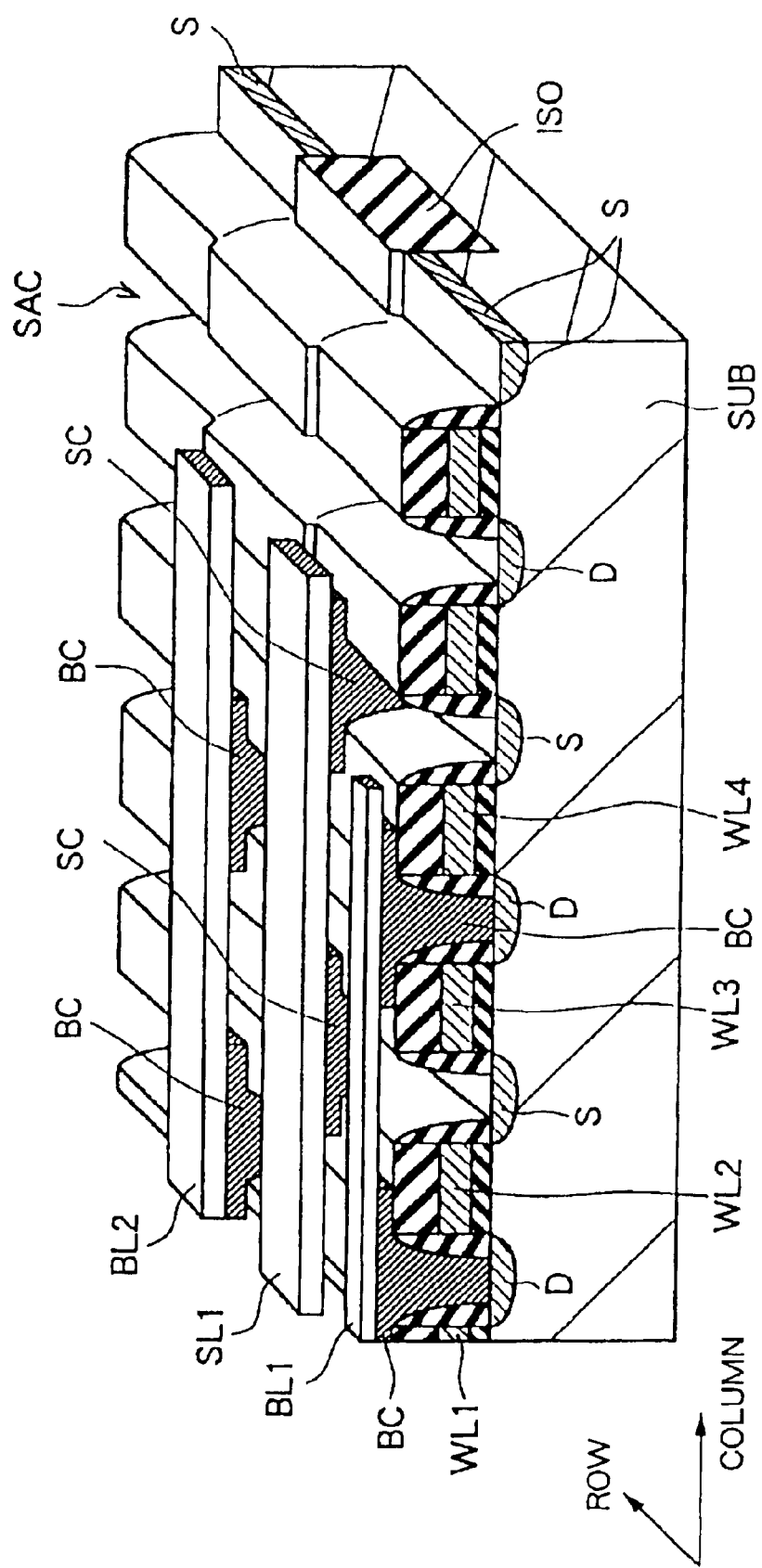
FIG. 31 is a bird's-eye view of a memory cell array seen from a cross-section in the column direction.
Figure 32:
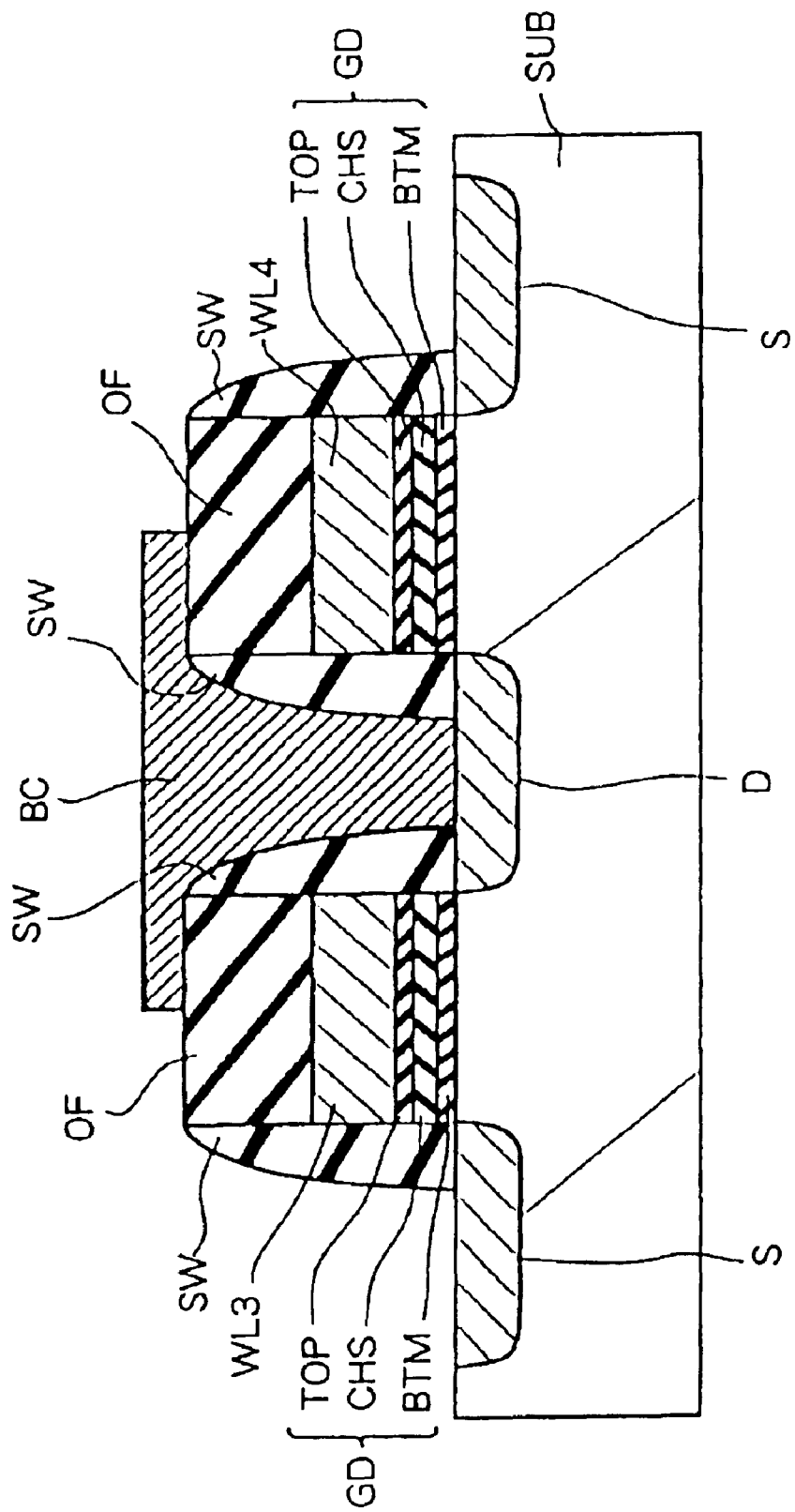
FIG. 32 is a partially enlarged view of a cross-section in FIG. 31.

FIG. 30 is a schematic plan view of a fine NOR type cell array using a self aligning technique in the second embodiment. FIG. 31 is a perspective view seen from a section side along the line A–A' in FIG. 30. FIG. 32 is a partially enlarged view of a section of FIG. 31.

In the fine NOR type cell array, as shown in FIG. 31, an element isolation insulating layer ISO comprising trenches or LOCOS, etc. is formed on a surface region of a P-type semiconductor substrate SUB or a P-well. The element isolation insulating layer ISO has a long parallel line shape in the column direction as shown in FIG. 30. The word lines WL1, WL2, WL3, WL4, ... are formed at constant intervals, and each word line crosses substantially perpendicular to the element isolation insulating layer ISO.

Between the word line and the semiconductor substrate SUB, three-layer stacked film (charge storage film) composed of a first dielectric film, a main charge storage film, a second dielectric film is formed in the same way as in the first embodiment. A width of the gate line (gate length) is made as fine as 0.18 μm or less, for example, 0.13 μm.

A first source/drain region (hereinafter, referred to as a source region) S and a second source/drain region (hereinafter, referred to as a drain region) D are alternately formed by being introduced an N type impurity at high concentration in the surface region of the semiconductor SUB positioned in the intervals of the element isolation insulating layer ISO. A size of the source region S and the drain region D in the row direction is regulated by the intervals of the element isolation insulating layer ISO. A size of the source region S and the drain region D in the column direction is regulated by the intervals of the word lines WL1 to WL4. The source region S and the drain region D are extremely uniformly formed because almost no error of mask alignment with respect to the size and arrangement is introduced.

In FIG. 32, an upper portion and side walls of the word lines WL1 to WL4 are covered with an insulation layer. An offset insulation layer OF is formed on the upper portion of the word lines WL1, WL2, ... in the same pattern.

On both side walls of a stacked layer pattern composed of an offset insulation layer OF, a gate electrode thereunder (word line WL3 or WL4), and a charge storage film GD, a side wall insulation layer SW is formed.

In FIG. 31, a long thin self aligned contact portion SAC is opened along the word line between adjoining two word lines. In the self aligned contact portion SAC, the word lines are covered with the offset insulation layer OF and the side wall insulation layer SW.

A conductive material is alternately buried in the self aligned contact portion SAC so as to superimpose with the source regions S and the drain regions D, and thereby, bit contact plagues BC and source contact plagues SC are formed. The bit contact plagues BC superimpose with one end portion in the row direction on the drain region. The source contact plagues SC superimpose with the other end portion in the row direction on the source regions S. As a result, the bit contact plague BC and the source contact plague SC are alternately formed as shown in FIG. 30. This is because the bit contact plagues BC are connected to bit lines and the source contact plagues SC are connected to source lines.

The bit contact plagues BC and source contact plagues SC are formed by depositing a conductive material so as to bury the whole SAC region and forming a resist as an etching mask on the conductive material. At this time, the resist is made one size larger than the width of the self aligned contact portion, and a part of the resist superimposes with the element isolation insulating layer. The conductive material around the resist is removed by etching by using the resist as a mask. Thus, the bit contact plagues BC and source contact plagues SC are formed at a time.

A concave portion around the contact is buried with a not shown insulation film. On the insulation film, the bit lines BL1, BL2, ... contacting the bit contact plagues BC and the source line SL contacting the source contact plagues SC are alternately formed. The bit lines and the source lines have a long parallel line shape in the column direction.

In the fine NOR type cell array, contact formation to the bit lines and source lines is attained by forming the SAC and the plagues BC and SC. By forming the self aligned contact portion SAC, dielectric isolation with the word lines is attained. At the time of forming the self aligned contact portion SAC, exposed surface of the source region S or drain region D is uniformly formed. The BC and the SC are formed on the exposed surface of the source region S or the drain region D in the self aligned contact portion SAC. A size of a contact surface of the respective plagues with the substrate in the column direction is determined at the time of forming the self aligned contact portion SAC and the contact area has small unevenness.

Dielectric isolation of the bit contact plagues BC or the SC and the word lines is easy. A side wall insulation layer SW is formed only by forming an offset insulation layer OF at a time when forming the word lines, then insulation film is formed and overall etching (etch back) is performed. The bit contact plagues BC, the SC, bit lines and source lines are formed by patterning a conductive layer on the same hierarchy, respectively. Therefore, the wiring structure is extremely simple, the number of processes is less, and the structure is advantageous to suppress the production costs low.

The configuration and the forming method of the charge storage film GD are the same as in the first embodiment, so the explanation will be omitted.

The configuration of a memory peripheral circuits shown in FIG. 1 is the same as that in the first embodiment. Also, in writing, erasing and reading of data, the same method in the first embodiment can be applied. Writing is performed by the hot electron injection using ionization collision and erasing is performed by injecting hot holes caused by a band to band tunneling current. In reading data, either of the reverse reading method and forward reading method can be performed. Also, to furthermore improve the efficiency of the hot electron injection, a P type high concentration channel region may be formed in the same way as in the first embodiment.

In the second embodiment, the FN injection can be used for writing and erasing data. For example, writing of data may be performed by using the modified FN injection of electrons and erasing may be performed by using the direct tunnel injection of holes. Note that in the same way as in the first embodiment, a first polarity voltage and a second polarity voltage are generated as voltages necessary to writing data and applied, respectively. Also, in the same way as in the first embodiment, a first polarity voltage and a second polarity voltage are generated as voltages necessary to erasing data and applied, respectively. As a circuit for generating the first polarity voltage and the second polarity voltage for writing and the first polarity voltage and the second polarity voltage for erasing, a similar circuit to that in the first embodiment can be used.

Third Embodiment

Figure 33:
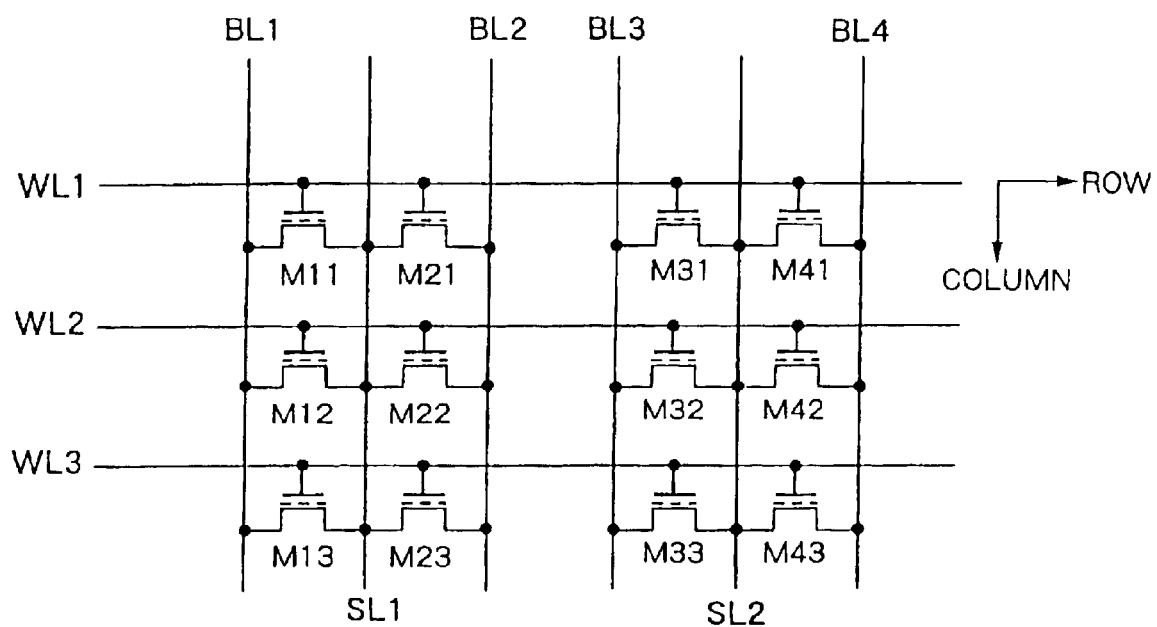
FIG. 33 is an equivalent circuit diagram of a memory cell array in a third embodiment of the present invention.

FIG. 33 is an equivalent circuit diagram of a memory cell array wherein source lines are shared by adjoining two memory transistor columns.

The memory transistors M11, M12, M13, . . . on the first column using the bit line BL1 in common and the memory transistors M21, M22, M23, . . . on the second column using the bit line BL2 in common use the source line SL1 in common. In the same way, the memory transistors M31, M32, M33, . . . on the third column using the bit line BL3 in common and the memory transistors M41, M42, M43, . . . on the fourth column using the bit line BL4 in common use the source line SL2 in common. Electric interference is prevented by element isolation by an insulation film, etc. between the bit lines BL2 and BL3 and between the bit lines BL4 and adjoining bit line BL5 (not shown). When an operation of parasitic transistor does not arise between adjoining cells due to the configuration, the element isolation is unnecessary.

The configuration and formation method of the memory transistor including the configuration of the charge storage film GD is the same as in the first embodiment. The configuration of the memory peripheral circuit is the same as that in the first embodiment shown in FIG. 1. Also, the same methods as in the first embodiment can be applied to writing, erasing and reading of data. Writing is performed by the hot electron injection using ionization collision, and erasing is performed by injecting hot holes caused by a band to band tunneling current. Charge injection by the FN tunneling explained in the second embodiment may be performed. In the memory cell array illustrated in FIG. 33, at the time of writing or erasing data, memory cells on the same row can be written in parallel in accordance with whether or not to set a predetermined drain voltage to the bit line, thus, collective writing in unit of a page is possible.

At the time of writing and erasing data, in the same way as in the first embodiment, a first polarity voltage and a second polarity voltage are separately generated as voltages necessary for writing data and applied, respectively. Also, a first polarity voltage and a second polarity voltage are separately generated as voltages necessary for erasing data and applied, respectively in the same way as in the first embodiment. As a circuit for generating the first polarity voltage and the second polarity voltage for writing and the first polarity voltage and the second polarity voltage for erasing, a similar circuit to that in the first embodiment can be used.

When reading data, either of the reverse reading method and forward reading method can be performed. Also, to furthermore improve the efficiency of the CHE injection, a P type high concentration channel region may be formed in the same way as in the first embodiment.

Fourth Embodiment

Figure 34:
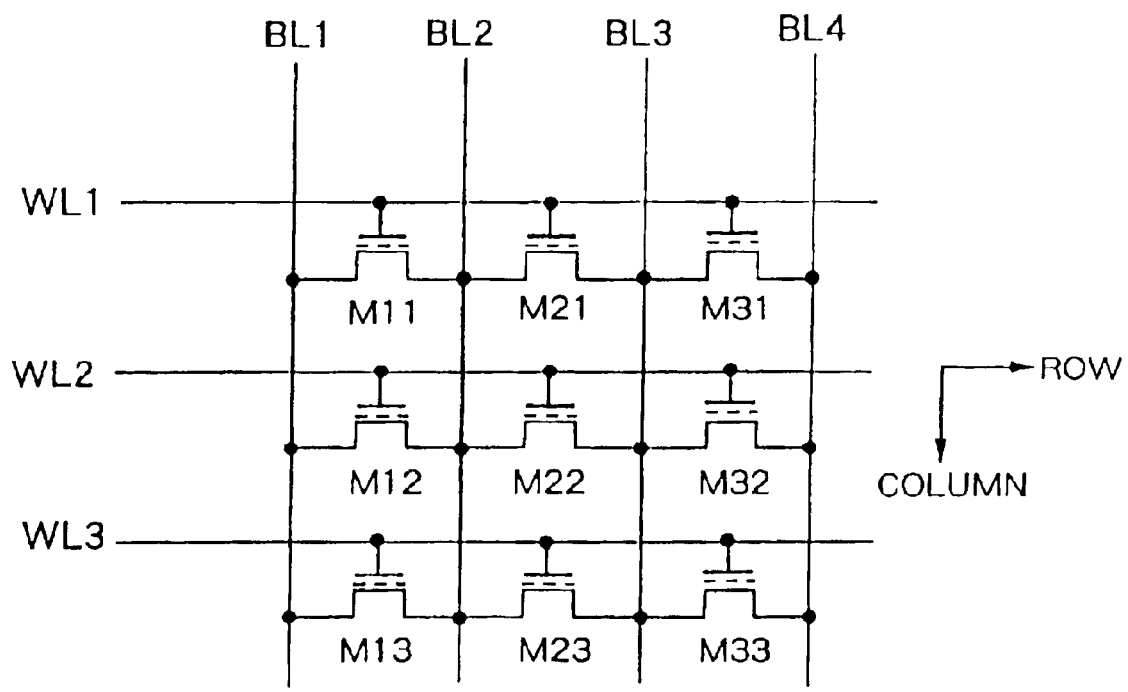
FIG. 34 is an equivalent circuit diagram of a memory cell array in a fourth embodiment of the present invention.

FIG. 34 is an equivalent circuit diagram of a VG type memory cell array wherein source lines are omitted and bit lines are shared by adjoining memory transistor columns.

The bit line BL2 is shared by the memory transistors M1, M12, M13, . . . on the first row and the memory transistors M21, M22, M23, . . . on the second row. The bit line BL3 is shared by the memory transistors M21, M22, M23, . . . on the second row and the memory transistors M31, M32, M33, . . . on the third row. The bit lines BL1, BL2, BL3, BL4, . . . are formed by impurity regions.

The configuration and formation method of the memory transistor including the configuration of the charge storage film GD is the same as in the first embodiment. The configuration of the memory peripheral circuit is the same as that in the first embodiment shown in FIG. 1. Also, the same methods as in the first embodiment can be applied to writing, erasing and reading of data. Writing is performed by the CHE injection using ionization collision, and erasing is performed by injecting hot holes caused by a band to band tunneling current. Charge injection by the FN tunneling explained in the second embodiment may be performed. In the memory cell array illustrated in FIG. 34, collective writing in unit of a page cannot be performed and writing by bit is normally performed. A connection method between cells in the memory cell array shown in FIG. 34 is advantageous comparing with other methods in points that an occupied area per bit is small and the production method is simple.

At the time of writing and erasing data, in the same way as in the first embodiment, a first polarity voltage and a second polarity voltage are separately generated as voltages necessary for writing data and applied, respectively. Also, a first polarity voltage and a second polarity voltage are separately generated as voltages necessary for erasing data and applied, respectively. As a circuit for generating the first polarity voltage and the second polarity voltage for writing and the first polarity voltage and the second polarity voltage for erasing, a similar circuit to that in the first embodiment can be used.

When reading data, either of the reverse reading method and forward reading method can be performed. Also, to furthermore improve the efficiency of the CHE injection, a P type high concentration channel region may be formed in the same way as in the first embodiment.

Fifth Embodiment

Figure 35:
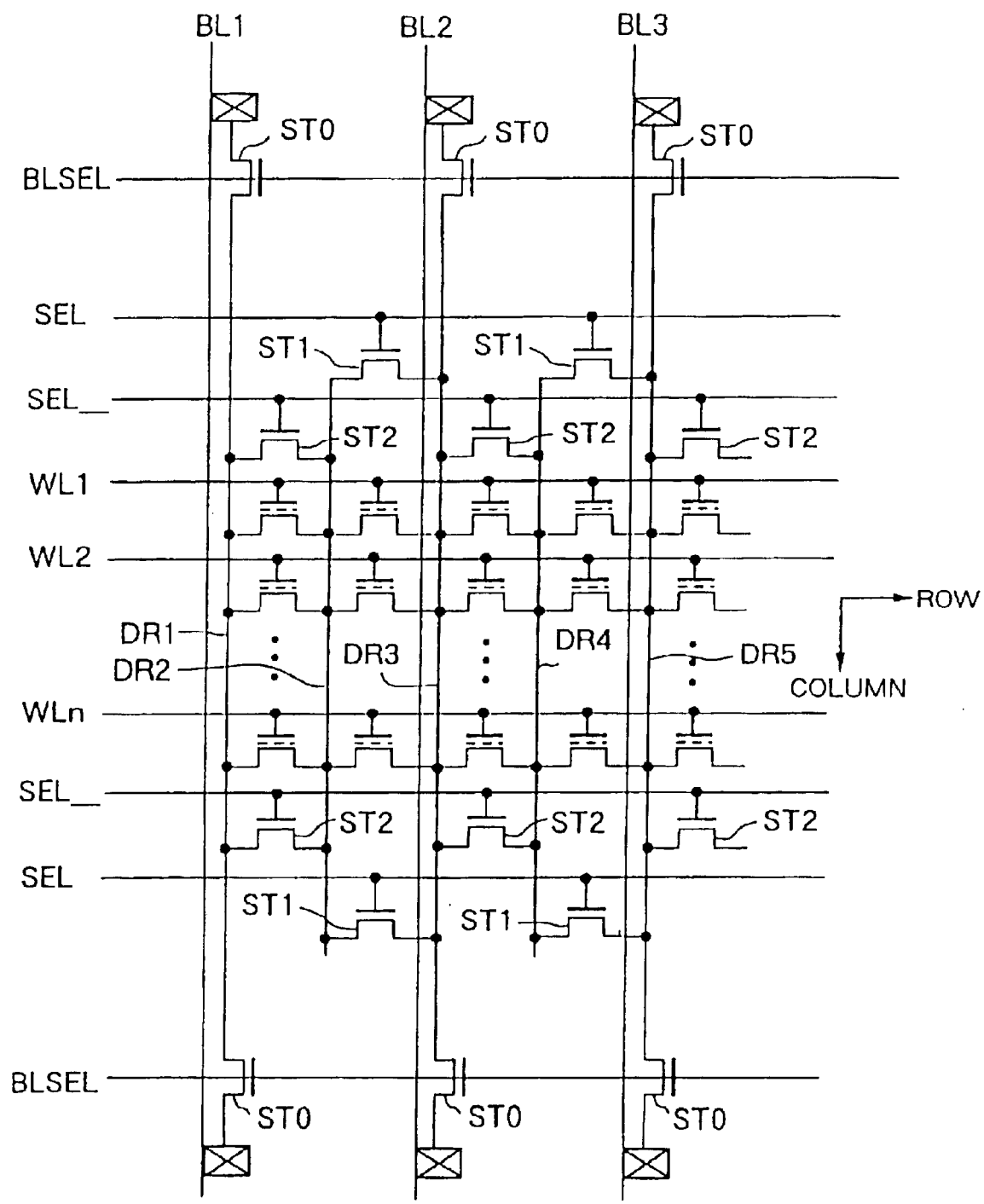
FIG. 35 is an equivalent circuit diagram of a memory cell array in a fifth embodiment of the present invention.

FIG. 35 is an equivalent circuit of an AMG (Alternate Metal virtual Ground) type memory cell array.

In the memory cell array shown in FIG. 35, n X m number of memory transistors composing the respective memory cell are arranged in a matrix. Gates of the memory transistors lined up in the row direction are connected to any one of the word lines WL1, WL2, . . . , WLn.

The impurity diffusion layers DR1, DR2, . . . , DR5, . . . are formed longitudinally in the column direction and repeated at constant intervals in the row direction. The impurity diffusion layers DR1, DR2, . . . , DR5, . . . serve as source/drain regions in the same way as in the VG type memory cell array shown in FIG. 34, and shared by adjoining two memory transistor columns.

The impurity diffusion layers of odd numbers DR1, DR3, DR5, . . . are connected to the bit lines BL1, BL2, BL3, . . .

arranged on the upper layer thereof via a select transistor ST0. The select transistor ST0 is controlled by a selection signal BLSEL of bit lines. The bit lines are made of a metal layer, for example an aluminum layer.

The impurity diffusion layers of even numbers DR2, DR4, . . . are formed at the almost center between bit lines, and configured so as to be able to selectively connect to either one of bit lines on the both sides. The impurity diffusion layers of even numbers DR2, DR4, . . . are connected to either one of the bit lines BL2, BL3, . . . via a select transistor ST1 controlled by a selection signal SEL. Also, the impurity diffusion layers of even numbers DR2, DR4, . . . are connected to the other bit lines BL1, BL2, . . . via a select transistor ST2 controlled by an inverse signal SEL_ of the selection signal.

A group of the n X m number of memory transistors and three kinds of select transistors ST0, ST1 and ST2 compose a basic unit (sub array). The sub array is repeatedly arranged and the whole memory cell array is configured.

The configuration and formation method of the memory transistor including the configuration of the charge storage film GD are the same as in the first embodiment. The configuration of the memory peripheral circuit is the same as that in the first embodiment shown in FIG. 1. Also, the same methods as in the first embodiment can be applied to writing, erasing and reading of data. Writing is performed by the hot electron injection using ionization collision, and erasing is performed by injecting hot holes caused by a band to band tunneling current. Charge injection by the FN tunneling explained in the second embodiment may be performed.

At the time of writing and erasing data, in the same way as in the first embodiment, a first polarity voltage and a second polarity voltage are separately generated as voltages necessary for writing data and applied, respectively. Also, a first polarity voltage and a second polarity voltage are separately generated as voltages necessary for erasing data and applied, respectively in the same way as in the first embodiment. As a circuit for generating the first polarity voltage and the second polarity voltage for writing and the first polarity voltage and the second polarity voltage for erasing, a similar circuit to that in the first embodiment can be used.

When reading data, either of the reverse reading method and forward reading method can be performed. Also, to furthermore improve the efficiency of the CHE injection, a P type high concentration channel region may be formed in the same way as in the first embodiment.

In the AMG type memory cell array, only every other memory cells can be selected from the prepared memory cell array due to the configuration. However, for example, by setting the number of cell columns of the sub arrays to be twice the number of necessary data bits, and switching operationable memory cell columns between odd columns and even columns, substantially all memory cells can be validly used for data storing.

Also, due to the configuration capable of switching the columns, an operation in units of a page is possible as different from normal VG type memory cell arrays.

Furthermore, since intervals of bit lines become loose, a wiring pitch of the bit lines is hard to be a limit of reducing an area of memory cell array even when the memory transistor is made minute.

Sixth Embodiment

The sixth embodiment relates to a method of writing two-bit data to one memory cell.

Figure 36:
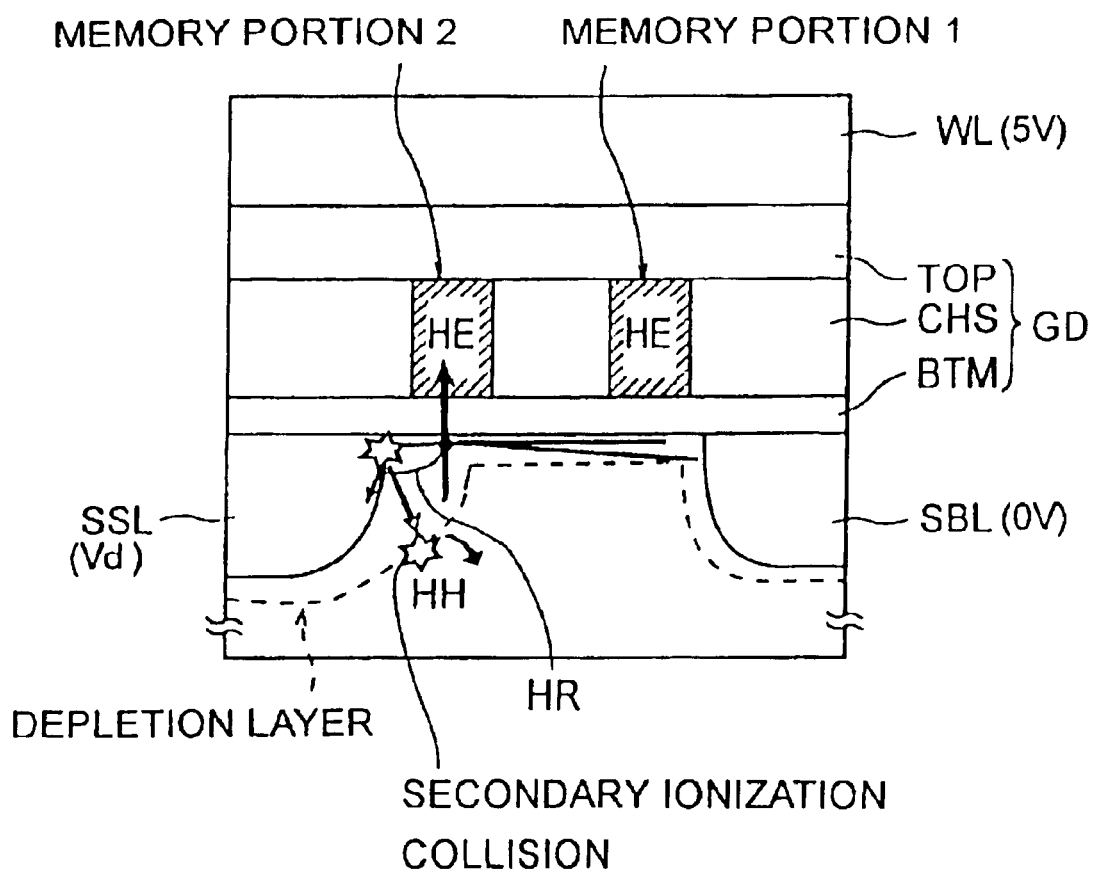
FIG. 36 is a view of a data writing operation in a sixth embodiment of the present invention along with bias conditions.

FIG. 36 is a view showing an operation of writing data in the sixth embodiment along with bias conditions.

In FIG. 36, a fist bit data is written to a memory portion I on the drain side by a writing method described in the first embodiment. In this state, second bit data is written to a memory portion 2 on the source (sub source lines SSL) side. The writing is attained by switching voltages of sources and drains in the writing method described in the first embodiment. Other bias conditions are the same as those in the first embodiment.

Figure 37:
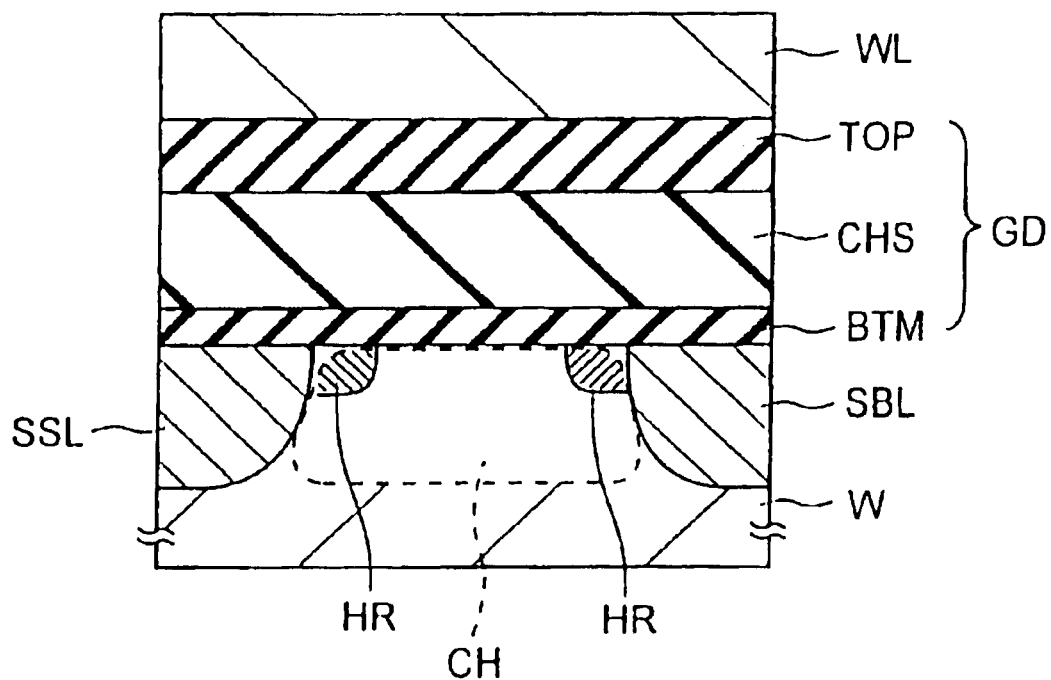
FIG. 37 is an enlarged cross-sectional view in the channel direction of a memory transistor.

In charge injection to the source side as such, preferably a high concentration channel region HR is provided in advance on the source side like on the drain side to improve the efficiency. FIG. 37 is an enlarged cross-sectional view of the memory transistor in the channel direction.

To perform two-bit writing, the configuration of the source line drive circuit SLD and the bit line drive circuit BLD in FIG. 1 are both changed to be able to apply both the drain voltage Vd and the ground potential GND. Then, they are controlled so that when the source line drive circuit SLD applies the drain voltage Vd, the bit line drive circuit BLD applies the ground potential GND, inversely, when the source line drive circuit SLD applies the ground potential GND, the bit line drive circuit BLD applies the drain voltage Vd.

In the present embodiment, there is an advantage that the bit costs can be reduced. Note that the storing of two-bit data can be applied to the first, second, fourth and fifth embodiments. As a method of erasing data, either of the method described in the first embodiment and a method described in the next seventh embodiment may be adopted. The method described in the first embodiment may be applied as the data reading method.

Seventh Embodiment

The seventh embodiment relates to an erasing method suitable to the case where a region injected with hot electrons (memory region) is relatively larger than a size of the transistor or the case of collective erasing of two-bit memory data.

In a writing mode wherein secondary ionization collision is adopted, when erasing is performed by the hot hole injection only form the drain side, there is a possibility that a threshold voltage in an erasing state gradually increases as the number of data re-writing increases in the data re-writing characteristics. Thus, in the present embodiment, by injecting hot holes not only from the drains but also from the source side, an increase of the threshold voltage in the data writing characteristics is suppressed.

Figure 38:
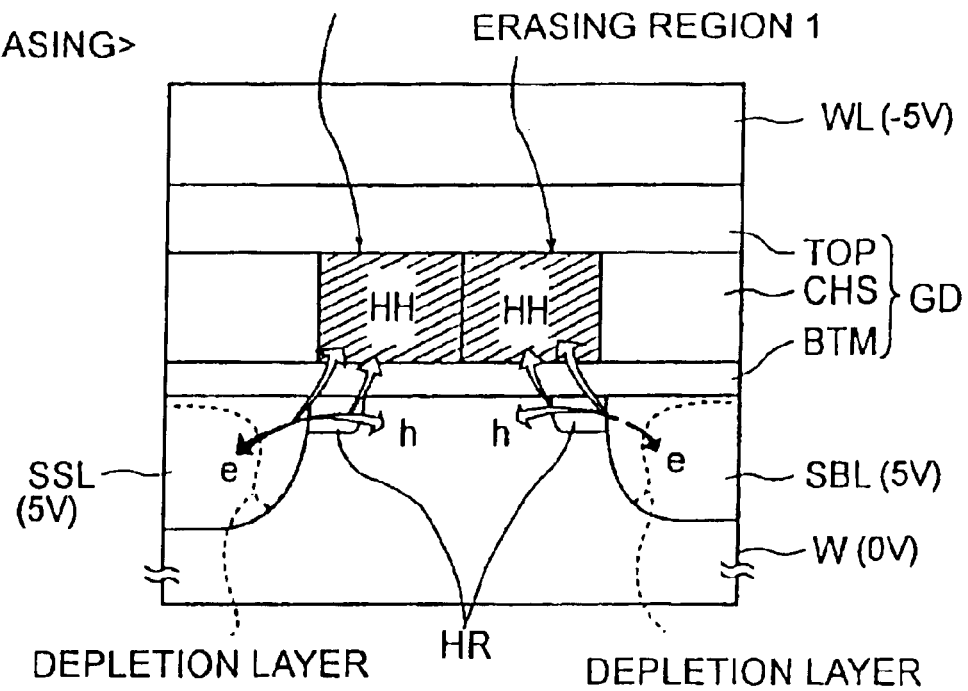
FIG. 38 is a view of a data erasing operation in a seventh embodiment of the present invention along with bias conditions.

FIG. 38 is a view of an operation of erasing data in the seventh embodiment along with bias conditions.

In this erasing method, 5V is applied not only to the sub bit lines SBL on the drain side but to the sub source lines SSL on the source side. As a result, hot holes HH generated by a band to band tunneling current are injected to the main charge storage film CHS from both the source side and the drain side and accumulated. Here, when assuming a hot hole injection region from the drain side is an erasing region 1 and a hot hole injection region from the source side is an erasing region 2, it is preferable that at least a part of the erasing region 1 and the erasing region 2 are united in the channel direction. The unity of the erasing regions occurs when the efficiency of generating or injecting holes is high or in the case that the gate length is made short. Also, the erasing method may be used as a collective erasing method of two-bit data in the case two-bit data is stored.

Figure 39:
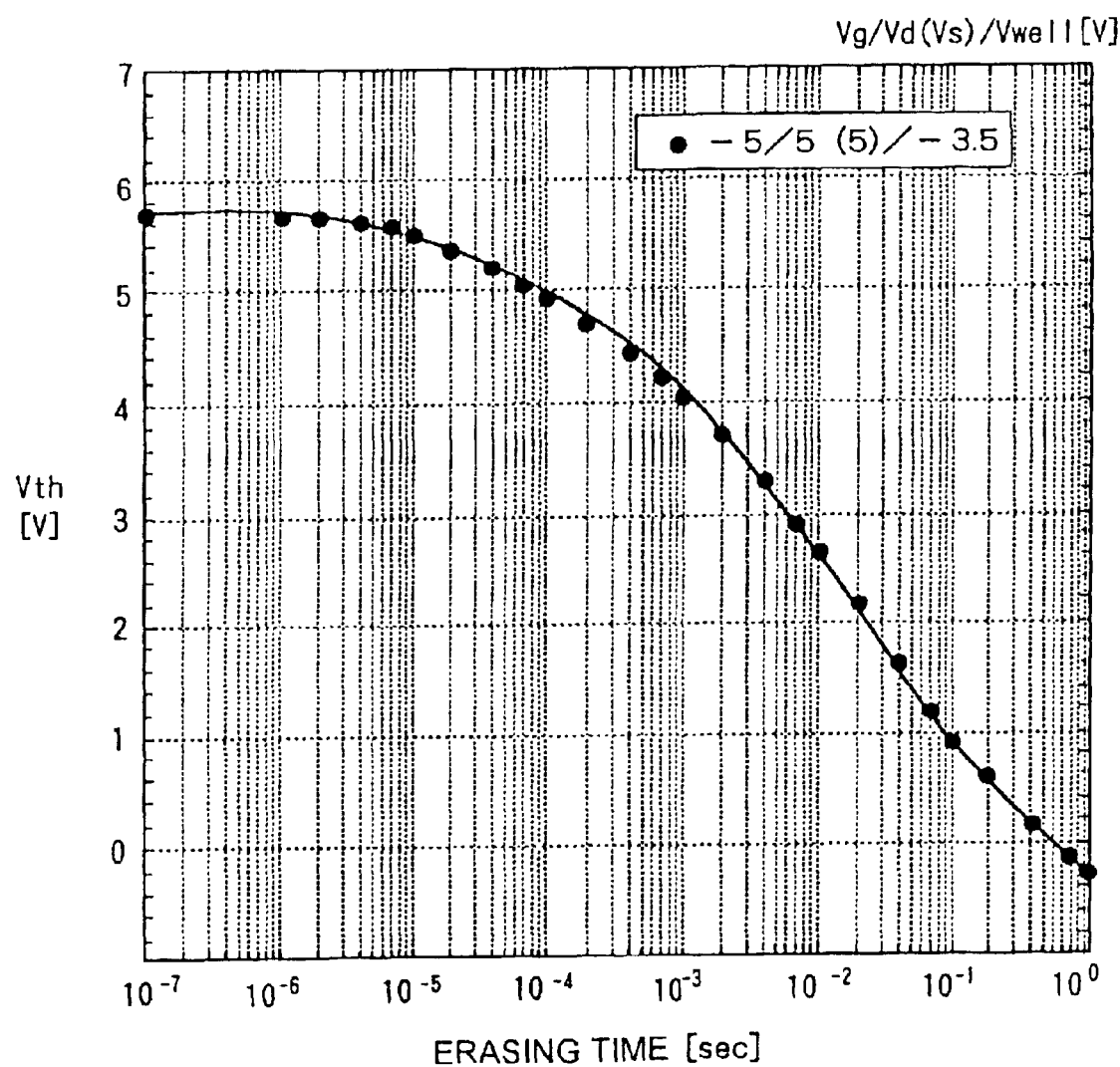
FIG. 39 is a graph of erasing characteristics.

FIG. 39 shows erasing characteristics.

In FIG. 39, the ordinate indicates a threshold voltage [V] and the abscissa indicates an erasing time [sec]. The gate voltage Vg is −5V and the drain voltage Vd and the source voltage Vs are 5V made to be constant. When comparing this graph with a curve of the well voltage Vwell=−3.5V in FIG. 12, in the erasing method of injecting hot holes from both the sources and drains, it is found that the erasing speed is improved. In the graph in FIG. 12, an erasing time for obtaining a threshold voltage change of 3V is about 100 msec, while in the graph in FIG. 39, the erasing time for obtaining the threshold voltage change of 3V is about 10 msec. An improvement in shortening the erasing time by one digit is observed.

As explained above, in the present embodiment, due to erasing from both the sources and drains, advantages are obtained that the erasing speed is improved and the threshold voltage in the erasing state is hard to change even by repeated rewriting.

In the above first to seventh embodiments, a variety of modification below are possible.

MODIFIED EXAMPLES

In the above first to seventh embodiments, a variety of modifications can be also made on the memory transistor configuration. Below, these modified examples will be explained.

The memory transistor is not always has to be formed on a semiconductor substrate. The "semiconductor substrate wherein the channel forming region is regulated to the surface region" includes wells as in the first embodiment other than the substrate bulk. In the case of the SOI type substrate configuration, an insulation film is formed on the substrate and a SOI semiconductor layer is formed on the insulation film. In this case, the SOI semiconductor layer may be used as the "semiconductor substrate wherein the channel forming region is regulated to the surface region" of the present invention.

Figure 40:
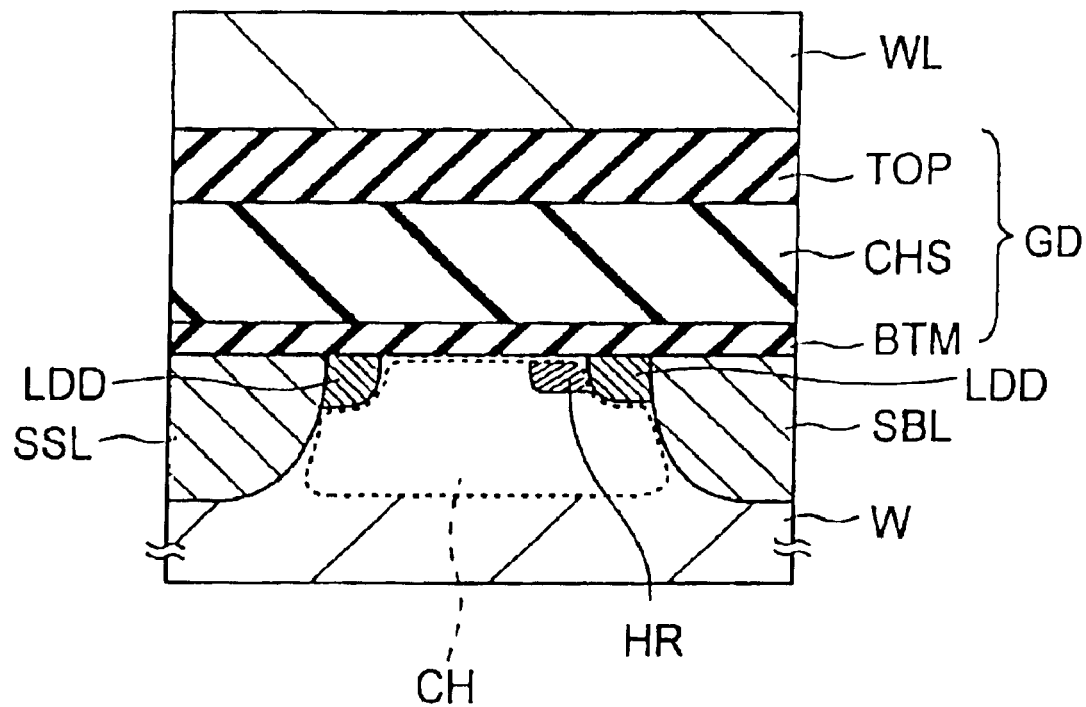
FIG. 40 is a cross-sectional view showing a first modified example of the memory transistor configuration in the first to seventh embodiments.

FIG. 40 is a cross-sectional view of a first modified example of the memory transistor configuration. This figure is a cross-sectional view in the same direction as in FIG. 5.

In the memory transistor shown in FIG. 40, on inner ends of the sub bit line SBL and the sub source line SSL made of an N type impurity region (or only on the sub bit line SBL side), an N type low concentration impurity regions LDD are provided. The high concentration channel region HR is for example formed in contact with an end of the channel center side of the low concentration impurity region LDD on the sub bit line SBL side.

The low concentration impurity region LDD is formed in a process of forming the sub bit line SBL and the sub source line SSL in a parallel line shape in a well in the memory cell array shown in FIG. 3. Namely, a mask layer of a parallel line shape is formed on the well, an N type impurity is ion implanted at low concentration on the well surface around the mask layer, then, the low concentration impurity region LDD is formed. Next, a spacer layer in a side wall shape is formed on two side surfaces of the mask layer in the width direction, and the N type impurity is ion implanted at high concentration on the well surface around the spacer layer to form the sub bit line SBL and the sub source line SSL.

The high concentration channel region HR is formed by introducing a P type impurity to a lower portion of one end portion of the mask layer by the oblique ion implantation method immediately after forming the mask layer or after the ion implantation at the time of forming the low concentrate impurity region LDD.

The provision of the high concentration channel region HR is not essential in the present embodiment. Note that when the high concentration channel region HR is formed, the efficiency of injecting electrons is high comparing with the element configuration without it.

It is furthermore preferable when both the high concentration channel region HR and the low concentration impurity region LDD are formed. In this case, for carriers (electrons) running in the channel, since the low concentration impurity region LDD serves as a low resistance region, the relative resistance ratio of the adjoining high concentration channel region HR becomes high, so a larger voltage fall is liable to occur in the high concentration channel region HR. Thus, steepness of the electric field in the channel direction further improves in the high concentration channel region HR, and the electron injection efficiency becomes higher thereby. Accordingly, writing at further higher speed becomes possible.

A dispersed conductor may be used for the charge storing means of the memory transistor. Here, a memory transistor using a large number of mutually insulated conductors buried in the gate dielectric film and having a particle diameter of for example 10 nm or less (hereinafter, referred to as small particle conductor) will be explained as the charge storing means.

Figure 41:
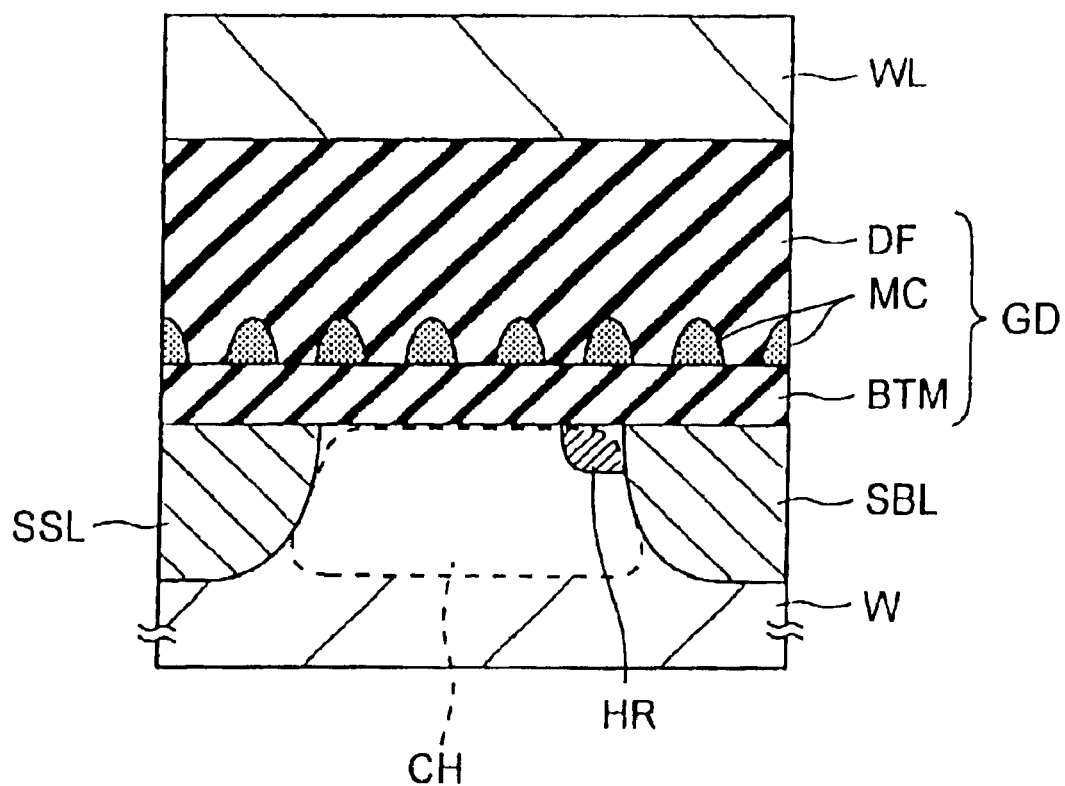
FIG. 41 is a cross-sectional view showing a second modified example of the memory transistor configuration in the first to seventh embodiments.

FIG. 41 is a sectional view of the configuration of the memory transistor using the small particle conductor as the charge storing means.

In the memory transistor shown in FIG. 41, a gate dielectric film GD comprises a first dielectric film BTM, dispersed small particle conductors MC as the charge storing means formed thereon, and a second dielectric film DF covering the small particle conductors MC.

Configuration other than that, that is the P-well W, channel forming region CH, (high concentration channel region HR), second source/drain region (sub bit line) SBL, first source/drain region (sub source line) SSL and gate electrode (word line WL), are the same as those in FIG. 5.

The small particle conductors MC are composed of conductors, such as fine amorphous $Si_xGe_{1-x}$ ($0 \leq x \leq 1$) or polycrystalline $Si_xGe_{1-x}$ ($0 \leq x \leq 1$). A size (diameter) of the small particle conductors MC is preferably 10 nm or less, for example 4.0 nm or so. Respective small particle conductors are spatially separated at intervals of for example 4 nm or so by the second dielectric film DF.

The first dielectric film BTM in the present embodiment may be suitably selected in a range of 2.6 nm to 5.0 nm in accordance with the object of use. Here, the film thickness is 4.0 nm or so.

A method of producing the memory transistor shown in FIG. 41 will be explained.

After forming the P-well W, sub bit line SBL and sub source line SSL (and high concentration channel region HR), the first dielectric film BTM is formed by the same method as described in the first embodiment.

An aggregate of the small particle conductors MC of $Si_xGe_{1-x}$ generated in the initial process of forming a $Si_xGe_{1-x}$ film using the LP-CVD method is formed on the first dielectric film BTM. The small particle conductors MC of $Si_xGe_{1-x}$ are formed by using silane ($SiH_4$) or dichlorosilane (DCS), germane ($GeH_4$) and hydrogen as material gases at the film forming temperature of 500° C. to 900° C. or so. Density and size of the small particle conductors can be controlled by adjusting the partial pressure or the flow ratio of silane or dichlorosilane and hydrogen. The larger the hydrogen partial pressure is, the higher density of a core to be the small particle conductors MC becomes. Alternately, by forming $SiO_x$ having a nonstoichiometric composition by using silane or dichlorosilane and dinitrogen oxide ($N_2O$) as the material gases at the film forming temperature of 500° C. to 800° C. or so and performing annealing at a high temperature of 900° C. to 1100° C., $SiO_2$ and the small particle conductors are separated and an aggregation of the small particle conductors buried in the $Sio_2$ is formed.

The second dielectric film DF is formed to for example 7 nm or so by the LP-CVD so as to be buried with the small particle conductors. In the LP-CVD, the material gas is a mixed gas of dichlorosilane (DCS) and dinitrogen oxide ($N_2O$) and the substrate temperature is for example 700° C. At this time, the small particle conductors are buried in the dielectric film DF.

After that, a conductive film to be word lines WL is formed, and through a process of patterning it at a time, the memory transistor is completed.

The thus produced small particle conductors MC serve as carrier traps dispersed in the plane direction. The respective small particle conductors can hold several injected electrons. Note that the small particle conductors MC may be made further smaller to hold one electron.

The configuration of the gate dielectric film GD of the memory transistor is not limited to the three-layer dielectric film and the above small particle conductor type used in the MONOS type mainly explained in the embodiments. Requirements set on the gate dielectric film is that charge traps and other charge storing means are dispersed, and a variety of other configurations fulfilling the requirements may be adaptable.

For example, as in a so-called NMOS type, etc., it may be two-layer structure comprising the first dielectric film BTM made of silicon dioxide, etc. and a film CHS having charge storage faculty made of silicon nitride, etc. formed thereon.

Also, the dielectric film made of metal oxides, etc., such as aluminum oxide $Al_2O_3$, tantalum oxide $Ta_2O_5$ and zirconium oxide $ZrO_2$, etc. is well known for including a large number of traps and applicable as the main charge storage film CHS having charge storage faculty in the similar film configuration to that of the MONOS type or NMOS type.

Furthermore, as materials of the main charge storage film CHS, to list other metal oxides, for example, films made of oxides of titanium, hufnium and lanthanum, or films made of silicates of tantalum, titanium, zirconium, hufnium, lanthanum may be also applied.

When aluminum oxide ($Al_2O_3$) is selected as a material of the main charge storage film CHS, for example, the CVD method using for example aluminum chloride ($AlCl_3$), carbon dioxide ($CO_2$) and hydrogen ($H_2$) as gas materials or the thermal decomposition of aluminum alkoxide ($Al(C_2H_5O)_3$, $Al(C_3H_7O)_3$, $Al(C_4H_9O)_3$ etc.) are used.

When tantalum oxide ($Ta_2O_5$) is selected as a material of the main charge storage film CHS, for example, the CVD method using for example tantalum chloride ($TaCl_5$), carbon dioxide ($CO_2$) and hydrogen ($H_2$) as gas materials or the thermal decomposition of $TaCl_2(OC_2H_5)_2C_5H_7O_2$ or $Ta(OC_2H_5)_5$ are used.

When zirconium dioxide ($ZrO_x$) is selected as a material of the main charge storage film CHS, for example, a method of spattering Zr in an oxygen atmosphere is used.

In the same way, the first dielectric film BTM and the second dielectric film TOP are not limited to silicon dioxide, silicon nitride and silicon oxynitride and may be selected from materials of, for example, aluminum oxide $Al_2O_3$, tantalum oxide $Ta_2O_5$ and zirconium oxide $ZrO_2$. Note that the formation method of these metal oxides is as explained above.

Furthermore, the first dielectric film BTM and the second dielectric film TOP may be applied as other metal oxide film, films made of oxides of titanium, hufnium and lanthanum, or films made of silicates of tantalum, titanium, zirconium, hufnium, lanthanum.

According to the nonvolatile semiconductor memory apparatus according to the present invention, an efficiency of generating hot electrons improves and a voltage required for obtaining a desired charge injection efficiency can be made low.

According to a production method of the nonvolatile semiconductor memory apparatus according to the present invention, there are many processes in common between memory peripheral circuits and logical circuits and the costs can be reduced. Accordingly, a logical circuit embedded type nonvolatile memory apparatus can be provided at low cost.

INDUSTRIAL APPLICABILITY

A nonvolatile semiconductor memory apparatus of the present invention can be used as a memory of a variety of electronic devices.

What is claimed is:

1. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

a first source/drain region (S, SSL) formed on one side of said channel forming region (CH) in the surface region of said semiconductor substrate (SUB, W) and electrically connected to said memory peripheral circuits (2a to 9);

a second source/drain region (D, SBL) formed on the other side of said channel forming region (CH) in the surface region of said semiconductor substrate (SUB, W) and electrically connected to said memory peripheral circuits (2a to 9);

a charge storage film (GD) formed at least on said channel forming region (CH) and having a charge storage faculty; and a gate electrode (WL) formed on said charge storage film (GD) and electrically connected to said memory peripheral circuit (2a to 9);

and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data, wherein:

said channel forming region (CH) comprises a first conductive type high concentration channel region (HR) with higher concentration than that in other regions of said channel forming region (CH) at least at an end portion on said second source/drain region (D, SEL) side.

2. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

a first source/drain region (S, SSL) formed on one side of said channel forming region (CH) in the surface region of said semiconductor substrate (SUB, W) and electrically connected to said memory peripheral circuits (2a to 9):

a second source/drain region (D, SBL) formed on the other side of said channel forming region (CH) in the surface region of said semiconductor substrate (SUB, W) and electrically connected to said memory peripheral circuits (2a to 9):

a charge storage film (GD) formed at least on said channel forming region (CH) and having a charge storage faculty; and a gate electrode (WL) formed on said charge storage film (GD) and electrically connected to said memory peripheral circuit (2a to 9);

and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data, wherein:

said semiconductor substrate (SUB, W) is electrically connected to said memory peripheral circuits (2a to 9); and said memory peripheral circuits (2a to 9) generate a voltage (Vwell) for reverse-biasing a PN junction formed between said semiconductor substrate (SUB, W) and said second source/drain region (D, SBL) and apply said generated voltage (Vwell) to said semiconductor substrate (SUB, W) when injecting said hot electrons (HE) at the time of writing data.

3. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

first source/drain region (S, SSL) formed on one side of said channel forming region (CH) in the surface region of said semiconductor substrate (SUB, W) and electrically connected to said memory peripheral circuits (2a to 9);

a second source/drain region (D, SBL) formed on the other side of said channel forming region (CH) in the surface region of said semiconductor substrate (SUB, W) and electrically connected to said memory peripheral circuits (2a to 9);

a charge storage film (GD) formed at least on said channel forming region (CH) and having a charge storage faculty; and a gate electrode (WL) formed on said charge storage film (GD) and electrically connected to said memory peripheral circuit (2a to 9);

and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data, wherein:

said semiconductor substrate (SUB, W) is electrically connected to said memory peripheral circuits (2a to 9); and said memory peripheral circuits (2a to 9) generate a first polarity voltage (Vg) and a second polarity voltage (Vwell), a potential difference thereof is equal to said second voltage (Vg-Vwell), apply said generated first polarity voltage (Vg) to said gate electrode (WL) and apply said generated second polarity voltage (Vwell) to said semiconductor substrate (SUB, W).

4. A nonvolatile semiconductor memory apparatus as set forth in claim 3, comprising:

a memory block; and a logical circuit block;

wherein:

said memory block comprises:

a memory cell array (1) formed by arranging a plurality of memory cells including said memory transistor (M); and said memory peripheral circuits (2a to 9);

a film thickness of a thickest gate insulation film of a transistor in said memory peripheral circuits (2a to 9) is set to be the same as a film thickness of a gate insulation film of an input/output transistor in said logical circuit block; and an absolute value of said first polarity voltage (Vg) and an absolute value of said second polarity voltage (Vwell) to be generated by said memory peripheral circuits (2a to 9) at the time of writing data are set to be not more than an absolute value of withstand voltage of said input/output transistor and/or a burn-in voltage, respectively.

5. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

a first source/drain region (S, SSL) formed on one side of said channel forming region (CH) in the surface region of said semiconductor substrate (SUB, W) and electrically connected to said memory peripheral circuits (2a to 9);

a second source/drain region (D, SBL) formed on the other side of said channel forming region (CH) in the surface region of said semiconductor substrate (SUB, W) and electrically connected to said memory peripheral circuits (2a to 9);

a charge storage film (GD) formed at least on said channel forming region (CH) and having a charge storage faculty; and a gate electrode (WL) formed on said charge storage film (GD) and electrically connected to said memory peripheral circuit (2a to 9);

and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data, wherein:

said memory peripheral circuits (2a to 9) apply said generated first voltage (Vd) to said second source/drain region (D, SBL) by using potential of said second source/drain region (D, SBL) as reference, apply said generated second voltage (Vg-Vwell) to said gate electrode (WL), generates hot electrons (HE) by ionization collision on said first source/drain region (S, SSL) side, and inject said generated hot electrons (HE) to said charge storage film (GD) from said first source/drain region (S, SSL) side at the time of writing different bit data from said data to the same said memory transistor (M).

6. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

a first source/drain region (S, SSL) formed on one side of said channel forming region (CH) in the surface region of said semiconductor substrate (SUB, W) and electrically connected to said memory peripheral circuits (2a to 9);

a second source/drain region (D, SBL) formed on the other side of said channel forming region (CH) in the surface region of said semiconductor substrate (SUB, W) and electrically connected to said memory peripheral circuits (2a to 9);

a charge storage film (GD) formed at least on said channel forming region (CH) and having a charge storage faculty; and a gate electrode (WL) formed on said charge storage film (GD) and electrically connected to said memory peripheral circuit (2a to 9);

and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data, wherein:

said memory peripheral circuits (2a to 9) generate a third voltage (Vd-Vg), apply said generated third voltage (Vd-Vg) to between said second source/drain region (D, SBL) and said gate electrode (WL), generate hot holes (HH) on said second source/drain region (D, SBL) side, and inject said generated hot holes (HH) to an injection region of said hot electrons (HE) of said charge storage film (GD) at the time of erasing data.

7. A nonvolatile semiconductor memory apparatus as set forth in claim 6, wherein said memory peripheral circuits (2a to 9) generate a first polarity voltage (Vg) and a second polarity voltage (Vwell), a potential difference thereof is equal to said third voltage (Vd-Vg), apply said generated first polarity voltage (Vd) to said second source/drain region (D, SBL), and apply said generated second polarity voltage (Vg) to said gate electrode (WL) at the time of injecting said hot holes (HH).

8. A nonvolatile semiconductor memory apparatus as set forth in claim 7, wherein in said first polarity voltage (Vd), a potential difference with potential of said channel forming region (CH) has a lower value than junction breakdown voltage of said second source/drain region (D, SBL).

9. A nonvolatile semiconductor memory apparatus as set forth in claim 7, comprising:

a memory block; and a logical circuit block;

wherein:

said memory block comprises:

a memory cell array (1) formed by arranging a plurality of memory cells including said memory transistor (M); and said memory peripheral circuits (2a to 9);

a film thickness of a thickest gate insulation film of a transistor in said memory peripheral circuits (2a to 9) is set to be the same as a film thickness of a gate insulation film of an input/output transistor in said logical circuit block; and an absolute value of said first polarity voltage (Vd) and an absolute value of said second polarity voltage (Vg) to be generated by said memory peripheral circuits (2a to 9) at the time of erasing data are set to be not more than an absolute value of withstand voltage of said input/output transistor and/or a burn-in voltage, respectively.

10. A nonvolatile semiconductor memory apparatus as set forth in claim 6, wherein:

said memory peripheral circuits (2a to 9) simultaneously apply said generated third voltage (Vd-Vg) to between said first source/drain region (S, SSL) and said gate electrode (WL) and between said second source/drain region (D, SBL) and said gate electrode (WL), generate hot holes (HH) on said first source/drain region (S, SSL) side and on the said second source/drain region (D, SBL) side, and inject said generated hot holes (HH) to an injection region of said hot electrons (HE) of said charge storage film (GD) from the both sides at the time of erasing data.

11. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

a first source/drain region (S, SSL) formed on one side of said channel forming region (CH) in the surface region of said semiconductor substrate (SUB, W) and electrically connected to said memory peripheral circuits (2a to 9);

a second source/drain region (D, SBL) formed on the other side of said channel forming region (CH) in the surface region of said semiconductor substrate (SUB, W) and electrically connected to said memory peripheral circuits (2a to 9);

a charge storage film (GD) formed at least on said channel forming region (CH) and having a charge storage faculty; and a gate electrode (WL) formed on said charge storage film (GD) and electrically connected to said memory peripheral circuit (2a to 9);

and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) by ionization collision on said second source/drain region (D, SBL) side, and inject said generated hot electrons (HE) to said charge storage film (GD) from said second source/drain region (D, SBL) side at the time of writing data, wherein:

said memory peripheral circuits (2a to 9) generate a fourth and fifth voltages, apply said generated fourth voltage to said second source/drain region (D, SBL) by using potential of said first source/drain region (S, SSL) as a reference, apply said generated fifth voltage to said gate electrode (WL), and read a potential change appears at said, first source/drain region (S, SSL) or said second source/drain region (D, SBL) in accordance with an existence or charge amount of said hot electrons (HE) injected to said charge storage film (GD) at the time of reading data.

12. A nonvolatile semiconductor memory apparatus as set forth in claim 11, comprising a charge storing means dispersed in said charge storage film (GD); and wherein said memory peripheral circuits (2a to 9) control respective voltage values of said first voltage (Vd) and said second voltage (Vg-Vwell) and regulate a range of a charge injection region to be injected with said hot electrons (HE) in said charge storage film (GD) at the time of writing data; and when a channel is formed on said channel forming region (CH) in accordance with an existence or a charge amount of said hot electrons (HE) injected to said charge injection region, control respective voltage values of said fourth voltage and said fifth voltage so that a pinch-off point of the channel exists in the middle of the channel direction positioned at a lower portion of said charge injection region in said channel forming region (CH), and read a potential change appearing at said first source/drain region (S, SSL) or said second source/drain region (D, SBL) in accordance with an existence or a charge amount of said hot electrons (HE) at the time of reading data.

13. A nonvolatile semiconductor memory apparatus, comprising:

a memory transistor (M); and memory peripheral circuits (2a to 9) for controlling an operation of said memory transistor (M);

wherein said memory transistor (M) comprises:

a first conductive type semiconductor substrate (SUB, W);

a first conductive type channel forming region (CH) regulated in a surface region of said semiconductor substrate (SUB, W);

a first source/drain region (S, SSL) formed on one side of said channel forming region (CH) in the surface region of said semiconductor substrate (SUB, W) and electrically connected to said memory peripheral circuits (2a to 9);

a second source/drain region (D, SBL) formed on the other side of said channel forming region (CH) in the surface region of said semiconductor substrate (SUB, W) and electrically connected to said memory peripheral circuits (2a to 9);

a charge storage film (GD) formed at least on said channel forming region (CH) and having a charge storage faculty; and a gate electrode (WL) formed on said charge storage film (GD) and electrically connected to said memory peripheral circuits (2a to 9);

said channel forming region (CH) comprises a first conductive type high concentration channel region (HR) with higher concentration than that in other regions of said channel forming region (CH) at least at an end portion on said second source/drain region (D, SEL) side; and said memory peripheral circuits (2a to 9) generate a first voltage (Vd) and a second voltage (Vg-Vwell), apply said generated first voltage (Vd) to said second source/drain region (D, SBL) by using potential of said first source/drain region (S, SSL) as a reference, apply said generated second voltage (Vg-Vwell) to said gate electrode (WL), generate hot electrons (HE) on said second source/drain region (D, SBL) side by intensifying an electric field in the channel direction to said high concentration channel region (HR), and inject said generated hot electrons (HE) to said charge storage film (GD) from said second source/drain region (D, SBL) side at the time of writing data.

14. A nonvolatile semiconductor memory apparatus as set forth in claim 13, wherein:
said semiconductor substrate (SUB, W) is electrically connected to said memory peripheral circuits (2a to 9); and
said memory peripheral circuits (2a to 9) generate a voltage (Vwell) for reverse-biasing a PN junction formed between said semiconductor substrate (SUB, W) and said second source/drain region (D, SBL) and apply said generated voltage (Vwell) to said semiconductor substrate (SUB, W) when injecting said hot electrons (HE) at the time of writing data.

15. A nonvolatile semiconductor memory apparatus as set forth in claim 13, wherein:
said semiconductor substrate (SUB, W) is electrically connected to said memory peripheral circuits (2a to 9); and
said memory peripheral circuits (2a to 9) generate a first polarity voltage (Vg) and a second polarity voltage (Vwell), a potential difference thereof is equal to said second voltage (Vg-Vwell), apply said generated first polarity voltage (Vg) to said gate electrode (WL) and apply said generated second polarity voltage (Vwell) to said semiconductor substrate (SUB, W) at the time of writing data.

16. A nonvolatile semiconductor memory apparatus as set forth in claim 14, comprising:
a memory block; and
a logical circuit block;
wherein said memory block comprises:
a memory cell array (1) formed by arranging a plurality of memory cells including said memory transistor (M); and
said memory peripheral circuits (2a to 9);
a film thickness of a thickest gate insulation film of a transistor in said memory peripheral circuits (2a to 9) is set to be the same as a film thickness of a gate insulation film of an input/output transistor in said logical circuit block; and
an absolute value of said first polarity voltage (Vg) and an absolute value of said second polarity voltage (Vwell) to be generated by said memory peripheral circuits (2a to 9) at the time of writing data are set to be not more than an absolute value of withstand voltage of said input/output transistor and/or a burn-in voltage, respectively.

17. A nonvolatile semiconductor memory apparatus as set forth in claim 13, wherein:
said memory peripheral circuits (2a to 9) generate a third voltage (Vd-Vg), apply said generated third voltage (Vd-Vg) to between said second source/drain region (D, SBL) and said gate electrode (WL), generate hot holes (HH) on said second source/drain region (D, SBL) side and inject said generated hot holes (HH) to an injection region for said hot electrons (HE) of said charge storage film (GD) at the time of erasing data.

18. A nonvolatile semiconductor memory apparatus as set forth in claim 17, wherein:
said memory peripheral circuits (2a to 9) generate a first polarity voltage (Vd) and a second polarity voltage (Vg), a potential difference thereof is equal to said third voltage (Vd-Vg), apply said generated first polarity voltage (Vd) to said second source/drain region (D, SBL) and apply said generated second polarity voltage (Vg) to said gate electrode (WL) when injecting said hot holes (HH) at the time of erasing data.

19. A nonvolatile semiconductor memory apparatus as set forth in claim 18 wherein:
in said first polarity voltage (Vd), a potential difference with potential of said channel forming region (CH) has a lower value than junction breakdown voltage of said second source/drain region (D, SBL).

20. A nonvolatile semiconductor memory apparatus as set forth in claim 18, comprising:
a memory block; and
a logical circuit block;
wherein:
said memory block comprises:
a memory cell array (1) formed by arranging a plurality of memory cells including said memory transistor (M); and
said memory peripheral circuits (2a to 9);
a film thickness of a thickest gate insulation film of a transistor in said memory peripheral circuits (2a to 9) is set to be the same as a film thickness of a gate insulation film of an input/output transistor in said logical circuit block; and
an absolute value of said first polarity voltage (Vd) and an absolute value of said second polarity voltage (Vg) to be generated by said memory peripheral circuits (2a to 9) at the time of erasing data are set to be not more than an absolute value of withstand voltage of said input/output transistor and/or a burn-in voltage, respectively.

21. A nonvolatile semiconductor memory apparatus as set forth in claim 13, wherein:
at least one of said first and second source/drain regions (D, SBL) is in contact with said high concentration channel region (HR) and comprises a second conductive type low concentration impurity region (LDD) with lower concentration than that in other regions of the source/drain region.

22. A nonvolatile semiconductor memory apparatus, comprising:
a memory transistor (M); and
memory peripheral circuits (2a to 9) for controlling an operation of said memory transistor (M);
wherein said memory transistor (M) comprises:
a first conductive type semiconductor substrate (SUB, W);
a first conductive type channel forming region (CH) regulated in a surface region of said semiconductor substrate (SUB, W);
a first source/drain region (S, SSL) formed on one side of said channel forming region (CH) in the surface region of said semiconductor substrate (SUB, W) and electrically connected to said memory peripheral circuits (2a to 9);
a second source/drain region (D, SBL) formed on the other side of said channel forming region (CH) in the surface region of said semiconductor substrate (SUB, W) and electrically connected to said memory peripheral circuits (2a to 9);
a charge storage film (GD) formed at least on said channel forming region (CH) and having a charge storage faculty; and
a gate electrode (WL) formed on said charge storage film (GD) and electrically connected to said memory peripheral circuits (2a to 9); and said memory peripheral circuits (2a to 9) generate a first voltage (Vd), apply said generated first voltage (Vd) to said second source/drain region (D,SBL) by using potential of said first source/drain region (S, SSL) as a reference, generate a first polarity voltage (Vg) and a second polarity voltage (Vwell), a potential difference thereof is equal to a second voltage (Vg-Vwell), apply said generated first polarity voltage (Vg) to said gate electrode (WL), apply said generated second polarity voltage (Vwell) to said semiconductor substrate (SUB, W) and inject hot electrons (HE) to said charge storage film (GD).

23. A nonvolatile semiconductor memory apparatus as set forth in claim 22, comprising:
a memory block; and
a logical circuit block;
wherein:
said memory block comprises:
a memory cell array (1) formed by arranging a plurality of memory cells including said memory transistor (M); and
said memory peripheral circuits (2a to 9);
a film thickness of a thickest gate insulation film of a transistor in said memory peripheral circuits (2a to 9) is set to be the same as a film thickness of a gate insulation film of an input/output transistor in said logical circuit block; and
an absolute value of said first polarity voltage (Vd) and an absolute value of said second polarity voltage (Vg) to be generated by said memory peripheral circuits (2a to 9) at the time of erasing data are set to be not more than an absolute value of withstand voltage of said input/output transistor and/or a burn-in voltage, respectively.

24. A nonvolatile semiconductor memory apparatus as set forth in claim 22, wherein:
said memory peripheral circuits (2a to 9) generate a third voltage (Vd-Vg), apply said generated third voltage (Vd-Vg) to between said second source/drain region (D, SBL) and said gate electrode (WL), generate hot holes (HH) on said second source/drain region (D, SBL) side and inject said generated hot holes (HH) to an injection region of said hot electrons (HE) of said charge storage film (GD) at the time of erasing data.

25. A nonvolatile semiconductor memory apparatus as set forth in claim 24 wherein:
said memory peripheral circuits (2a to 9) generate a first polarity voltage (Vd) and a second polarity voltage (Vg), a potential difference thereof is equal to said third voltage (Vd-Vg), apply said generated first polarity voltage (Vd) to said second source/drain region (D, SBL) and apply said generated second polarity voltage (Vg) to said gate electrode (WL) at the time of injecting said hot holes (HH).

26. A nonvolatile semiconductor memory apparatus as set forth in claim 25, wherein:
in said first polarity voltage (Vd), a potential difference with potential of said channel forming region (CH) has a lower value than junction breakdown voltage of said second source/drain region (D, SBL).

27. A nonvolatile semiconductor memory apparatus as set forth in claim 25, comprising:
a memory block; and
a logical circuit block;
wherein:
said memory block comprises:

a memory cell array (1) formed by arranging a plurality of memory cells including said memory transistor (M); and
said memory peripheral circuits (2a to 9);
a film thickness of a thickest gate insulation film of a transistor in said memory peripheral circuits (2a to 9) is set to be the same as a film thickness of a gate insulation film of an input/output transistor in said logical circuit block; and
an absolute value of said first polarity voltage (Vd) and an absolute value of said second polarity voltage (Vg) to be generated by said memory peripheral circuits (2a to 9) at the time of erasing data are set to be not more than an absolute value of withstand voltage of said input/output transistor and/or a burn-in voltage, respectively.

28. A nonvolatile semiconductor memory apparatus, comprising:
a memory transistor (M); and
memory peripheral circuits (2a to 9) for controlling an operation of said memory transistor (M);
wherein said memory transistor (M) comprises:
a first conductive type semiconductor substrate (SUB, W);
a first conductive type channel forming region (CH) regulated in a surface region of said semiconductor substrate (SUB, W);
a first source/drain region (S, SSL) formed on one side of said channel forming region (CH) in the surface region of said semiconductor substrate (SUB, W) and electrically connected to said memory peripheral circuits (2a to 9);
a second source/drain region (D, SBL) formed on the other side of said channel forming region (CH) in the surface region of said semiconductor substrate (SUB, W) and electrically connected to said memory peripheral circuits (2a to 9);
a charge storage film (GD) formed at least on said channel forming region (CH) and having a charge storage faculty; and
a gate electrode (WL) formed on said charge storage film (GD) and electrically connected to said memory peripheral circuits (2a to 9); and
said memory circuit (2a to 9) generate a first polarity voltage (Vd) and a second polarity voltage (Vg), a potential difference thereof is equal to third voltage (Vd-Vg), apply said generated first polarity voltage (Vd) to said second source/drain region (D, SBL), apply said generated second polarity voltage (Vg) to said gate electrode (WL), generate hot holes (HH) on said second source/drain region (D, SBL) side and inject said hot holes (HH) to said charge storage film (GD) at the time of erasing data.

29. A nonvolatile semiconductor memory apparatus as set forth in claim 28, wherein:
said semiconductor substrate (SUB, W) is electrically connected to said memory peripheral circuits (2a to 9); and
said memory peripheral circuits (2a to 9) generate a voltage (Vwell) for reverse-biasing a PN junction formed between said semiconductor substrate (SUB, W) and said second source/drain region (D, SBL) and apply said generated voltage (Vwell) to said semiconductor substrate (SUB, W) when injecting said hot holes (HH) at the time of erasing data.

30. A nonvolatile semiconductor memory apparatus as set forth in claim 28, wherein:

said memory peripheral circuits (2a to 9) simultaneously apply said generated third voltage to between said first source/drain region (S, SSL) and said gate electrode (WL) and between said second source/drain region (D, SBL) and said gate electrode (WL), generate hot holes (HH) on said first source/drain region (S, SSL) side and on the said second source/drain region (D, SBL) side and inject said hot holes (HH) to an injection region for said hot electrons (HE) of said charge storage film (GD) from both sides at the time of erasing data.

31. A nonvolatile semiconductor memory apparatus, comprising:

a memory block; and a logical circuit block;

and wherein:

said memory block comprises memory peripheral circuits (2a to 9) for controlling an operation of a memory cell array (1) formed by arranging a plurality of memory cells including a memory transistor (M);

said logical circuit block comprises a logic transistor and an input/output transistor;

a transistor in said memory peripheral circuits (2a to 9), said logic transistor and said input/output transistor in said logical circuit block respectively comprise:

a gate insulation film (17) formed on a substrate (SUB, 12, 13);

a gate electrode (18, 19) formed on a gate insulation film (17);

a first conductive type channel forming region regulated on a surface region of said semiconductor substrate (SUB, 12, 13);

a first source/drain region (20, 21) formed on one side of said channel forming region of the surface region of said semiconductor substrate (SUB, 12, 13); and second source/drain regions (20, 21) formed on the other side of said channel forming region of the surface region of said semiconductor substrate (SUB, W);

and a film thickness of a thickest gate insulation film of a transistor in said memory peripheral circuits (2a to 9) is set to be the same as a film thickness of a gate insulation film of said input/output transistor in said logical circuit block.

32. A nonvolatile semiconductor memory apparatus as set forth in claim 31, wherein:

a film thickness of said gate insulation film, impurity concentration of said first and second source/drain regions (20, 21) and impurity concentration of said channel forming region in said transistor having the thickest gate insulation film in said memory peripheral circuits (2a to 9) are set to be the same with said film thickness of the gate insulation film, said impurity concentration of the first and second source/drain regions (20, 21) and said impurity concentration of the channel forming region in said input/output transistor in said logical circuit, respectively.

33. A method of operating a nonvolatile semiconductor memory apparatus, comprising a first conductive type semiconductor substrate (SUB, W), a first conductive type channel forming region (CH) regulated in a surface region of said semiconductor substrate (SUB, W), a first source/drain region (S, SSL) formed on one side of said channel forming region (CH) on a surface region of said semiconductor substrate (SUB, W), a second source/drain region (D, SBL) formed on the other side of said channel forming region (CH) in the surface region of said semiconductor substrate (SUB, W), a charge storage film (GD) having a charge storage faculty formed at least on said channel forming region (CH), and a gate electrode (WL) formed on said charge storage film (GD), including the steps of:

generating a first voltage (Vd) and second voltage (Vg-Vwell), applying said generated first voltage (Vd) to said second source/drain region (D, SBL) by using potential of said first source/drain region (S, SSL) as a reference, applying said generated second voltage (Vg-Vwell) to said gate electrode (WL), generating hot electrons (HE) by ionization collision on said second source/drain region (D, SBL) side, and injecting said generated hot electrons (HE) to said charge storage film (GD) from said second source/drain region (D, SBL) side at the time of writing data; and generating a third voltage (Vd-Vg), applying said generated third voltage (Vd-Vg) to between said second source/drain region (D, SBL) and said gate electrode (WL), generating hot holes (HH) on said second source/drain region (D, SBL) side, and injecting said generated hot holes (HH) to an injection region for said hot electrons (HE) of said charge storage film (GD) at the time of erasing data.

34. A method of producing a nonvolatile semiconductor memory apparatus, comprising a memory block and a logical circuit block, wherein said memory block comprises memory peripheral circuits (2a to 9) for controlling an operation of a memory cell array (1) formed by arranging a plurality of memory cells including said memory transistor (M), said logical circuit block comprises a logic transistor and an input/output transistor, and a transistor in said memory peripheral circuits (2a to 9), said logic transistor and said input/output transistor in said logical circuit block respectively comprise a gate insulation film (17) formed on a semiconductor substrate (SUB, 12, 13), a gate electrode (18, 19) formed on a gate insulation film (17), a first conductive type channel forming region regulated on a surface region of said semiconductor substrate (SUB, 12, 13), a first source/drain region (20, 21) formed on one side of said channel forming region, and a second source/drain region (20, 21) formed on the other side of said channel forming region, including the step of:

simultaneously forming said thickest gate insulation film of said transistor in said memory peripheral circuits (2a to 9) and a gate insulation film of said input/output transistor in said logical circuit block.

35. A method of producing a nonvolatile semiconductor memory apparatus, as set forth in claim 34, wherein:

said transistor having said thickest gate insulation film in said memory peripheral circuits (2a to 9) and said input/output transistor in said logical circuit block are simultaneously formed in a same process by using a same photomask.

36. A method of producing a nonvolatile semiconductor memory apparatus, as set forth in claim 34, wherein:

a film thickness of said gate insulation film of said input/output transistor is formed thicker than a film thickness of said gate insulation film of said logic transistor in said logical circuit block.

* * * * *

UNITED STATES PATENT AND TRADEMARK OFFICE
CERTIFICATE OF CORRECTION

PATENT NO. : 6,903,977 B2 Page 1 of 1
APPLICATION NO. : 10/432158
DATED : June 7, 2005
INVENTOR(S) : Ichiro Fujiwara et al.

It is certified that error appears in the above-identified patent and that said Letters Patent is hereby corrected as shown below:

In Column 49:
Line 30, "claim 14" should be read as --claim 15--.

Signed and Sealed this

Twenty-second Day of August, 2006

JON W. DUDAS
*Director of the United States Patent and Trademark Office*